(12) United States Patent
Nakamura et al.

(10) Patent No.: US 7,342,986 B2
(45) Date of Patent: Mar. 11, 2008

(54) DIGITAL PLL DEVICE

(75) Inventors: Shinobu Nakamura, Kanagawa (JP); Mamoru Kudo, Kanagawa (JP); Satoru Ooshima, Tokyo (JP); Jun Yamane, Tokyo (JP); Hirofumi Shimizu, Kanagawa (JP)

(73) Assignee: Sony Corporation (JP)

( * ) Notice: Subject to any disclaimer, the term of this patent is extended or adjusted under 35 U.S.C. 154(b) by 708 days.

(21) Appl. No.: 10/868,923

(22) Filed: Jun. 17, 2004

(65) Prior Publication Data

US 2004/0264623 A1 Dec. 30, 2004

(30) Foreign Application Priority Data

Jun. 24, 2003 (JP) ............................ P2003-179410

(51) Int. Cl.
*H03D 3/24* (2006.01)
(52) U.S. Cl. ................... 375/376; 329/307; 329/360; 332/127; 342/103; 375/215; 375/294; 375/327; 388/911; 455/67.16; 455/260; 455/276.1; 455/180.3
(58) Field of Classification Search ................ 310/328; 327/156; 369/47.35, 47.51, 47.53, 59.12, 369/59.19; 375/376
See application file for complete search history.

(56) References Cited

U.S. PATENT DOCUMENTS 5,005,164 A * 4/1991 Sakamoto et al. ....... 369/47.53

6,424,192 B1 * 7/2002 Lee et al. .................. 327/156
2003/0103591 A1 * 6/2003 Noguchi ..................... 375/376

FOREIGN PATENT DOCUMENTS

JP 09-247137 9/1997
JP 11-341306 12/1999

* cited by examiner

*Primary Examiner*—David C. Payne
*Assistant Examiner*—Adolf DSouza
(74) *Attorney, Agent, or Firm*—Rader Fishman & Grauer PLLC; Ronald P. Kananen PLLC

(57) ABSTRACT

A phase-locked-loop device includes a clock generator for generating a reference clock based on a binarized playback signal and a frequency of run-length data and for generating N-phase clocks using the reference clock, a pulse-length measuring device for measuring a pulse length of the binarized playback signal using the N-phase clocks to output pulse-length data, and a run-length-data extracting device for counting the pulse-length data based on a virtual channel clock to extract run-length data. Pulse-length data is generated using the N-phase clocks (e.g., 16-phase clocks). The pulse-length data is counted based on the virtual channel clock to extract run-length data. Thus, it is not needed to generate a high-frequency clock, and the operating frequency is maintained sufficiently low.

8 Claims, 85 Drawing Sheets

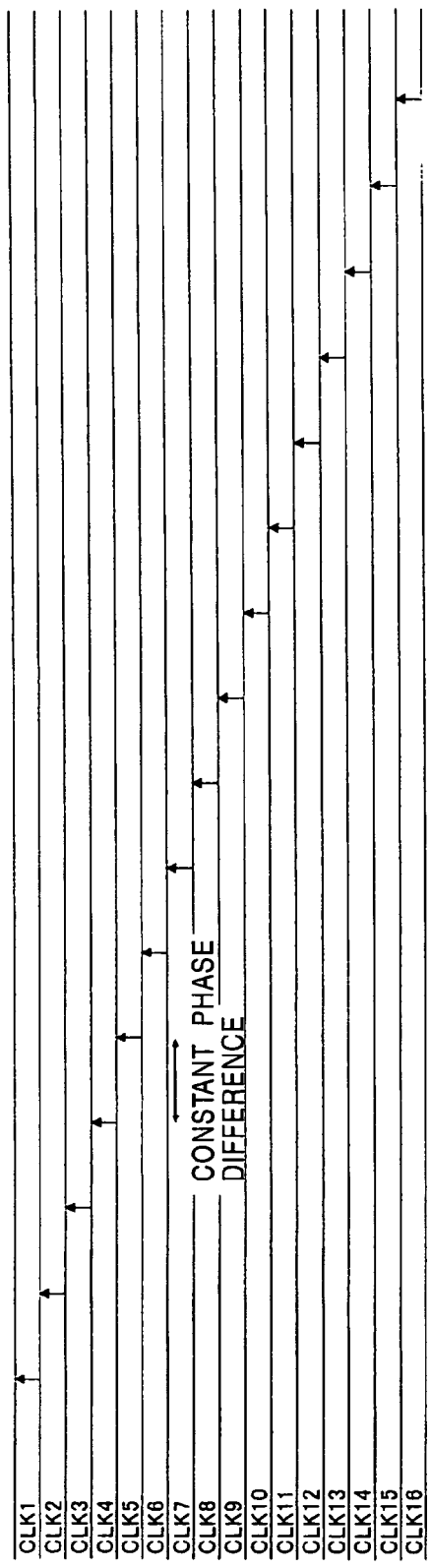
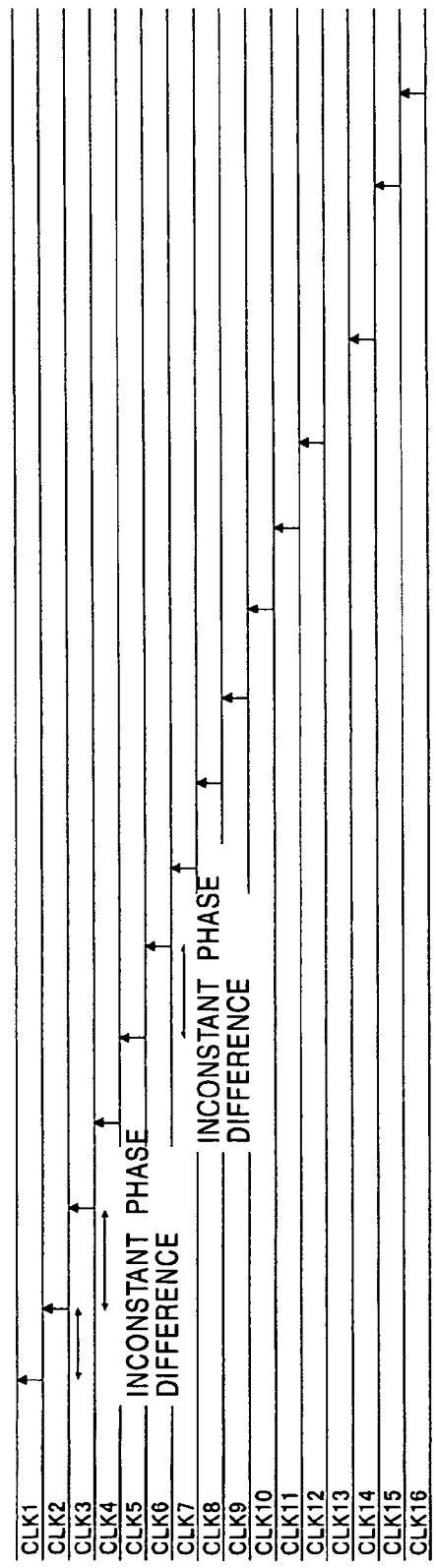

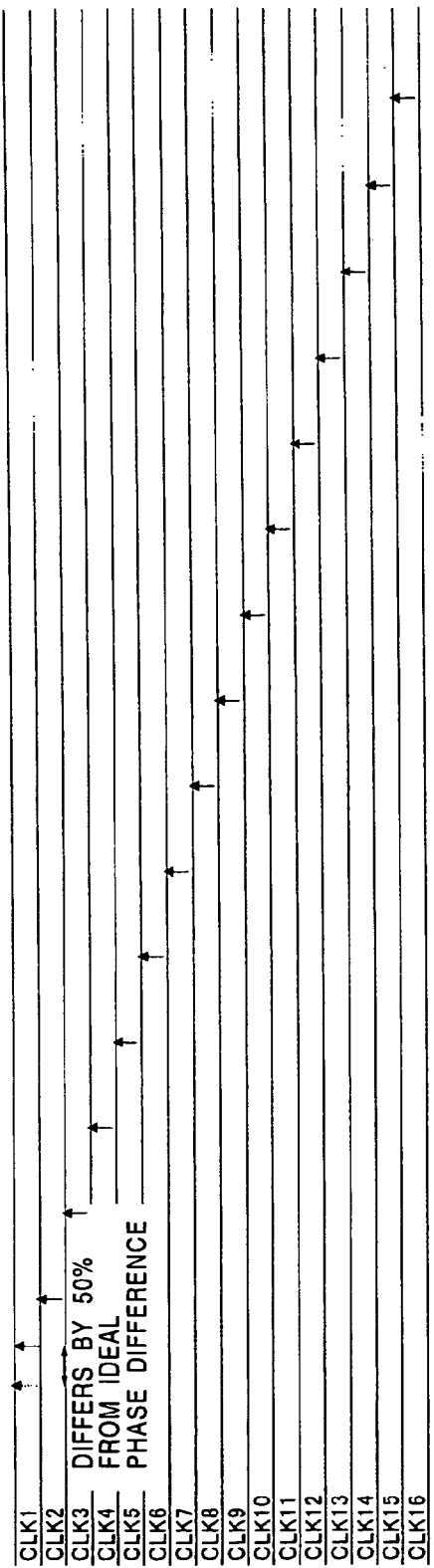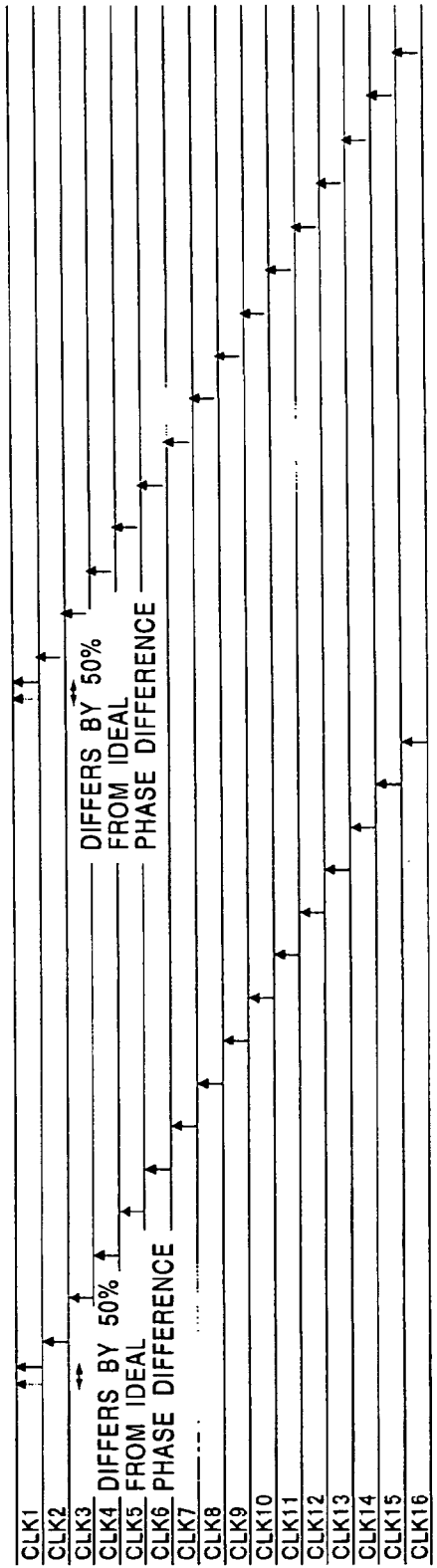

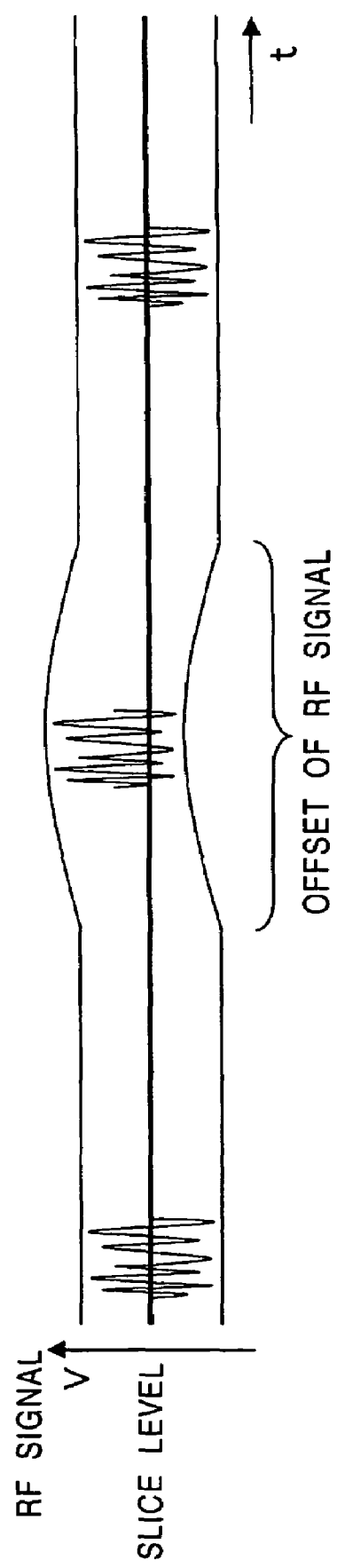

FIG. 35

| | CONDITIONS OF L1 AND L3 | CONDITIONS OF φ1 AND φ2 | CORRECTING PATTERN | RUN LENGTH AFTER CORRECTION |
|---|---|---|---|---|
| (1) | L1+L3≧8 | NONE | e | L1+L3 |
| (2) | L1=3, L3=6 | NONE | d | 3, 3, 3 |
| (3) | L1=4, L3=5 | NONE | c | 3, 3, 3 |
| (4) | L1=4, L3=6 | φ1=0, φ2≠0 | d | 4, 3, 3 |
| | | OTHER | c | 3, 3, 4 |
| (5) | L1=5, L3=4 | NONE | b | 3, 3, 3 |
| (6) | L1=5, L3=5 | φ1<φ2 | c | 4, 3, 3 |
| | | φ1≧φ2 | b | 3, 3, 4 |
| (7) | L1=5, L3=6 | φ1=0, φ2≠0 | d | 5, 3, 3 |
| | | φ1≠0, φ2≠0, φ1<φ2 | c | 4, 3, 4 |
| | | OTHER | b | 3, 3, 5 |
| (8) | L1=6, L3=3 | NONE | a | 3, 3, 3 |
| (9) | L1=6, L3=4 | φ1≠0, φ2=0 | b | 4, 3, 3 |
| | | OTHER | a | 3, 3, 4 |
| (10) | L1=6, L3=5 | φ1≠0, φ2≠0, φ1≧φ2 | b | 4, 3, 4 |
| | | φ1=0, φ2≠0 | a | 3, 3, 5 |
| | | OTHER | c | 5, 3, 3 |
| (11) | L1≧6, L3≧6 | φ1=0, φ2≠0 | d | L1, 3, L3−3 |
| | | φ1≠0, φ2≠0, φ1<φ2 | c | L1−1, 3, L3−2 |
| | | φ1≠0, φ2≠0, φ1≧φ2 | b | L1−2, 3, L3−1 |
| | | φ1≠0, φ2=0 | a | L1−3, 3, L3 |

FIG. 36

| | CONDITIONS OF $L_1$ AND $L_3$ | CONDITIONS OF $\phi_1$ AND $\phi_2$ | CORRECTING PATTERN | RUN LENGTH AFTER CORRECTION |
|---|---|---|---|---|
| (1) | $L_1+L_3<11$ | $\phi_1\neq 0, \phi_2\neq 0$ | e | $L_1+L_3$ |
| (2) | $L_1\geq 3, L_3\geq 6$ | $\phi_1=0, \phi_2\neq 0$ | d | $L_1, 3, L_3-3$ |
| (3) | $L_1+L_3\geq 11, L_1\geq 4, L_3\geq 5$ | $\phi_1\neq 0, \phi_2\neq 0, \phi_1<\phi_2$ | c | $L_1-1, 3, L_3-2$ |
| (4) | $L_1+L_3\geq 11, L_1\geq 5, L_3\geq 4$ | $\phi_1\neq 0, \phi_2\neq 0, \phi_1\geq\phi_2$ | b | $L_1-2, 3, L_3-1$ |
| (5) | $L_1\geq 6, L_3\geq 3$ | $\phi_1\neq 0, \phi_2=0$ | a | $L_1-3, 3, L_3$ |

FIG. 37

| | CONDITIONS OF $L_1$ AND $L_3$ | CONDITIONS OF $\phi_1$ AND $\phi_2$ | CORRECTING PATTERN | RUN LENGTH AFTER CORRECTION |
|---|---|---|---|---|
| (1) | $L_3 \geq 6$ | NONE | d | $L_1, 3, L_3-3$ |
| (2) | $L_1 \geq 4, L_3 = 5$ | NONE | c | $L_1-1, 3, L_3-2$ |
| (3) | $L_1 \geq 5, L_3 = 4$ | NONE | b | $L_1-2, 3, L_3-1$ |
| (4) | $L_1 \geq 6, L_3 = 3$ | NONE | a | $L_1-3, 3, L_3$ |

FIG. 39

| | CONDITIONS OF L1 AND L3 | CONDITIONS OF φ1 AND φ2 | CORRECTING PATTERN | RUN LENGTH AFTER CORRECTION |
|---|---|---|---|---|
| (1) | L1+L2+L3≦8 | NONE | d | L1+L2+L3 |
| (2) | L1=3, L3≧5 | NONE | c | 3, 3, L3−2 |
| (3) | L1≧5, L3=3 | NONE | a | L1−2, 3, 3 |
| (4) | L1=4, L3≧5 | φ1=0, φ2≠0 | c | 4, 3, L3−2 |
| | | OTHER | b | 3, 3, L3−1 |
| (5) | L1≧5, L3=4 | φ1≠0, φ2=0 | a | L1−2, 3, 4 |
| | | OTHER | b | L1−1, 3, 3 |
| (6) | L1≧5, L3≧5 | φ1=0, φ2≠0 | c | L1, 3, L3−2 |
| | | φ1≠0, φ2=0 | b | L1−1, 3, L3−1 |
| | | φ1=φ2=0 | | |
| | | φ1≠0, φ2=0 | a | L1−2, 3, L3 |

FIG. 40

| | CONDITIONS OF L1 AND L3 | CONDITIONS OF $\phi_1$ AND $\phi_2$ | CORRECTING PATTERN | RUN LENGTH AFTER CORRECTION |
|---|---|---|---|---|
| (1) | L1+L2+L3<11 | $\phi_1 \neq 0, \phi_2 \neq 0$ | d | L1+L2+L3 |
| (2) | L1≧3, L3≧5 | $\phi_1 = 0, \phi_2 \neq 0$ | c | L1, 3, L3−2 |
| (3) | L1+L2+L3≧11, L1≧4, L3≧4 | $\phi_1 \neq 0, \phi_2 \neq 0$ | b | L1−1, 3, L3−1 |
| | | $\phi_1 = \phi_2 = 0$ | | |
| (4) | L1≧5, L3≧3 | $\phi_1 \neq 0, \phi_2 = 0$ | a | L1−2, 3, L3 |

FIG. 41

| | CONDITIONS OF $L_1$ AND $L_3$ | CONDITIONS OF $\phi_1$ AND $\phi_2$ | CORRECTING PATTERN | RUN LENGTH AFTER CORRECTION |
|---|---|---|---|---|
| (1) | $L_3 \geq 5$ | NONE | c | $L_1, 3, L_3-2$ |
| (2) | $L_1 \geq 4, L_3 = 4$ | NONE | b | $L_1-1, 3, L_3-1$ |
| (3) | $L_1 \geq 5, L_3 = 3$ | NONE | a | $L_1-2, 3, L_3$ |

FIG. 43

| | CONDITIONS OF L1 AND L3 | CONDITIONS OF φ1 AND φ2 | CORRECTING PATTERN | RUN LENGTH AFTER CORRECTION |
|---|---|---|---|---|
| (1) | L1=3, L3=3 | NONE | c | L1+L2+L3 (=8) |
| (2) | L1=3, L3≧4 | NONE | b | 3, 3, L3−1 |
| (3) | L1≧4, L3=3 | NONE | a | L1−1, 3, 3 |
| (4) | L1≧4, L3≧4 | φ1=0, φ2≠0 | b | L1, 3, L3−1 |
| | | φ1≠0, φ2≠0, φ1<φ2 | b | L1, 3, L3−1 |
| | | φ1≠0, φ2=0 | a | L1−1, 3, L3 |
| | | φ1≠0, φ2≠0, φ1≧φ2 | a | L1−1, 3, L3 |

FIG. 45

| | CONDITIONS OF L1, L2, L3 AND L4 | CONDITIONS OF φ1, φ2, AND φ3 | CORRECTING PATTERN | RUN LENGTH AFTER CORRECTION |
|---|---|---|---|---|
| (1) | L1+L2+L3≦11 | φ1≠0, φ2≠0, φ3=0 | c | L1+L2+L3, L4 |
| (2) | L1+L2≦11, L3+L4≦11 | φ1≠0, φ2≠0, φ3≠0 | b | L1+L2, L3+L4 |
| (3) | L2+L3+L4≦11 | φ1=0, φ2≠0, φ3≠0 | a | L1, L2+L3+L4 |
|  |  | φ1=0, φ2≠0, φ3=0 |  |  |
| (4) | IF RUN LENGTH AFTER CORRECTION IS 11T+11T, THIS CORRECTION IS APPLIED UNCONDITIONALLY. OTHERWISE, CONDITIONS OF φ ARE CHECKED. | φ2=0 | d | L1+L2−3, 3, 3, L3+L4−3 |

FIG. 46

| | CONDITIONS OF L1, L2, L3 AND L4 | CONDITIONS OF $\phi_1$, $\phi_2$, AND $\phi_3$ | CORRECTING PATTERN | RUN LENGTH AFTER CORRECTION |
|---|---|---|---|---|
| (1) | L1+L2+L3≦11 | $\phi_1\neq 0, \phi_3=0$ | c | L1+L2+L3, L4 |
| (2) | L1+L2≦11, L3+L4≦11 | $\phi_1\neq 0, \phi_2\neq 0, \phi_3\neq 0$ | b | L1+L2, L3+L4 |
| (3) | L2+L3+L4≦11 | $\phi_1=0, \phi_3\neq 0$ | a | L1, L2+L3+L4 |
| | | $\phi_1=0, \phi_3=0$ | | |
| (4) | IF RUN LENGTH AFTER CORRECTION IS 11T+11T, THIS CORRECTION IS APPLIED UNCONDITIONALLY. OTHERWISE, CONDITIONS OF $\phi$ ARE CHECKED. | $\phi_1\neq 0, \phi_2=0, \phi_3\neq 0$ | d | L1+L2−3, 3, 3, L3+L4−3 |

FIG. 47

| | CONDITIONS OF L2 AND L3 | CONDITIONS OF L1, L4 AND φ | RUN LENGTH AFTER CORRECTION |
|---|---|---|---|
| (1) | L2+L3=1 | L1≦11, L4≦10 | L1, L4+1 |
| | | L1≦10, L4=11 | L1+1, L4 |
| | | CONDITIONS OTHER THAN ABOVE | L1, 1, L4 |
| (2) | L2+L3=2 | L1=11, L4≦9 | L1, L4+2 |
| | | L1≦11, L4=9, (φ1,φ2,φ3)≫0 | |
| | | L1=10, L4=10 | L1+1, L4+1 |
| | | L1≦10, L4≦10, (φ1,φ2,φ3)≫0 | |
| | | L1≦9, L4=11 | L1+2, L4 |
| | | CONDITIONS OTHER THAN ABOVE | L1, 2, L4 |
| (3) | L2+L3=3 | L1=11, L4≦8 | L1, L4+3 |
| | | L1≦10, L4≦9 | L1+1, L4+2 |
| | | L1=9, L4=10 | L1+2, L4+1 |
| | | L1≦8, L4=11 | L1+3, L4 |
| | | CONDITIONS OTHER THAN ABOVE | L1, 3, L4 |
| (4) | L2+L3=4 | L1=11, L4≦7 | L1, L4+4 |
| | | L1=10, L4=8 | L1+1, L4+3 |
| | | L1=9, L4=9 | L1+2, L4+2 |
| | | L1=8, L4=10 | L1+3, L4+1 |
| | | L1≦7, L4=11 | L1+4, L4 |
| | | CONDITIONS OTHER THAN ABOVE | L1, 4, L4 |

FIG. 49

| | CONDITIONS OF L1 AND L5 | CONDITIONS OF φ1 AND φ2 | CORRECTING PATTERN | RUN LENGTH AFTER CORRECTION |
|---|---|---|---|---|
| (1) | NONE | NONE | — | L1, L2+L3+L4, L5 |

FIG. 51

| | CONDITIONS OF $L_1$ AND $L_5$ | CONDITIONS OF $\phi_1$ AND $\phi_2$ | CORRECTING PATTERN | RUN LENGTH AFTER CORRECTION |
|---|---|---|---|---|
| (1) | NONE | NONE | — | $L_1$, 3, $L_5$ |

FIG. 53

| | CONDITIONS OF $L_1$ AND $L_5$ | CONDITIONS OF $\phi_1$ AND $\phi_2$ | CORRECTING PATTERN | RUN LENGTH AFTER CORRECTION |
|---|---|---|---|---|
| (1) | NONE | NONE | a | $L_1$, $L_2+L_3+L_4$, $L_5$ |

FIG. 54

| | CONDITIONS OF $L_1$ AND $L_5$ | CONDITIONS OF $\phi_1$ AND $\phi_2$ | CORRECTING PATTERN | RUN LENGTH AFTER CORRECTION |
|---|---|---|---|---|
| (1) | $L_1+L_2+L_3+L_4-3 \leq 11$ | $\phi_1 \geq \phi_2$ | c | $L_1+L_2+L_3+L_4-3, 3, L_5$ |
| (2) | $L_2+L_3+L_4+L_5-3 \leq 11$ | $\phi_1 < \phi_2$ | b | $L_1, 3, L_2+L_3+L_4+L_5-3$ |
| (3) | OTHER THAN ABOVE | NONE | a | $L_1, L_2+L_3+L_4, L_5$ |

FIG. 56

| | CONDITIONS OF L2, L3, L4 AND L5 | PATTERN 1 AFTER CORRECTION | PATTERN 2 AFTER CORRECTION |
|---|---|---|---|
| (1) | (L2+L3+L4+L5) = 2 | 2 | 2 |
| (2) | (L2+L3+L4+L5) = 3 | 3 | 3 |
| (3) | (L2+L3+L4+L5) = 4 | 4 | 2, 2 |
| (4) | (L2+L3+L4+L5) = 5 | 5 | 2, 3 |
| (5) | (L2+L3+L4+L5) = 6 | 6 | 3, 3 |
| (6) | (L2+L3+L4+L5) = 7 | 7 | 3, 4 |
| (7) | (L2+L3+L4+L5) = 8 | 8 | 4, 4 |

FIG. 58

| | CONDITIONS OF L1 AND L3 | CONDITIONS OF φ1 AND φ2 | CORRECTING PATTERN | RUN LENGTH AFTER CORRECTION |
|---|---|---|---|---|
| (1) | L1<10 | φ1≠0, φ2=0 | a | L1+1, 11, L3 |
| | | φ1≠0, φ2≠0, φ1≧φ2 | | |
| (2) | L3<10 | φ1=0, φ2≠0 | b | L1, 11, L3+1 |
| | | φ1≠0, φ2≠0, φ1<φ2 | | |
| (3) | OTHER | | — | NO PROCESSING |

FIG. 76

| EMBODIMENT | | | | | RELATED ART | |
|---|---|---|---|---|---|---|
| 1T/16 PHASE CONTROL | | | 1T/32 PHASE CONTROL | | | |
| | PHASE ERROR | ACCUMU-LATED ERROR | | PHASE ERROR | ACCUMU-LATED ERROR | PHASE ERROR | ACCUMU-LATED ERROR |
| CaseI | 0T/16 | 14 | CaseI | 0T/32 | 15 | 0T/8 | 1 |
| | | | CaseI' | 1T/32 | 14 | | |
| CaseJ | 1T/16 | 12 | CaseJ | 2T/32 | 13 | 1T/8 | 1 |
| | | | CaseJ' | 3T/32 | 12 | | |
| CaseK | 2T/16 | 10 | CaseK | 4T/32 | 11 | | |
| | | | CaseK' | 5T/32 | 10 | | |
| CaseL | 3T/16 | 8 | CaseL | 6T/32 | 9 | 2T/8 | 1 |
| | | | CaseL' | 7T/32 | 8 | | |
| CaseM | 4T/16 | 6 | CaseM | 8T/32 | 7 | | |
| | | | CaseM' | 9T/32 | 6 | | |
| CaseN | 5T/16 | 4 | CaseN | 10T/32 | 5 | 3T/8 | 1 |
| | | | CaseN' | 11T/32 | 4 | | |
| CaseO | 6T/16 | 2 | CaseO | 12T/32 | 3 | | |
| | | | CaseO | 13T/32 | 2 | | |
| CaseP | 7T/16 | 0 | CaseO' | 14T/32 | 1 | 4T/8 | 0 |
| | | | CaseP' | 15T/32 | 0 | | |
| CaseA | 8T/16 | 0 | CaseA | 16T/32 | 0 | | |
| | | | CaseA' | 17T/32 | 1 | | |
| CaseB | 9T/16 | 2 | CaseB | 18T/32 | 2 | 5T/8 | 1 |
| | | | CaseB' | 19T/32 | 3 | | |
| CaseC | 10T/16 | 4 | CaseC | 20T/32 | 4 | | |
| | | | CaseC' | 21T/32 | 5 | | |
| CaseD | 11T/16 | 6 | CaseD | 22T/32 | 6 | 6T/8 | 1 |
| | | | CaseD' | 23T/32 | 7 | | |
| CaseE | 12T/16 | 8 | CaseE | 24T/32 | 8 | | |
| | | | CaseE' | 25T/32 | 9 | | |
| CaseF | 13T/16 | 10 | CaseF | 26T/32 | 10 | 7T/8 | 1 |
| | | | CaseF' | 27T/32 | 11 | | |
| CaseG | 14T/16 | 12 | CaseG | 28T/32 | 12 | | |
| | | | CaseG' | 29T/32 | 13 | | |
| CaseH | 15T/16 | 14 | CaseH | 30T/32 | 14 | 0T/8 | 1 |
| | | | CaseH' | 31T/32 | 15 | | |

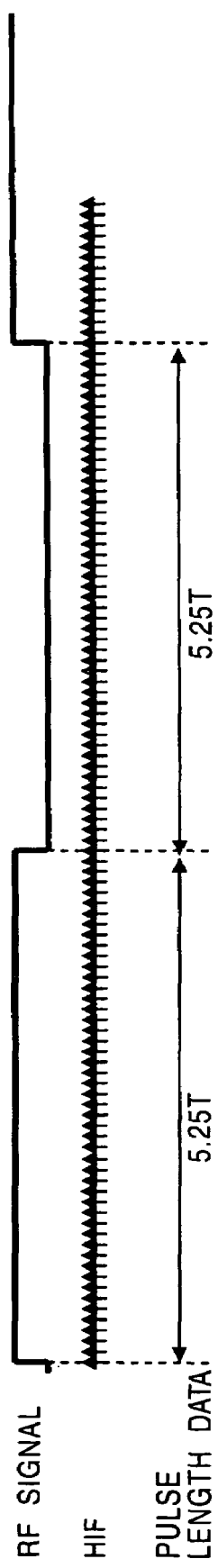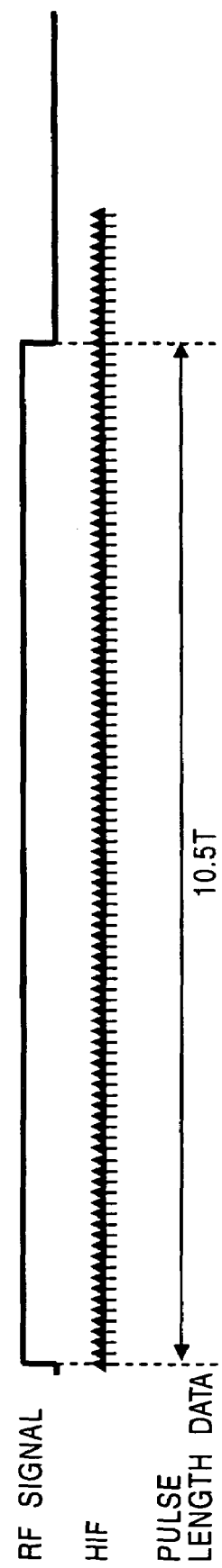

DIGITAL PLL DEVICE

BACKGROUND OF THE INVENTION

1. Field of the Invention

The present invention relates to digital phase-locked-loop (PLL) devices that are mounted, for example, on disc drive apparatuses.

2. Description of the Related Art

Digital PLL systems are used in data recording/playback apparatuses such as disc drive apparatuses, as disclosed, for example, in Japanese Unexamined Patent Application Publication No. 11-341306 and Japanese Unexamined Patent Application Publication No. 9-247137. When playback information (i.e., playback RF signal) is read from a disc or the like, a clock that is synchronized with the playback information is generated using a PLL circuit, and data representing the playback information is extracted using the clock.

As an example, FIG. 79 shows an example system configuration for data extraction by digital PLL in a disc playback apparatus for compact discs (CDs) or digital versatile discs (DVDs).

The digital PLL system shown in FIG. 79 receives input of playback RF signal generated based on reflected light detected by an optical head of the disc playback apparatus, and generates run-length data that serves as playback information from the playback RF signal.

The RF signal is input to an asymmetry correcting circuit 61 and is binarized therein. The RF signal binarized in the asymmetry correcting circuit 61 is supplied to a master PLL control circuit 65. The master PLL control circuit 65 generates a reference clock having the same frequency as 1T of the RF signal from the binarized RF signal, and outputs the reference clock to a voltage-controlled-oscillator (VCO) control circuit 66.

The VCO control circuit 66 controls a VCO 67 so that the oscillation frequency of the VCO 67 will be the same as the frequency of the reference clock. Under the control of the VCO control circuit 66, the VCO 67 outputs a clock (hereinafter referred to as a high-frequency clock) by oscillation.

A frequency control circuit 68 receives the binarized RF signal and the high-frequency clock from the VCO 67. The frequency control circuit 68 samples the binarized RF signal using the high-frequency clock, and detects a deviation between the frequency of the RF signal and the oscillation frequency of the VCO 67.

A phase control and run-length determining circuit 62 receives the binarized RF signal, the high-frequency clock from the VCO 67, and a signal representing a frequency deviation from the frequency control circuit 68. The phase control and run-length determining circuit 62 generates a channel clock synchronized with the RF signal using the signal representing the frequency deviation and the binarized RF signal, and extracts run-length data from the RF signal using the channel clock. The phase control and run-length determining circuit 62 also outputs a phase error.

The extracted run-length data and the phase error are supplied to a run-length correcting circuit (hereinafter also referred to as an RLL circuit) 63. The RLL circuit 63 corrects run-length data based on the run-length data and an associated phase error. Run-length data that has been corrected is supplied to subsequent decoding circuitry that is not shown, and is decoded therein.

The phase error is also supplied to a jitter meter 64. The jitter meter 64 measures a jitter value using the phase error.

Furthermore, the run-length data from the phase control and run-length determining circuit 62 are also supplied to the master PLL control circuit 65.

The conventional digital PLL system described above has had various problems described below.

<Problems of the Asymmetry Correcting Circuit 61>

In the asymmetry correcting circuit 61 where binarization is executed, it is essential to maintain an appropriate level of a signal for slicing analog RF signals. In some cases, however, it is not possible to maintain an appropriate slice level due to a disturbance superposed on a desired signal. Factors that could cause such a disturbance include nature of the signal source, characteristics of the system, noise on the transmission system, damage or dirt on a physical recording medium such as a disc medium, and physical factors such as vibration.

Conventionally, in order to correct asymmetry of an RF signal, a system that feeds back an average value of an input signal (RF signal) and uses it as a slice level has been implemented by an analog circuit. For example, referring to FIG. 80, an RF signal is input to a comparator 71 via a capacitor C and resistors R1 and R2. The comparator 71 performs comparison based on a slice level supplied from an amp 73, and outputs a binarized RF signal. The binarized RF signal is averaged by a low-pass filter 72, and a resulting slice level is input to the comparator 71 via the amp 73.

This arrangement is feasible in cases where the quality of the input signal (RF signal) is favorable. However, when the level of the input signal is deviated due to a disturbance or the like, since the nature of the disturbance is not known, it has been difficult to perform appropriate correction depending on the deviation by the analog circuit on the spot.

Furthermore, it is also possible that the speed of signals considerably varies within a single system. This implies that the response speed of the circuit must be controlled in accordance with the signal speed even in cases of the same type of disturbance. Practically, it is difficult to implement a system that handles disturbance by an analog circuit. Thus, effective measures have not been taken against various types of asymmetry deviation.

<Problems of the VCO 67 and the VCO Control Circuit 66>

A conventional VCO has only one control terminal. FIG. 81 shows change in oscillation frequency in relation to control voltage in the conventional VCO. In FIG. 81, the horizontal axis represents the control voltage, and the vertical axis represents the oscillation frequency. A VCO must be capable of oscillating at any frequency in accordance with the control voltage in a range of VDD to VSS, as shown in FIG. 81. However, in this VCO, the frequency changes greatly in relation to change in the control voltage. The change in frequency in relation to the change in the control voltage is represented by Δf1/ΔV in FIG. 81.

The fact that the frequency changes greatly in relation to the change in the control voltage implies that even a slight change in the control voltage caused by noise or the like results in a considerably change in the frequency. This significantly affects the playability (performance) of the circuit.

As a countermeasure, it is possible to improve susceptibility to noise by increasing the time constant of the low-pass filter in relation to the control voltage so that slight variation of the control voltage will be suppressed. This approach, however, degrades tracking characteristics.

In order to lock a PLL while not increasing jitter, the change in the oscillation frequency in relation to the change in the VCO control voltage must be gradual.

An approach for achieving this is to prepare VCOs optimal for respective frequency bands and to use the VCOs by switching. As an example, FIG. 82 shows a case where four VCOs VCO-A, VCO-B, VCO-C, and VCO-D are used.

In FIG. 82, (a), (b), (c), and (d) represent frequency characteristics of the VCO-A, VCO-B, VCO-C, and VCO-D, respectively. In FIG. 82, the horizontal axis represents the control voltage, and the vertical axis represents the oscillation frequency.

As will be understood from FIG. 82, the change in the frequency in relation to change in the control voltage ($\Delta f2/\Delta V$ in FIG. 82) is more gradual than in the case shown in FIG. 81 ($\Delta f1/\Delta V$).

According to the arrangement using a plurality of VCOs, however, switching among the VCOs is needed each time the playback speed of disc medium is changed. This inhibits seamless tracking.

In the example shown in FIG. 82, when the oscillation frequency is changed from 100 MHz to 200 MHz, i.e., from point (e) to point (f), switching from the VCO-A to the VCO-B must take place, so that tracking characteristics are degraded.

Furthermore, in the conventional circuit shown in FIG. 79, the length of an RF signal is measured in the frequency control circuit 68 and the phase control and run-length determining circuit 62, using a high-frequency clock generated by the VCO 67. Therefore, a deviation in the oscillation frequency of the VCO 67 results in inaccurate measurement of the length of an RF signal. This significantly affects playability. It is desired that the change in the oscillation frequency of the VCO 67 in relation to the control voltage is linear (i.e., $\Delta f1/\Delta V$ is constant), as shown in FIG. 81. Actually, however, the change in the oscillation frequency of a VCO in relation to the control voltage is not linear due to circuit configuration or process variation, as shown in FIG. 83. Thus, the gradient is small in some parts as denoted by $\Delta f3/\Delta V$, and large in other parts as denoted by $\Delta f4/\Delta V$.

When the gradient is large as denoted by $\Delta f4/\Delta V$, noise superposed on the control voltage causes a considerable deviation of the oscillation frequency.

Conventionally, digital circuits have not been used as counter measures against the non-linearity of the frequency characteristics of VCOs.

<Problems of the Frequency Control Circuit 68>

The oscillation frequency of the VCO 67 is controlled by the master PLL control circuit 65 and the VCO control circuit 66 so as to coincide with the frequency of 1T of an RF signal (4.3218 MHz×n in the case of a CD, and 26.16 MHz×n in the case of a DVD).

However, immediately after movement of the disc is started, or in the case of a disc having eccentricity, a frequency deviation temporarily occurs between the frequency of an RF signal and the oscillation frequency of the VCO 67. Two types of such frequency deviation exist.

One is a case where the playback speed of the disc considerably changes, for example, when rotation of the disc is started or when a long track jump occurs. In this case, the frequency of the RF signal and the frequency of the VCO must be brought into a locked state where the frequencies are matched from an unlocked state where the frequencies are not matched.

The other type is caused by fluctuation of a spindle motor that rotates the disc. In the case of a disc having eccentricity, the frequency of the RF signal is matched with the frequency of the VCO at first, and a frequency deviation occurs as the frequency of the RF signal gradually changes. In the case of he fluctuation of the spindle motor, wow and flutter of motor control affects the length of the RF signal, whereby a frequency deviation occurs.

These types of frequency deviation can be handled by a wide capture range and lock range of a PLL system, whereby favorable tracking characteristics are achieved.

When a frequency deviation has occurred as described above, the frequency deviation must be detected in some way. Conventionally, the frequency deviation has been detected using only pulse-length data of a binarized RF signal measured using a high-frequency clock.

However, for example, if the pulse length is 10.5T, it is not possible to determine whether the pulse length is actually 10T but incorrectly measured to be longer, or the pulse length is actually 11T but is incorrectly measured to be shorter. Thus, a pulse-length that cannot be determined must be considered as falling in an insensitive region.

FIGS. 84A and 84B show effect of difference of pulse-length data with the same frequency deviation. In FIG. 84A, the pulse length is measured as 5.25T, so that it is possible to determine that the pulse length is actually 5T but is incorrectly measured to be longer. On the other hand, in FIG. 84B, the pulse length is measured as 10.5T, so that it is not possible to determine from the pulse-length data alone whether the pulse length is actually 10T but is incorrectly measured to be longer or the pulse length is actually 11T but is incorrectly measured to be shorter.

As shown in FIG. 84, a frequency deviation considerably affects pulse length data of a long pulse length, so that long pulse-length data must have a larger insensitive region.

However, an increase in insensitive region reduces the number of pulse-length data in which a frequency deviation can be recognized. This results in slower recognition of a frequency deviation.

Furthermore, in order to increase the range of frequency deviation that can be detected, short pulse-length data that can be recognized even under the influence of a frequency deviation must be used. As shown in FIG. 85, an RF signal is an analog signal having a certain gradation, and the amplitude thereof varies depending on pulse-length data. Short pulse-length data corresponds to a small amplitude of an RF signal, so that it is susceptible to disturbance such as a jitter and is therefore not so reliable. Thus, the reliability of a calculated frequency deviation is low.

<Problems of the Phase Control and Run-Length Determining Circuit 62>

In the case of playback by the related art, a channel clock that is synchronized with a binarized RF signal is generated by a digital PLL. In FIG. 19, part (a) shows the binarized RF signal, part (b) shows the channel clock, and part (c) shows an RF signal sampled based no the channel clock. In the digital PLL, in order to match the phases and frequencies of the RF signal and the channel clock, a high-frequency clock (Hif) is divided by 7.5, 8.0, and 8.5 while also using reverse edges of the high-frequency clock, and the phase is advanced or delayed, whereby the channel clock is generated.

For example, the operating frequency of the digital PLL for playing back a DVD at the speed of ×1 is 209.28 MHz, which is eight times the frequency 26.16 MHz of the channel clock needed for the speed of the DVD. The operating frequency of the digital PLL for playing back a DVD at the speed of ×20 is 4.185 GHz, which is twenty times the frequency 209.28 MHz. It is difficult to achieve a frequency higher than 4 GHz by the current CMOS process. Even if that is possible, power consumption is increased due to high-speed operation, the lifetime of LSIs is decreased, or LSIs not satisfying specifications are manufactured and yield is decreased.

As another method of improving playability using known techniques, it is also possible to increase the resolution of the channel clock. This approach, however, further increases the frequency of the high-frequency clock, and is therefore infeasible for high-speed playback.

<RLL Circuit 63>

When a CD or a DVD is played back, run-length data that is impossible to occur is sometimes read, due to noise or damage on the disc, or rough manufacturing of the disc itself.

In the conventional RLL circuit 63, with regard to data whose inversion interval is supposed to fall within a range of 3T to 1T, only data that is shorter than 3T, i.e., the minimum inversion interval, is corrected. The method of correction is determined based on the length of previous or subsequent run-length data, or the magnitude of a phase error. That is, run-length data that is shorter than 3T is removed or extended (for example, 2T is impossible, so that 2T is extended to the minimum inversion interval of 3T) according to a simple rule, and the correction is not based on an examination as to how the run-length data is actually broken.

Furthermore, correction of successive run-length data that is against a predefined format is not considered at all. Therefore, the reliability of correction is low.

Furthermore, run-length data that exceeds 11T is not corrected, so that the correction has no effect on such data.

Furthermore, sync patterns are not considered, and it is possible that false sync patterns are generated by the correction. This could degrade playability.

<Problems of the Jitter Meter 64>

The conventional jitter meter 64 obtains a jitter value by accumulating the presence or absence of a phase error measured by a high frequency clock, that is, whether the phase error is zero or not. This is because accumulation of binary values is difficult since the operating frequency high even when the playback speed of a disc is low. The conventional jitter meter 64 is not capable of measuring a jitter at a speed of ×8 of a CD or ×1.6 of a DVD.

Furthermore, a phase error is not used as it is, but is replaced by a simple signal representing the presence or absence of error. Thus, it is not possible to find correlation between jitter values measured by a measurement device available on the market and data output by the jitter meter 64.

SUMMARY OF THE INVENTION

The present invention has been made in view of the problems described above, and it is an object of the present invention to provide a digital PLL device for use in a disc playback apparatus or the like, in which a new algorithm that achieves high-speed playback and high playability is implemented.

To this end, the present invention provides a digital phase-locked-loop device including a clock generating device for generating a reference clock based on a binarized playback signal and a frequency of run-length data, and for generating N-phase clocks using the reference clock; a pulse-length measuring device for measuring a pulse length of the binarized playback signal using the N-phase clocks to output pulse-length data; and a run-length-data extracting device for counting the pulse-length data based on a virtual channel clock to extract run-length data.

Preferably, the clock generating device includes a voltage-controlled-oscillator controlling circuit for generating a rough-side control voltage and a fine-side control voltage based on the reference clock; and a two-terminal voltage-controlled oscillator for generating the N-phase clocks based on the rough-side control voltage and the fine-side control voltage.

The present invention relates to a digital PLL system that is used for extracting run-length data from a playback signal (RF signal) read from a recording medium such as a disc. More specifically, the present invention achieves a digital PLL based on a new algorithm, allowing high-speed playback and high playability of discs such as CDs or DVDs.

In the digital PLL device according to the present invention, a binarized playback signal is not measured using a high-frequency clock. Instead, pulse-length data is generated using N-phase clocks (e.g., 16-phase clocks) having the same frequency as 1T of a playback signal. That is, a high-frequency clock need not be generated in PLL processing.

Pulse-length data represented by numerals are counted by a virtual channel clock that is different from an actual clock, thereby extracting run-length data.

That is, as opposed to a conventional PLL, in which a channel clock synchronized with a playback signal is generated to measure the length of T of the playback signal, according to the present invention, T is simply determined based on pulse-length data of a playback signal.

Furthermore, since a 2-terminal N-phase VCO is used, low-speed playback to high-speed playback of a disc (×0.5 to ×48 in the case of a CD, or ×0.5 to ×16 in the case of a DVD) can be tracked seamlessly while maintaining the internal operating frequency sufficiently low.

Furthermore, by processing pulse-length data as digital data, favorable playability and precise measurement of jitter are achieved.

BRIEF DESCRIPTION OF THE DRAWINGS

FIGS. 10A and 10B are diagrams for explaining phase differences among 16-phase clocks in the embodiment;

FIGS. 11A and 11B are diagrams for explaining phase differences among 16-phase clocks in the embodiment;

FIG. 15 is a diagram for explaining an asymmetry deviation caused by a defect;

FIG. 35 is a diagram for explaining an example correction of a 0T single error in the embodiment;

FIG. 36 is a diagram for explaining an example correction of a 0T single error in the embodiment;

FIG. 37 is a diagram for explaining an example correction of a 0T single error in the embodiment;

FIG. 39 is a diagram for explaining an example correction of a 1T single error in the embodiment;

FIG. 40 is a diagram for explaining an example correction of a 1T single error in the embodiment;

FIG. 41 is a diagram for explaining an example correction of a 1T single error in the embodiment;

FIG. 43 is a diagram for explaining an example correction of a 2T single error in the embodiment;

FIG. 45 is a diagram for explaining an example correction of two successive errors in the embodiment;

FIG. 46 is a diagram for explaining an example correction of two successive errors in the embodiment;

FIG. 47 is a diagram for explaining an example correction of two successive errors in the embodiment;

FIG. 49 is a diagram for explaining an example correction of three successive errors in the embodiment;

FIG. 51 is a diagram for explaining an example correction of three successive errors in the embodiment;

FIG. 53 is a diagram for explaining an example correction of three successive errors in the embodiment;

FIG. 54 is a diagram for explaining an example correction of three successive errors in the embodiment;

FIG. 56 is a diagram for explaining an example correction of four or more successive errors in the embodiment;

FIG. 58 is a diagram for explaining an example correction of a 12T error in the embodiment;

FIG. 76 is a diagram for explaining a phase-error conversion of a jitter meter according to the embodiment and a jitter meter according to the related art;

FIGS. 84A and 84B are diagrams for explaining effect of a frequency deviation on a pulse length.

DESCRIPTION OF THE PREFERRED EMBODIMENTS

1. Overall Configuration of Digital PLL System

The overall configuration of a digital PLL system according to an embodiment of the present invention will be described with reference to FIG. 1.

The digital PLL system (digital PLL apparatus) is mounted, for example, on a disc playback apparatus for compact discs (CDs) or digital versatile discs (DVDs). The digital PLL system shown in FIG. 1 receives input of playback RF signals generated based on reflected light detected by an optical head of the disc playback apparatus, and run length data that serves as playback information is obtained from the playback RF signals.

Figure 1:
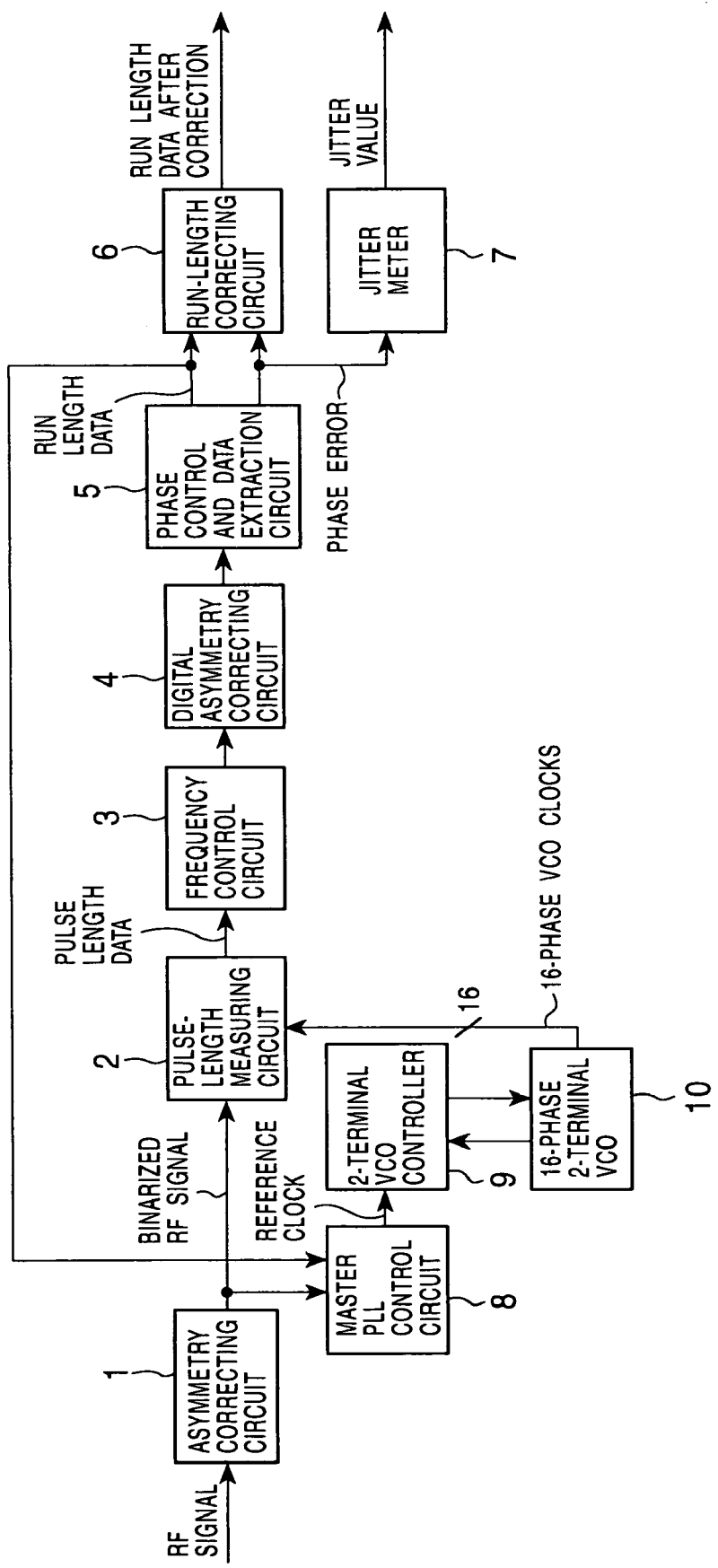
FIG. 1 is a block diagram of a digital PLL system according to an embodiment of the present invention.

As shown in FIG. 1, the digital PLL system includes an asymmetry correcting circuit 1, a pulse-length measuring circuit 2, a frequency control circuit 3, a digital asymmetry correcting circuit 4, a phase control and data extraction circuit 5, a run length correcting (RLL) circuit 6, a 16-phase 2-terminal VCO 10, a master PLL control circuit 8, a two-terminal VCO control circuit 9, and a jitter meter 7.

An RF signal that is supplied via an optical pickup or a matrix calculating circuit of the disc playback apparatus is input to the asymmetry correcting circuit 1, and is binarized by the asymmetry correcting circuit 1.

The binarized RF signal is input to the pulse-length measuring circuit 2. The pulse-length measuring circuit 2 receives sixteen clocks from the 16-phase 2-terminal VCO 10. The pulse length of the RF signal is measured by an internal measuring circuit using the sixteen clocks, and the resulting pulse-length data is output to the frequency control circuit 3.

The pulse-length data obtained by the pulse-length measuring circuit 2 becomes shorter or longer than the actual RF signal due to difference in frequency between 1T of the RF signal and the sixteen-phase clocks from the 16-phase 2-terminal VCO 10.

Thus, the frequency control circuit 3 determines a frequency difference from the pulse-length data, corrects the pulse-length data accordingly, and outputs corrected pulse-length data to the digital asymmetry correcting circuit 4.

The digital asymmetry correcting circuit 4 determines an asymmetric deviation from the pulse-length data, corrects the pulse-length data accordingly, and outputs corrected pulse-length data to the phase control and data extraction circuit 5.

The phase control and data extraction circuit 5 generates a virtual channel clock, and counts the pulse-length data based on the virtual channel clock to obtain a value of run-length data. The phase control and data extraction circuit 5 also outputs a phase error.

The run-length data and the phase error are output to the RLL circuit 6.

The RLL circuit 6 corrects run-length data that does not comply with a predetermined format based on the run-length data and the phase error extracted by the phase control and data extraction circuit 5.

The jitter meter 7 receives the phase error, and measures jitter in the RF signal based on the phase error.

The 16-phase 2-terminal VCO 10 is controlled by the master PLL control circuit 8 and the two-terminal VCO control circuit 9.

The master PLL control circuit 8 receives input of a binarized RF signal, and run length data from the phase control and data extraction circuit 5. The master PLL control circuit 8 generates a reference clock from the RF signal and the run length data.

The oscillation frequency of the reference clock coincides with the frequency of 1T of the RF signal (4.3218 MHz×n in the case of a CD, and 26.16 MHz×n in the case of a DVD), or an integer multiple thereof. The two-terminal VCO control circuit 9 exercises control so that the frequency of the 16-phase 2-terminal VCO 10 will be the same as the frequency of the reference clock. That is, the two-terminal VCO control circuit 9 exercises control so that the frequency of the 16-phase 2-terminal VCO 10 will be the same as the frequency of the RF signal, or an integer multiple of the frequency of the RF signal. This embodiment will be described assuming that these frequencies are the same except in "nTap Mode" described later.

In the digital PLL system configured as described above, the 16-phase 2-terminal VCO 10, with a circuit implementing a new algorithm, seamless tracking is allowed between low-speed playback and high-speed playback (e.g., 0.5 to 48 times in the case of a CD or 0.5 to 16 times in the case of a DVD) while maintaining the internal operating frequency sufficiently low.

More specifically, as opposed to conventional PLL devices, in which a channel clock synchronized with an RF signal is generated and the length of T of the RF signal is determined based on the channel clock, the new algorithm used in this embodiment only determines the number of T from pulse-length data of an RF signal. That is, the length of T is not measured based on a high-frequency clock, so that a high-frequency clock for measuring the length of T is not generated. More specifically, for example, 16-phase clocks each having a frequency corresponding to 1T are used.

Furthermore, pulse-length data is processed in the form of digital data. This serves to provide a playback apparatus having favorable playability or a jitter meter having high precision.

Now, the components for achieving the operations described above, i.e., the pulse-length measuring circuit 2, the frequency control circuit 3, the digital asymmetry correcting circuit 4, the phase control and data extraction circuit 5, the RLL circuit 6, the 16-phase 2-terminal VCO 10, the two-terminal VCO control circuit 9, and the jitter meter 7, will be described in order.

2. Pulse-Length Measuring Circuit

The pulse-length measuring circuit 2 is a circuit for measuring the pulse length of an RF signal using a digital PLL while maintaining the operating frequency low.

The pulse-length measuring circuit 2 samples an RF signal sixteen times with a precision of T/16 per 1T. The pulse-length measuring circuit 2 repeats this operation to obtain pulse-length data.

In order to achieve equivalent precision with a conventional algorithm, a clock that toggles sixteen times per 1T must be used for sampling, so that the clock has a high frequency. Thus, a pulse length of an RF signal is measured while maintaining a low operating frequency using a method described below.

Figure 2:
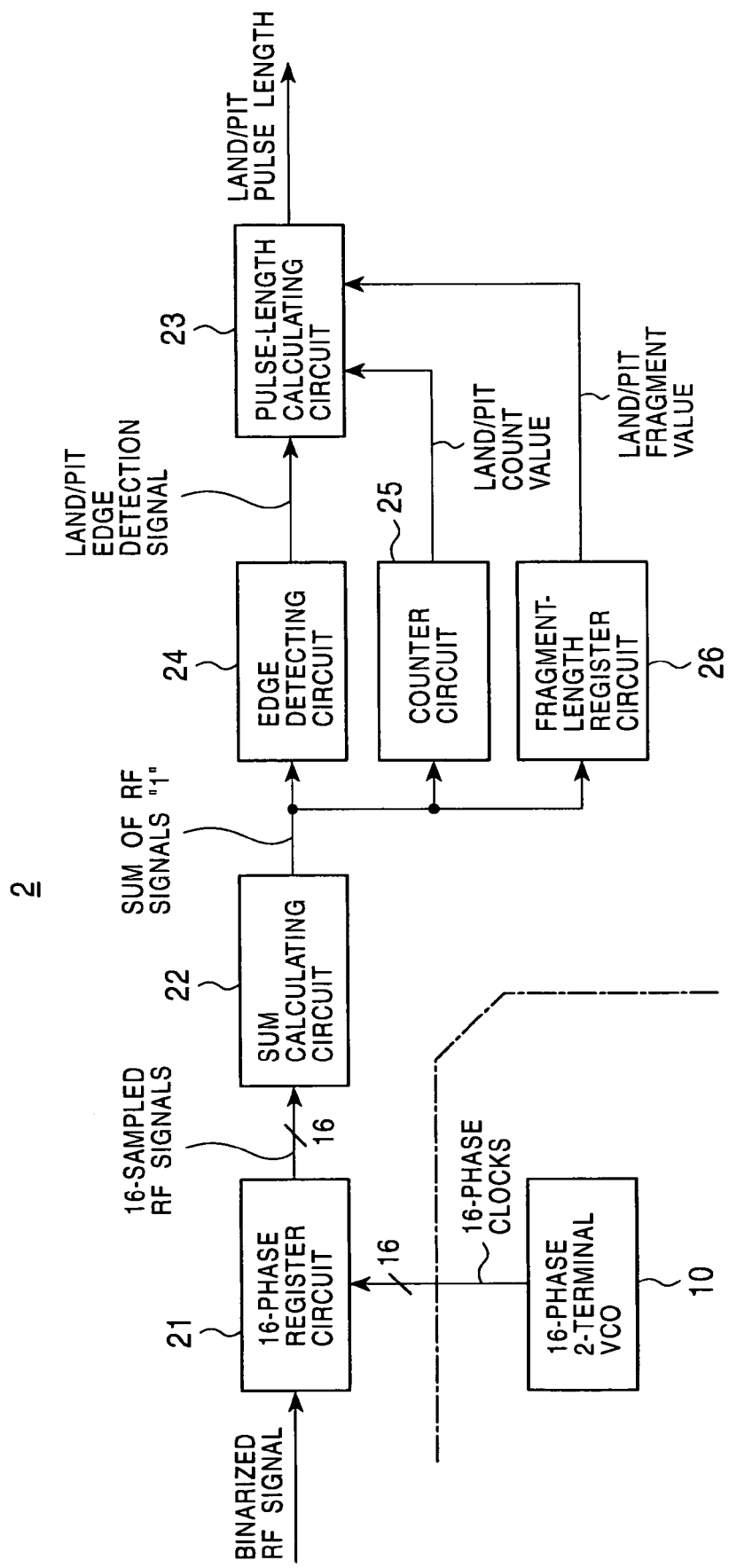
FIG. 2 is a block diagram of a pulse-length measuring circuit in the embodiment.

FIG. 2 shows the overall circuit configuration of the pulse-length measuring circuit 2.

The pulse-length measuring circuit 2 includes a 16-phase register circuit 21, a sum calculating circuit 22, an edge detecting circuit 24, a counter circuit 25, a fragment-length register circuit 26, and a pulse-length calculating circuit 23.

The binarized RF signal that is supplied from the asymmetry correcting circuit 1 to the pulse-length measuring circuit 2 represents the polarity of land or pit on a recording track of a disc. This example will be described assuming that the "0" corresponds to a pit and "1" corresponds to a land. As is well known, data is recorded on a disc in the form of a pit sequence. A land herein refers to a region between pits in a linear direction of a track, i.e., a region where a pit is not formed.

The 16-phase register circuit 21 shown in FIG. 2 receives binarized RF signals. The 16-phase register circuit 21 also receives 16-phase clock from the 16-phase 2-terminal VCO 10. As described earlier, the 16-phase 2-terminal VCO 10 is controlled by the master PLL control circuit 8 and the two-terminal VCO control circuit 9 so that the frequency of the RF signals coincides with the frequency of the VCO.

Figure 4:
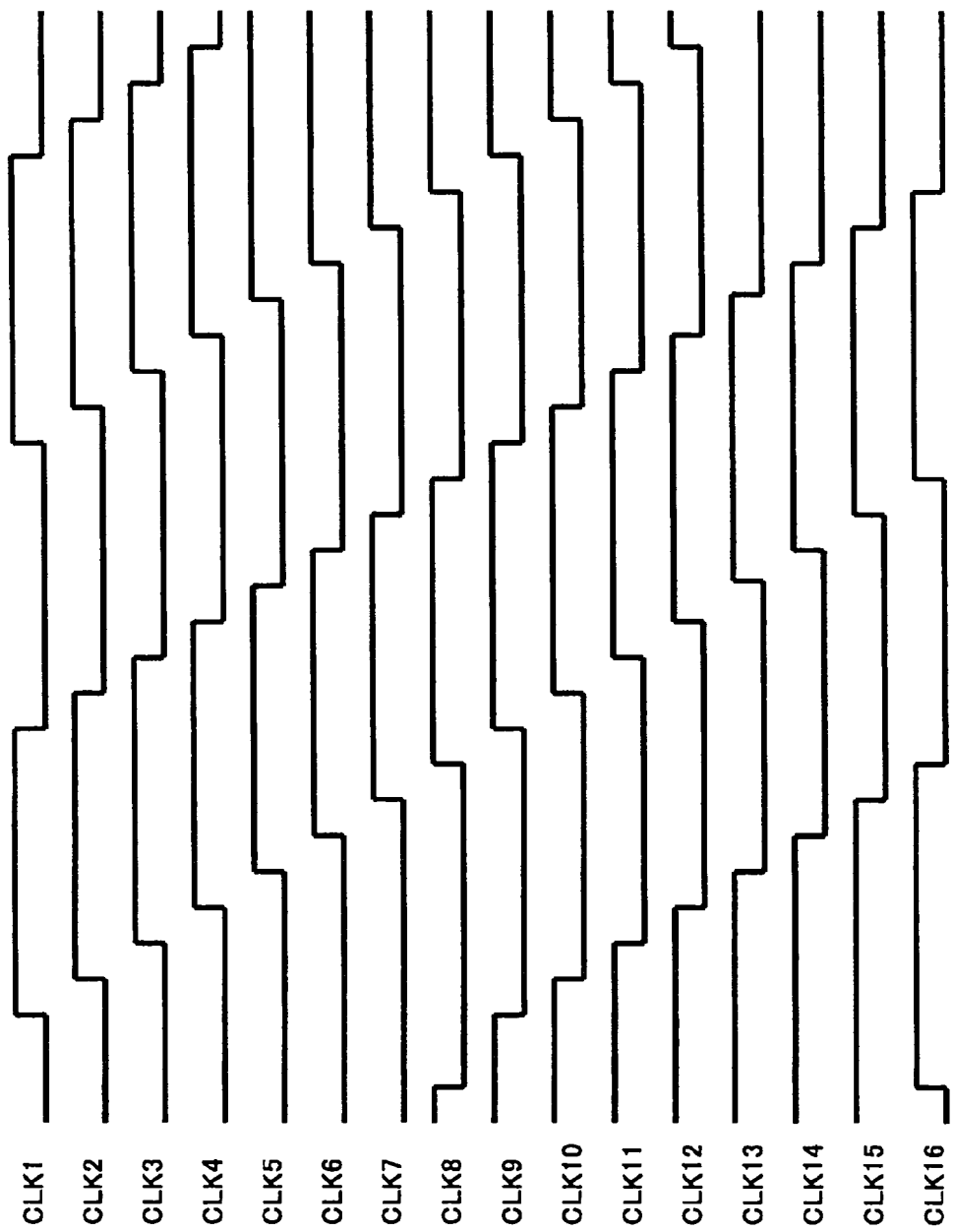
FIG. 4 is a waveform chart of 16-phase clocks in the embodiment.

The sixteen clocks (16-phase clock) output from the 16-phase 2-terminal VCO 10 have phase differences of 1/16 of the VCO frequency with each other, as indicated by CLK1 to CLK16 in FIG. 4.

Figure 5:
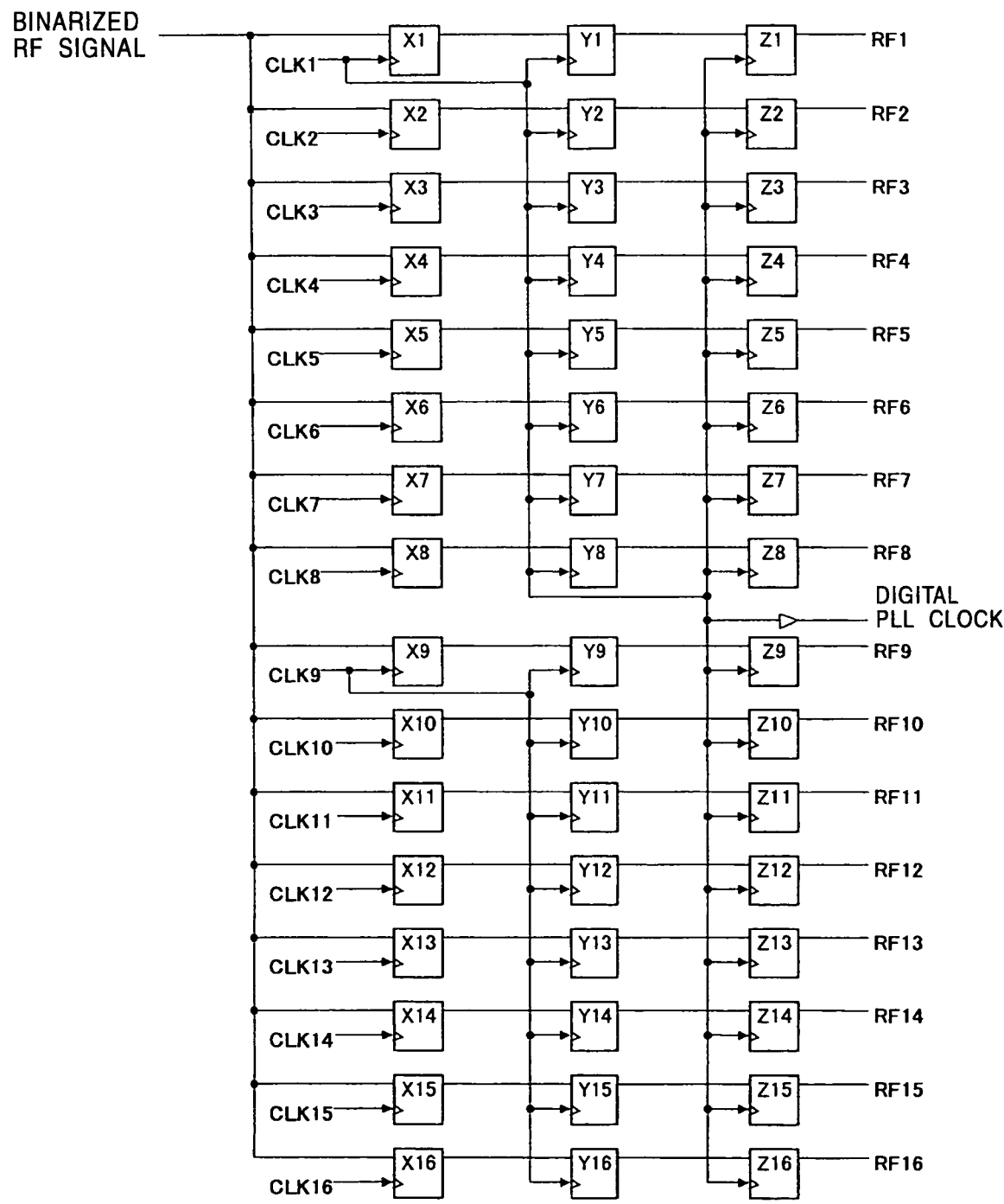
FIG. 5 is a block diagram of a 16-phase register circuit in the embodiment.

The 16-phase register circuit 21 that receives input of the 16-phase clock is configured as shown in FIG. 5. Referring to FIG. 5, the 16-phase register circuit 21 includes first-stage registers X1 to X16, second-stage registers Y1 to Y16, and third-stage registers Z1 to Z16. The 16-phase clocks CLK1 to CLK16 are input to clock terminals of the registers X1 to X16, respectively.

Thus, the binarized RF signals are captured by the registers X1 to X16 at timings of the 16-phase clocks CLK1 to CLK16, respectively. That is, the binarized RF signals are latched by the registers X1 to X16, respectively, whereby RF signals of a period 1T are sampled sixteen times at a precision of T/16.

The clock terminals of the registers Y1 to Y8 receive input of the clock CLK1. The clock terminals of the registers Y9 to Y16 receive input of the clock CLK9.

The clock terminals of the registers Z1 to Z16 receive input of the clock CLK1. The registers Y1 to Y16 and the registers Z1 to Z16 latch RF signals based on the clock input described above.

Thus, the RF signals sampled by the sixteen registers X1 to X16 of the first stage are finally latched based on a single-phase clock CLK1 (also referred to as MSCK in the following description) among the 16-phase clocks, and are output as data RF1 to RF16 in synchronization with the clock MSCK. The clock MSCK is used as a clock of the system.

The RF signals RF1 to RF16 output from the 16-phase register circuit 21 are input to the sum calculating circuit 22.

Now, with reference to FIG. 3, a process executed by the sum calculating circuit 22 to determine the status of a period 1T (hereinafter referred to as an MSCK period) of the input RF signals RF1 to RF16 will be described.

Figure 3:
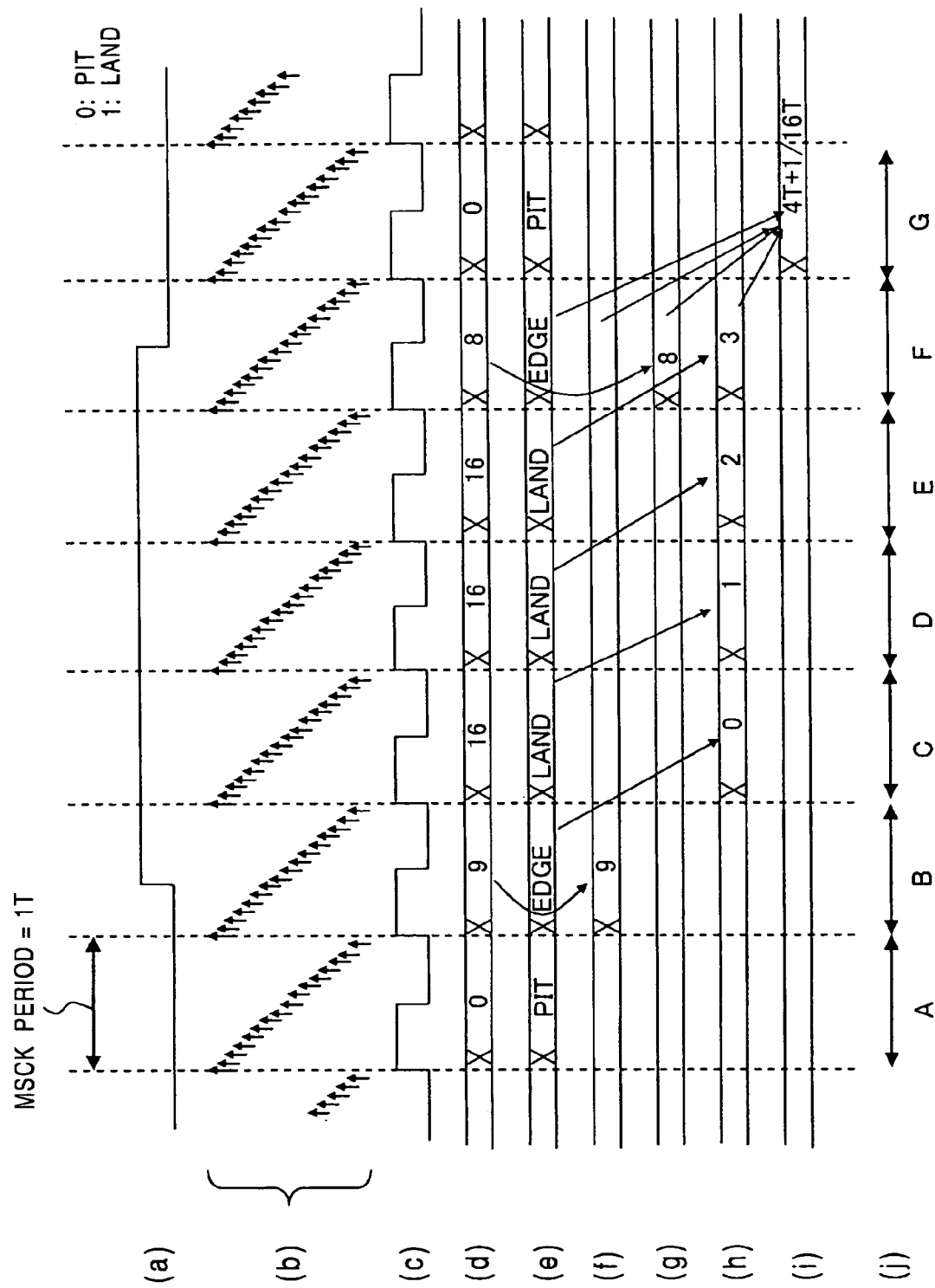
FIG. 3 is a diagram for explaining processing for generating run-length data in the embodiment.

When the RF signals RF1 to RF16 sampled by the 16-phase register circuit 21 are input to the sum calculating circuit 22, the sum calculating circuit 22 calculates the total number of "1"s in the RF signals RF1 to RF16 obtained by sixteen-times sampling at an interval of MSCK clock shown in part (j) of FIG. 3, and outputs the result as a value shown in part (d) of FIG. 3.

Part (a) in FIG. 3 shows binarized RF signals. The binarized RF signals are sampled by the 16-phase register circuit 21 based on the 16-phase clocks shown in part (b) in FIG. 2. Furthermore, as described earlier, the clock MSCK, shown in part (c) in FIG. 3, is output.

The sum calculating circuit 22 calculates the total number of "1"s in RF1 to RF16 for each MSCK period. For example, in the MSCK period A shown in FIG. 3, the total number of "1"s is zero. This is because the binarized RF signals are at "L" level in this period, so that the RF signals RF1 to RF16 obtained by sixteen-times sampling are all "0"s. In the MSCK period B, the total number of "1"s is nine. That is, the binarized RF signals shifts from "L" to "H" in this period. In this example, the RF signals RF8 to RF16 among the RF signals obtained by sixteen-times sampling represent "1"s.

As shown in part (d) in FIG. 3, the total number of "1"s in the RF signals RF1 to RF16 obtained by 16-sampling is output, so that the land component for each MSCK period can be determined in a range of 0T/16 to 16T/16.

The pulse-length measuring circuit 2 configured as shown in FIG. 2 calculates the pulse length by processing the number for each MSCK period.

Part (e) in FIG. 3 shows the status determined from the value shown in part (d) in FIG. 3.

For example, in the MSCK period shown in FIG. 3, the total number of "1"s in the RF signals shown in part (d) in FIG. 3 is 16T/16, the MSCK period C has a land component corresponding to 1.0T, so that the status of the RF signal in the MSCK period is determined as "LAND".

In the MSCK period A, the total number of "1"s in the RF signal shown in part (d) in FIG. 3 is 0T/16. Thus, the MSCK period A is a pit corresponding to 1.0T, so that the status of the RF signal is determined as "PIT".

If the value shown in part (d) in FIG. 3 is between 1T/16 to 15T/16, as in the MSCK period B or the MSCK period F, a land component and a pit component both exist. In that case, an edge adjacent to a pit and a land exists, so that the status of the RF signal is determined as "EDGE".

The sum calculating circuit 22 outputs data shown in parts (d) and (e) in FIG. 3, i.e., the total number of "1"s in the RF signal and status information. These pieces of information are supplied to the edge detecting circuit 24, the counter circuit 25, and the fragment-length register circuit 26.

The edge detecting circuit 24 will be described. The pulse-length data of land and pit can be determined by measuring the length between an edge and a next edge of an RF signal. For this purpose, the pulse-length measuring circuit 2 must detect an edge between a land and a pit from the RF signal. The detection is achieved by the edge detecting circuit 24 in the pulse-length measuring circuit 2.

The edge detecting circuit 24 detects an edge based on transition of the status of the RF signal.

The edge detecting circuit 24 determines that an edge exists if the status of the RF signal, shown in part (e) in FIG.

3, changes from "LAND" to "PIT", from "PIT" to "LAND" from "LAND" to "EDGE" and then to "PIT", or from "PIT" to "EDGE" to "LAND".

For example, the status of the RF signal changes from "PIT" to "EDGE" to "LAND" in the MSCK periods A, B and C shown in FIG. 3. Thus, it is obvious that an edge exists in the MSCK period B.

In the MSCK periods E, F, and G, the status of the RF signal changes from "LAND", "EDGE", and "PIT". Thus, an edge exists in the MSCK period F.

Figure 6:
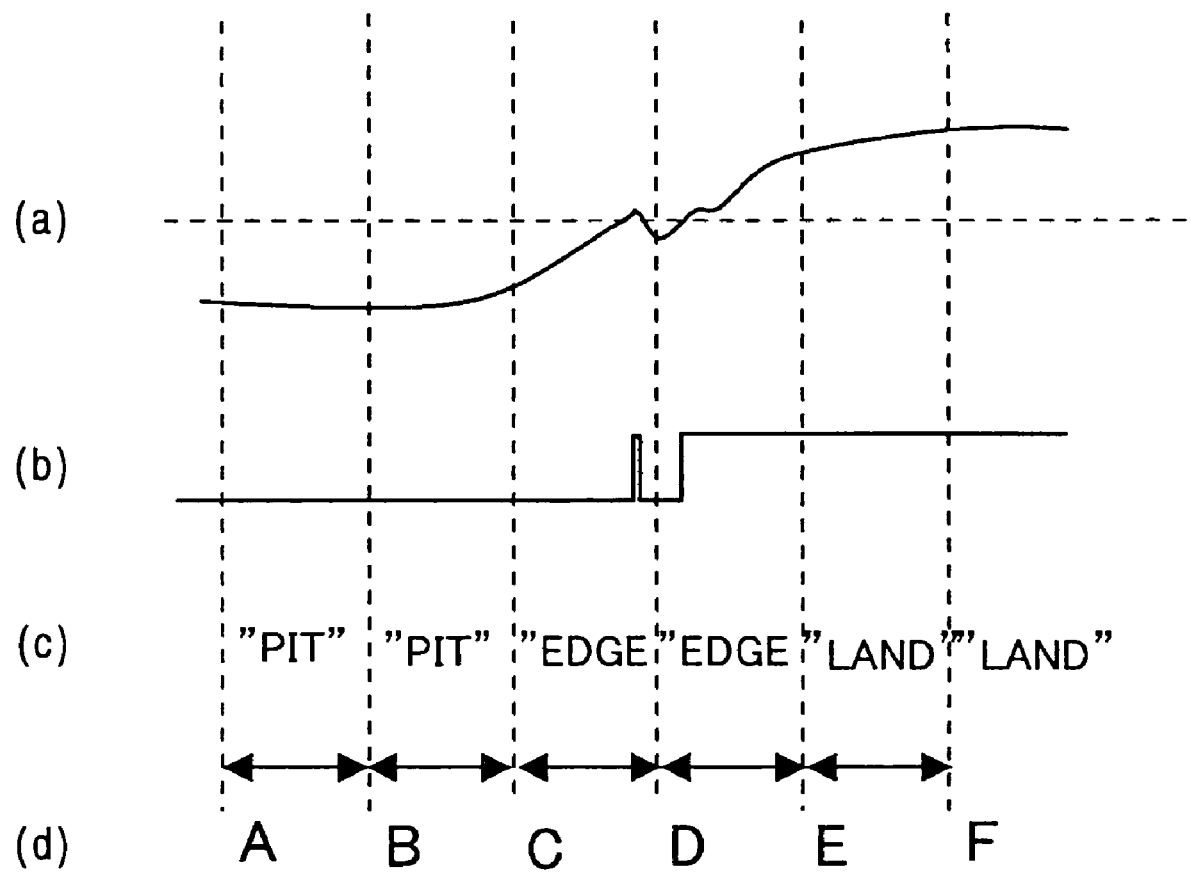
FIG. 6 is a diagram for explaining edge detection in the embodiment in a case where noise exists.

FIG. 6 shows a case where noise is imposed on RF signals. Referring to FIG. 6, when an RF signal carries noise as shown in part (a), binarized RF signal is as shown in part (b), and the status of the RF signal is determined as shown in part (c).

In this case, in the MSCK period B, C, D, and E shown in part (d) in FIG. 6, the status of the RF signal changes from "PIT", "EDGE", "EDGE" and "LAND". The edge detecting circuit 24 is capable of detecting an edge based on change in the status of the RF signal even when noise is imposed.

Next, the counter circuit 25 will be described. In order to measure the pulse lengths of lands and pits, the counter circuit 25 counts the number of "LAND"s or "PIT"s between edges of an RF signal.

Part (h) in FIG. 3 shows a count value of lands. When an edge from a pit from a land is detected by the edge detecting circuit 24, the counter circuit 25 sets the count value of lands to be zero. The counter circuit 25 adds one to the count value each time the status of the RF signal is determined as "LAND".

Thus, as shown in part (h) in FIG. 3, for example, in the MSCK period C, the count value of lands is set to zero as a result of detection of an edge from a pit to a land by the edge detecting circuit 24. In this case, since the status of the RF signal is "LAND" in the MSCK periods C, D, and E, one is added to the count value in each of the periods. Thus, the pulse length of non-edge portion of "LAND"s is measured.

Then, in the MSCK period F, an edge from a land to a pit is detected, whereby the count value of lands is determined.

Although not shown, similar processing is executed to determine the count value of pits.

More specifically, when an edge from a land to a pit is detected, the counter circuit 25 sets the count value of pits to be zero, and adds one each time the status of the RF signal is determined as "PIT". The count value of pits is determined when an edge from a pit to a land is detected.

Next, the fragment-length register circuit 26 will be described.

In the example shown in FIG. 3, the pulse-length data of lands is the sum of land components in the MSCK periods B and F determined as "EDGE" and the MSCK periods C, D, and E determined as "LAND". Thus, the land components of the MSCK periods B and F must be held. For this reason, the land components of edges are held in the fragment-length register circuit 26.

For example, as shown in part (f) in FIG. 3, the total number of "1"s in the RF signal in the MSCK period B, i.e., 9, is held as the length of fragment associated with the leading edge of the land. Also, as shown in part (g) in FIG. 3, the total number of "1"s in the RF signal in the MSCK period F, i.e., 8, is held as the length of fragment associated with the trailing edge of the land.

When the RF signal carries noise and "EDGE" continuously occurs as shown in FIG. 6, the fragment-length register circuit 26 holds the total numbers of "1"s, corresponding to land components, in the RF signals of the two "EDGE"s.

Also, the length of fragment of pits is held similarly to that of lands.

For example, the total number of "0"s in the RF signal in the MSCK period shown in FIG. 3, i.e., 7, is held as the length of fragment associated with the trailing edge of the pit, and the total number of "0"s in the MSCK period F, i.e., 8, is held as the length of fragment associated with the leading edge of the pit.

Note, however, that the length of fragment of a pit can be obtained by subtracting the length of fragment of a land from 16, so that the length of fragment of a pit need not necessarily be held separately from the length of fragment of a land.

Thus, the edge detecting circuit 24 outputs a land/pit edge detection signal, the counter circuit 25 outputs a land/pit count value, and the fragment-length register circuit 26 outputs a land/pit fragment length. These values are supplied to the pulse-length calculating circuit 23.

The pulse-length calculating circuit 23 calculates pulse-length data for lands and pits from the value of the counter circuit 25 and the value of the fragment-length register 26.

More specifically, as shown in part (i) in FIG. 3, pulse-length data for lands is obtained by summing the length of land fragment ("9" in part (f) in FIG. 3), the land count value ("3" in part (h) in FIG. 3), and the land fragment length ("8" in part (g) in FIG. 3).

That is, the pulse length is calculated according to the equation:

(Leading land fragment length)+(Land count value)+
(Trailing land fragment length)=(Pulse length of lands)

In the example shown in FIG. 3, the pulse length is calculated as follows:

$9T/16+3T+8T/16=4T+1T/16$

This result is output as pulse-length data for lands. Measurement is similarly executed for pits.

The pulse-length measuring circuit 2 generates pulse-length data for lands and pits for the binarized RF signal in the manner described above, and outputs the pulse-length data to the frequency control circuit 3.

The pulse-length measuring circuit 2 is capable of operating in nTap Mode.

This is a measure against the non-linearity of oscillation frequency characteristics of VCO, described earlier as a problem of VCO and VCO control circuit.

Now, nTap Mode in this embodiment will be described.

In the digital PLL system in this embodiment, the oscillation frequency of the VCO is controlled so as to coincide with the frequency of RF signals, as described earlier.

Furthermore, as will be described later in relation to the two-terminal VCO control circuit 9, the fine-side control voltage (hereinafter referred to as VCF) of the 16-phase 2-terminal VCO 10 is controlled so as to be VDD/2. Thus, the oscillating frequency of the VCO in relation to VCF ($\Delta f/\Delta V$) is unambiguously determined by the frequency of the RF signal.

Figure 7:
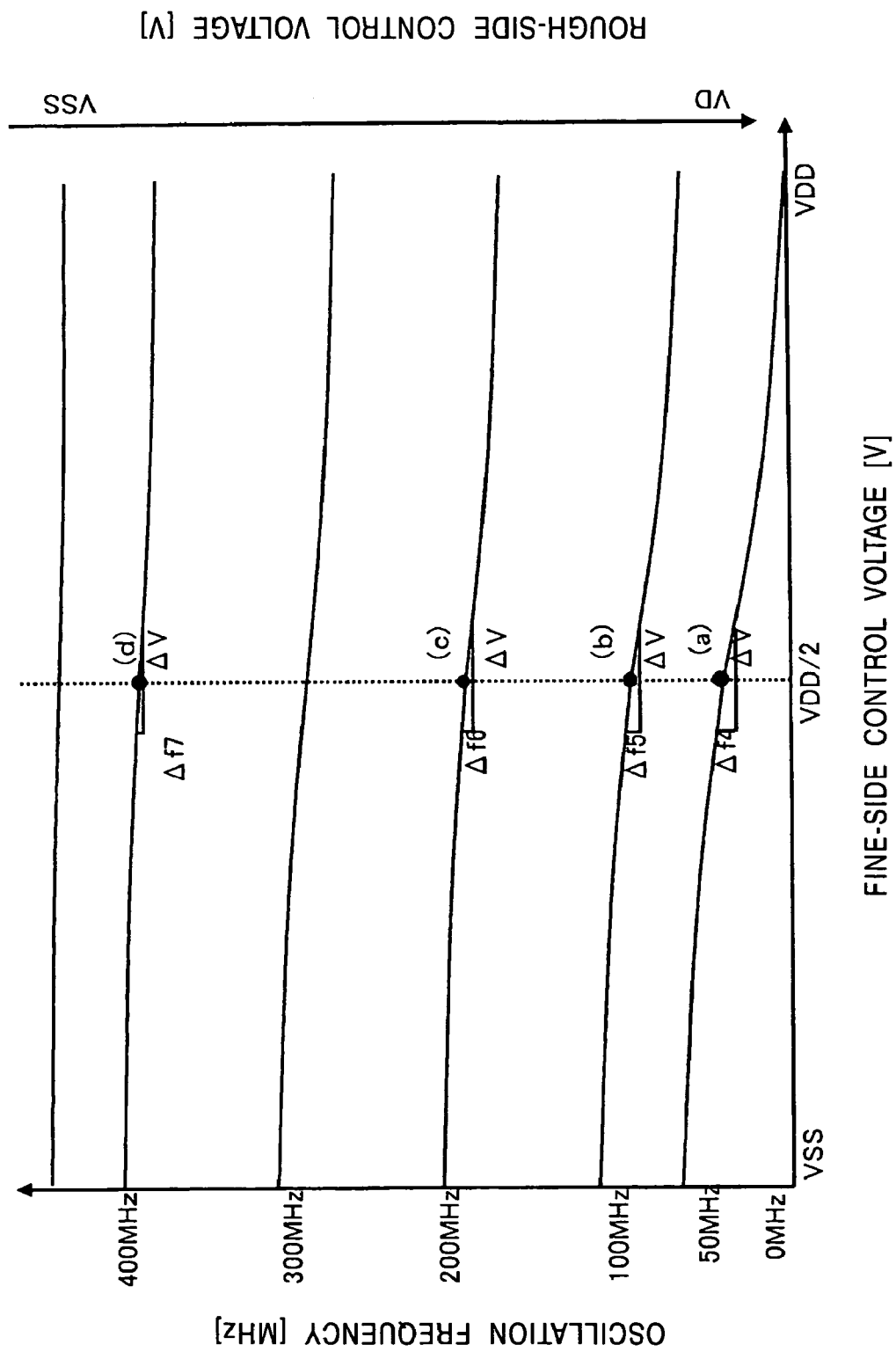
FIG. 7 is a diagram showing characteristics of a 2-terminal VCO in the embodiment.

FIG. 7 shows the frequency characteristics of the VCO used in the digital PLL system according to this embodiment. In FIG. 7, the horizontal axis represents VCF, the left vertical axis represents the oscillation frequency, and the right vertical axis represents the rough-side control voltage (hereinafter referred to as VCR). As shown in FIG. 7, the gradient of the oscillation frequency with VCF at VDD/2 ($\Delta f/\Delta V$) is not constant depending on the value of VCR).

For example, in part (a) in FIG. 7, in which the oscillation frequency of the VCO is 50 MHz, the gradient is Δf4/ΔV. In part (b) in FIG. 7, in which the oscillation frequency of the VCO is 100 MHz, the gradient is Δf5/ΔV. From a comparison of these gradients in parts (a) and (b) in FIG. 7, it is understood that Δf5/ΔV shown in part (b) in FIG. 7 is smaller. It is also understood that gradients in parts (c) and (d) in FIG. 7 are even smaller.

In this VCO, when the frequency of RF signal is high, noise imposed on VCF does not significantly affect playability. On the other hand, when the frequency of RF signal is low, noise imposed on VCF does affect playability. Therefore, effect of noise on playability must be minimized for cases where the frequency is low.

As described earlier, the pulse length of an RF signal is measured by latching the RF signal based on the 16-phase clocks of the 16-phase 2-terminal VCO 10. In nTap Mode, the frequency of VCO is chosen to be twice, four times, eight times, or sixteen times of the frequency of RF signal, and the RF signal is latched using only some of the 16-phase clocks, whereby the pulse length is measured.

According to the method described above, the oscillation frequency of the VCO becomes higher and the gradient Δf/ΔV becomes smaller. Therefore, the effect of noise is suppressed. A detailed description will be given below.

Figure 8A:
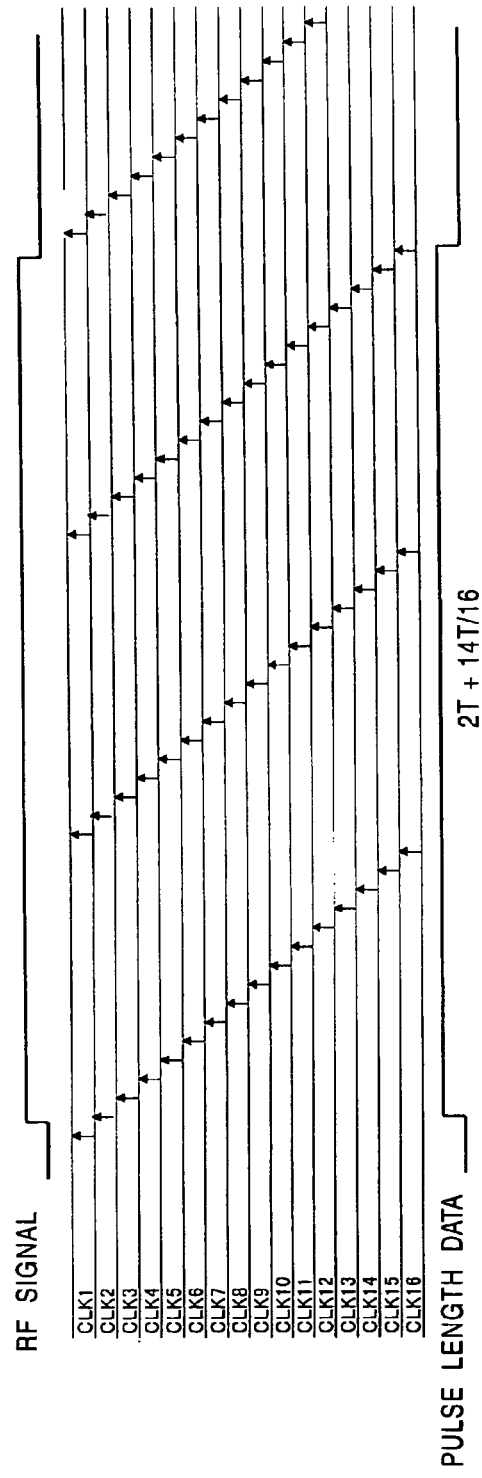
FIGS. 8A and 8B are diagrams for explaining pulse-length measurement in the embodiment.

Now, a description will be given with reference to FIGS. 8A and 8B and 9A and 9B. FIG. 8A shows a result of measurement of pulse length in a case where the frequency of the RF signal is the same as the frequency of the VCO. The RF signals are sampled based on the 16-phase clocks CLK1 to CLK16 to measure the pulse length.

The pulse length in this case is 2T+14T/16.

Figure 8B:
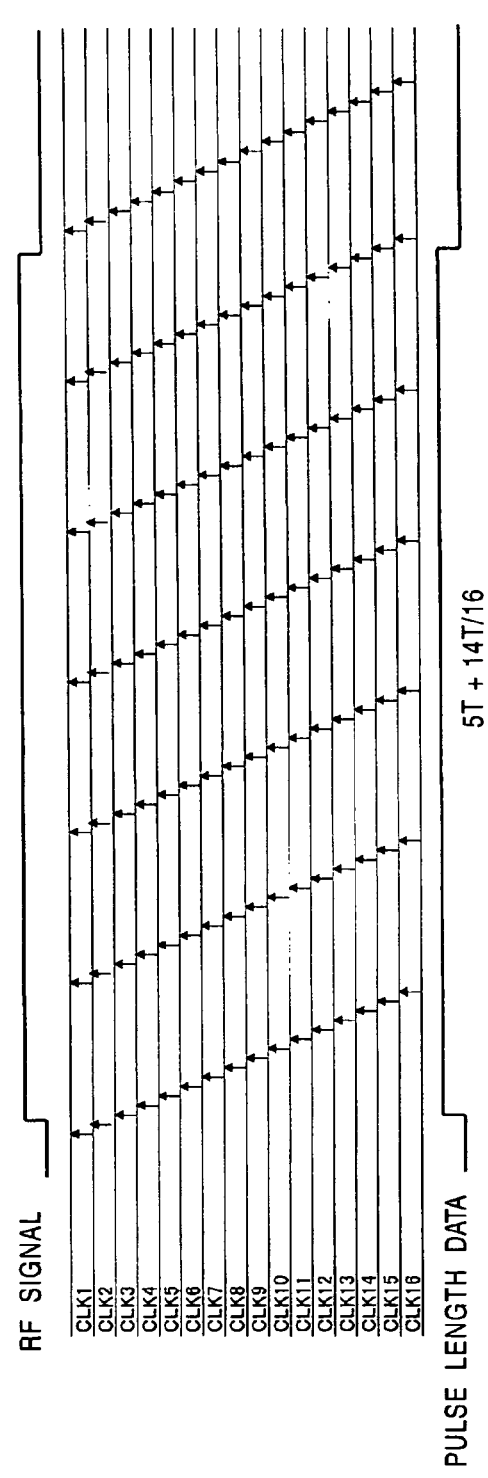

When the RF signal of the same length is measured with the oscillation frequency of the VCO doubled, as shown in FIG. 8B, the pulse length is 5T+12T/16, which is double the pulse length in FIG. 8A.

Figure 9A:
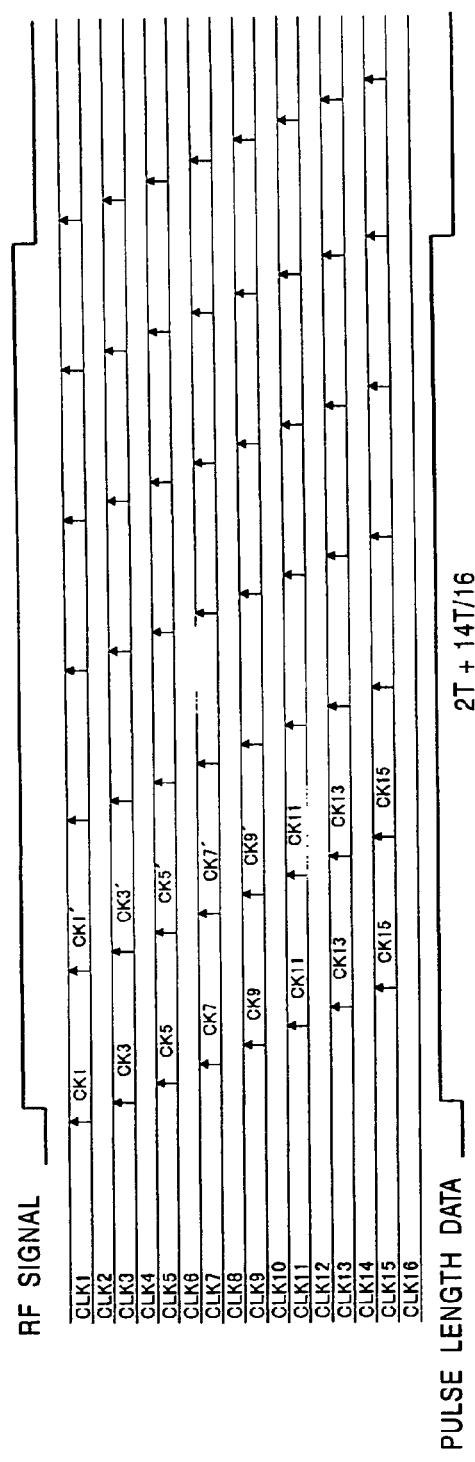
FIGS. 9A and 9B are diagrams for explaining pulse-length measurement in the embodiment.

When the pulse-length is measured using only the even-numbered clocks (CLK1, CLK3, CLK5, . . . , CLK15) among the 16-phase clocks, as shown in FIG. 9A, the pulse length is 2T+14T/16, which is the same pulse length as in FIG. 8A. In this case, a period 1T of the RF signal is 16-sampled at the rises of CK1, CK1', CK3, CK3', . . . , CK15, and CK15' in FIG. 9A. A clock having half the frequency of the frequency of CLK1 is used as MSCK.

As described above, the pulse length of an RF signal can be measured accurately using the method in which the frequency of the VCO is doubled and clocks for measuring the pulse length is decimated so that every other clock is used.

Figure 9B:
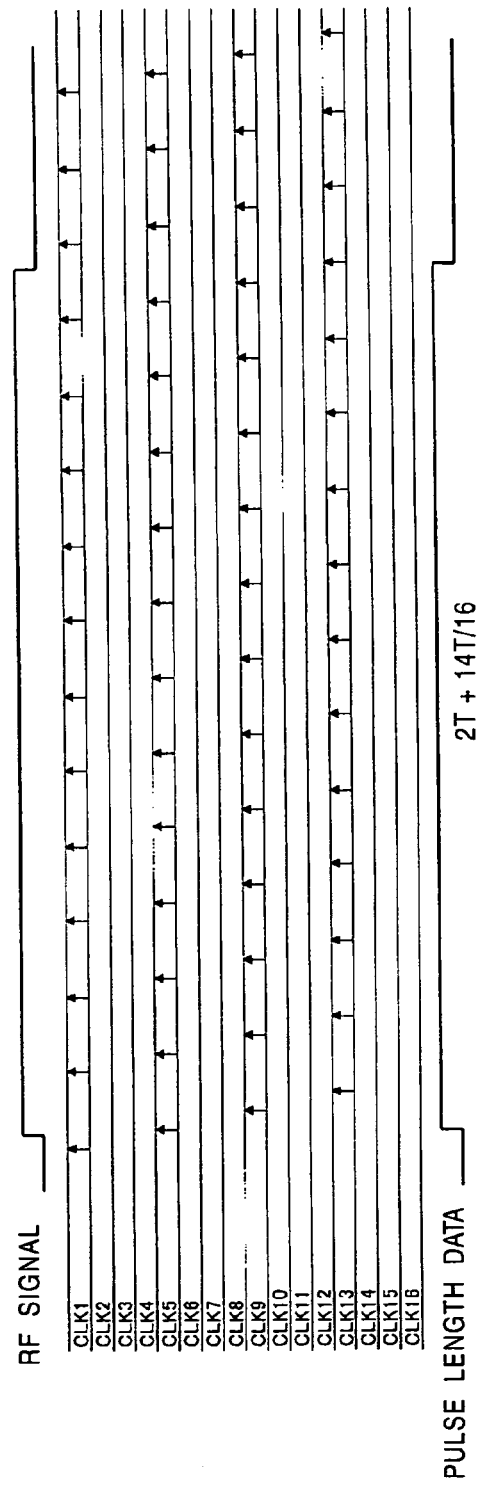

When the VCO frequency is quadrupled as shown in FIG. 9B, only four clocks CLK1, CLK5, CLK9, and CLK13 are used so that the pulse length will be measured accurately. Similarly, only clocks CLK1 and CLK9 are used when the VCO frequency is increased to eight times, and only the clock CLK1 is used when the VCO frequency is increased to sixteen times.

Referring to FIG. 7, when the frequency of RF signal is 50 MHz, the VCO frequency is chosen to be 400 MHz (gradient Δf7/ΔV is small) as shown in part (d) instead of 50 MHz (gradient Δf4/ΔV is large) as shown in part (a), that is, the VCO frequency is increased by eight times. Accordingly, the oscillation frequency relative to the control voltage, i.e., Δf/ΔV, becomes smaller. Therefore, playability is less affected even when noise is imposed on the control voltage.

As shown in FIG. 10A, the 16-phase clocks of the 16-phase 2-terminal VCO 10 are designed so as to have constant phase difference. However, the clocks could have different phase differences due to some reasons as shown in FIG. 10B.

In that case, the pulse length of the RF signal is not measured accurately. However, as described above, only the even-numbered clocks are used when the VCO frequency is doubled, so that deviation in the phase of CLK2 or CLK4 does not affect measurement of the pulse length. When the VCO frequency is increased by sixteen times, only CLK1 is used. Therefore, the pulse length is measured accurately as long as the phase of CLK1 is correct, even if the phases of the other fifteen clocks are deviated.

Now, cases where the phase difference of CLK1 is deviated by 50%, as shown in FIGS. 11A and 11B, will be considered. The oscillation frequency of the VCO is 50 MHz in FIG. 11A and is 100 MHz in FIG. 11B. It is understood from FIGS. 11A and 11B that the absolute deviation in phase is smaller in the case where the frequency is higher (FIG. 11B).

That is, in nTap Mode, even if clocks have relative phase errors, the effect of the errors can be suppressed, so that RF signals can be read more accurately.

3. Frequency Control Circuit 3-1. Frequency Deviation

Next, the frequency control circuit 3 will be described. As described earlier, the frequency control circuit 3 detects a frequency deviation from pulse-length data supplied from the pulse-length measuring circuit 2, and corrects the pulse-length data accordingly.

First, frequency deviation will be described.

Figure 12A:
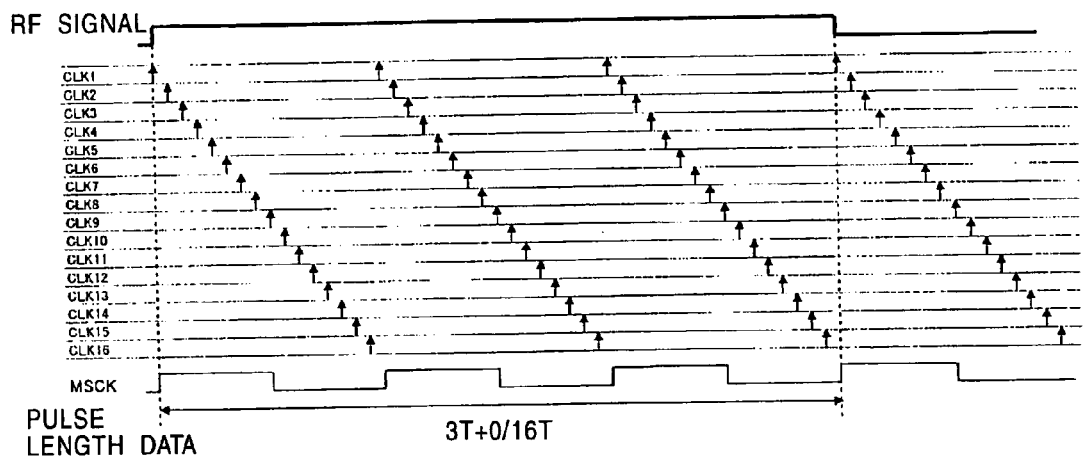
FIGS. 12A to 12C are diagrams for explaining a frequency deviation between a frequency of an RF signal and a frequency of a VCO in the embodiment.
Figure 12B:
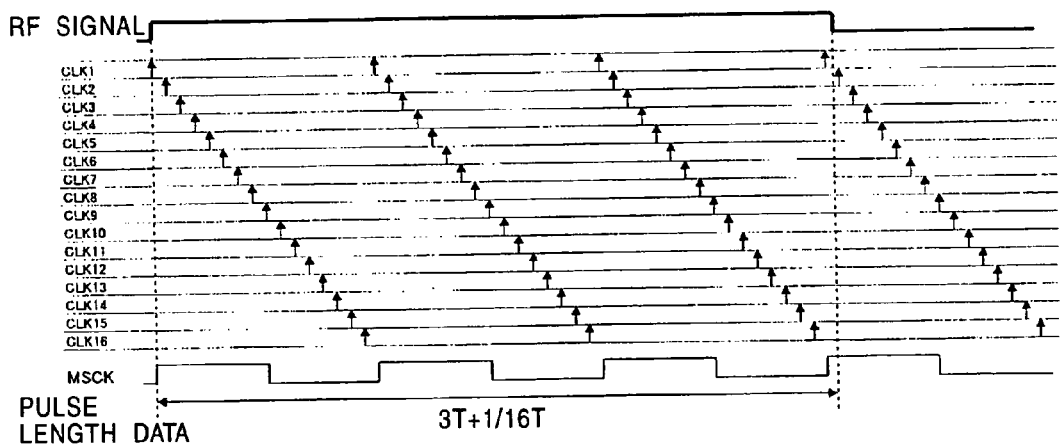
Figure 12C:
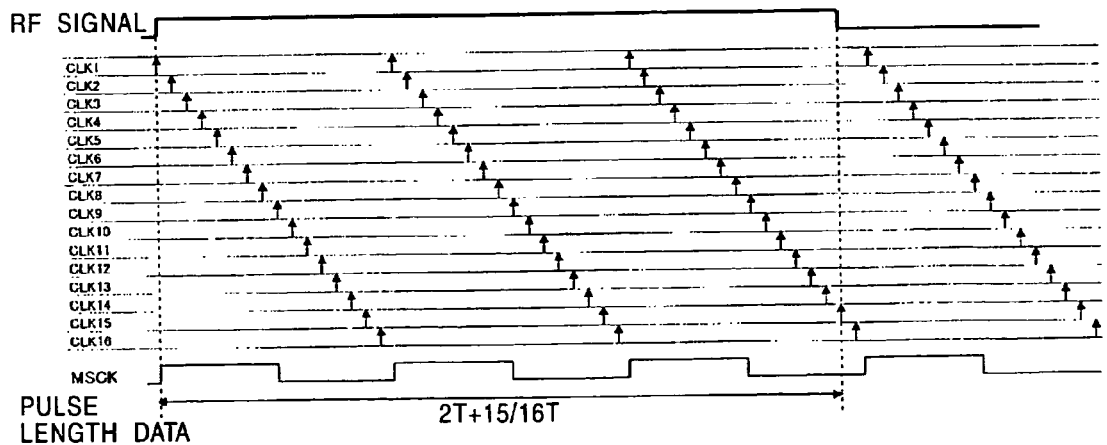

FIGS. 12A to 12C show change in pulse-length data that occurs in a case where the frequency of RF signal differs from the oscillation frequency of the VCO.

With respect to 3T of an ideal RF signal, the VCO frequency coincides in FIG. 12A, the VCO is 2% faster in FIG. 12B, and the VCO is 2% slower in FIG. 12C.

When the VCO frequency coincides with the RF frequency as in FIG. 12A, the pulse length is measured accurately as 3T (3T+0/16T).

When the VCO frequency is faster than the RF frequency as in FIG. 12B, the pulse length is measured to be longer than 3T (3T+1/16T).

On the other hand, when the VCO frequency is slower than the RF frequency as in FIG. 12C, the pulse length is measured to be shorter than 3T (2T+15/16T).

Thus, if pulse lengths tend to be measured longer, it is understood that the VCO frequency is higher than the RF frequency. On the other hand, if pulse lengths tend to be measured shorter, it is understood that the VCO frequency is lower than the RF signal frequency.

3-2. Algorithm for Correcting Frequency Deviation 3-2-1. Method of Detecting Frequency Deviation of Input Pulse Length Data Now, a method of detecting the amount and direction of frequency deviation in individual pulse-length data, that is, to what extent the VCO frequency is slower or faster than the RF frequency, will be described.

Figure 13A:
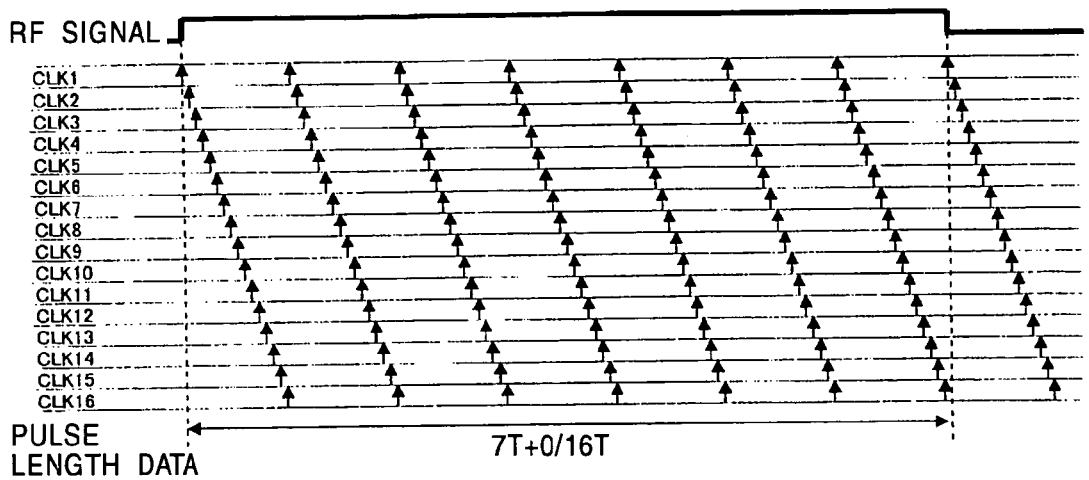
FIGS. 13A to 13C are diagrams for explaining pulse-length data in a case where a frequency deviation has occurred between a frequency of an RF signal and a frequency of a VCO in the embodiment.
Figure 13B:
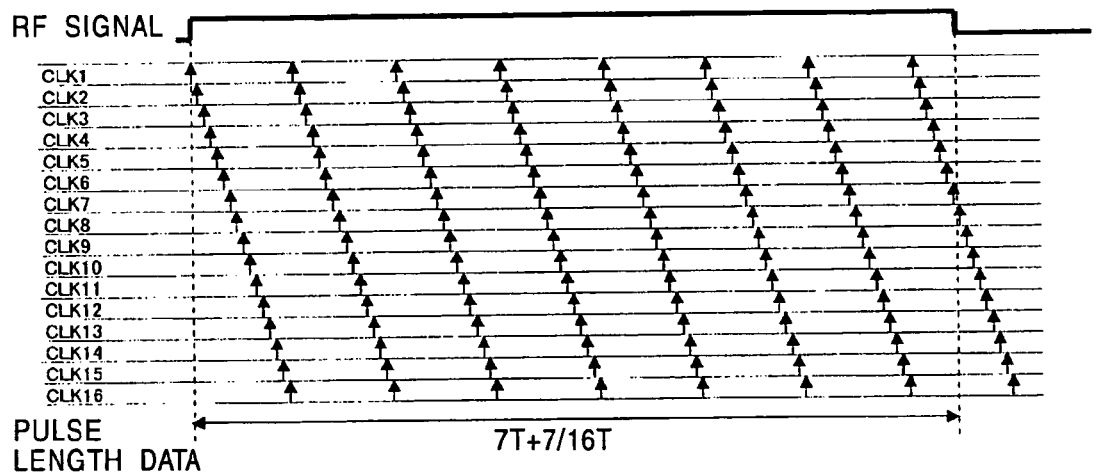
Figure 13C:
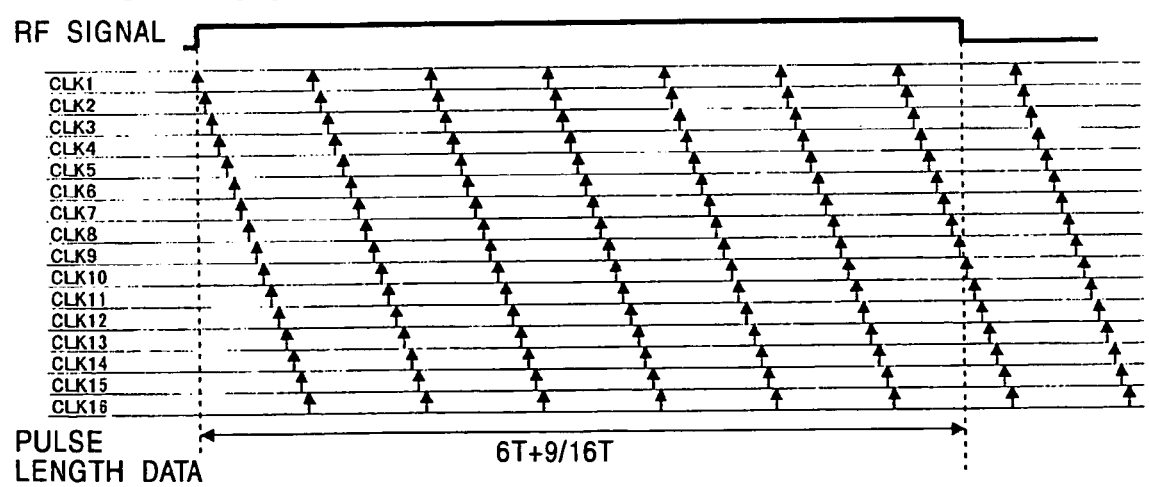

To describe a method of detecting frequency deviation, FIGS. 13A to 13C show an example of pulse-length data of an RF signal.

FIG. 13A shows a case where the VCO frequency coincides with 7T of RF signal.

As shown in FIG. 13A, in an ideal state, that is, when the VCO frequency exactly coincides with the RF frequency, all pulse length are represented by integers (7T+0/16T).

However, if the VCO frequency is faster or slower with respect to the RF frequency, pulse-length data has a fragment component. In a digital PLL, information that represents the polarity of frequency deviation between RF signal and VCO does not exist. Thus, it is necessary to determine the direction of deviation from input pulse length in some way. In the algorithm used in this embodiment, a value of overall frequency deviation, calculated as will be described in a subsequent section "3-3-2. Method of Detecting Overall Frequency Deviation" is used.

FIG. 13B shows a case where the VCO frequency is 6% faster than the RF frequency. In this case, it is not possible to simply determine whether the pulse length of (7T+7/16T) in this case is a result of measuring 8T as shorter due to slow VCO frequency or a result of measuring 7T longer due to fast VCO frequency.

However, if the information regarding the overall frequency deviation that the VCO frequency is 5% faster, it is possible to determine that the pulse length is actually 7T but is measured to be longer as (7T+7/16T). The frequency deviation of the pulse-length data can be determined as $(7T+7/16T)/7T=7.4375/7 \cong 6.3\%$.

FIG. 13C shows a case where the VCO frequency is 6% slower. The pulse-length is (6T+9/16), and it is not possible to determine the direction of deviation by pulse-length data alone. If information regarding the overall frequency deviation that the VCO frequency is 5% slower is available, it is possible to determine that the pulse length is actually 7T but is measured shorter a (6T+9/16T). The frequency deviation of the pulse length data can be calculated as $(6T+9/16T)/7T=6.5625/7 \cong -6.2\%$.

As described above, by using the pulse length and the value of overall frequency deviation, a frequency deviation of input pulse-length data can be determined.

3-2-2. Method of Detecting Overall Frequency Deviation

By calculating frequency deviations of individual input pulse-length data, the overall frequency deviation can be calculated. However, it is possible that frequency deviations are detected for individual input pulse lengths due to jitter or sudden error even though a frequency deviation has not actually occurred. In order to avoid this situation, by filtering frequency deviations of individual input pulse lengths using an IIR digital filter, noise component such as jitter is removed, so that the value and direction of the overall frequency deviation can be calculated. Since the time constant of the IIR digital filter can be controlled from the outside, susceptibility to noise can be improved by increasing the time constant, or the speed of recognition of frequency deviation can be improved by decreasing the time constant.

3-2-2. Method of Correcting Frequency Deviation

The amount of correcting frequency deviation can be determined from input pulse-length data and the overall frequency deviation and direction.

Figure 14A:
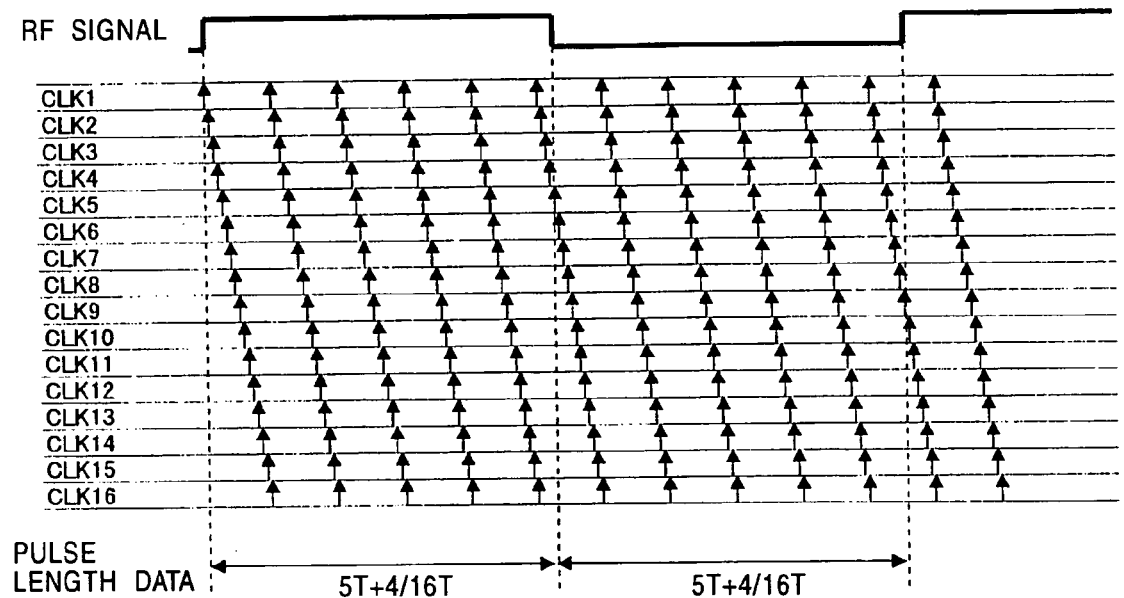
FIGS. 14A and 14B are diagrams for explaining effect of a frequency deviation on a pulse length.
Figure 14B:
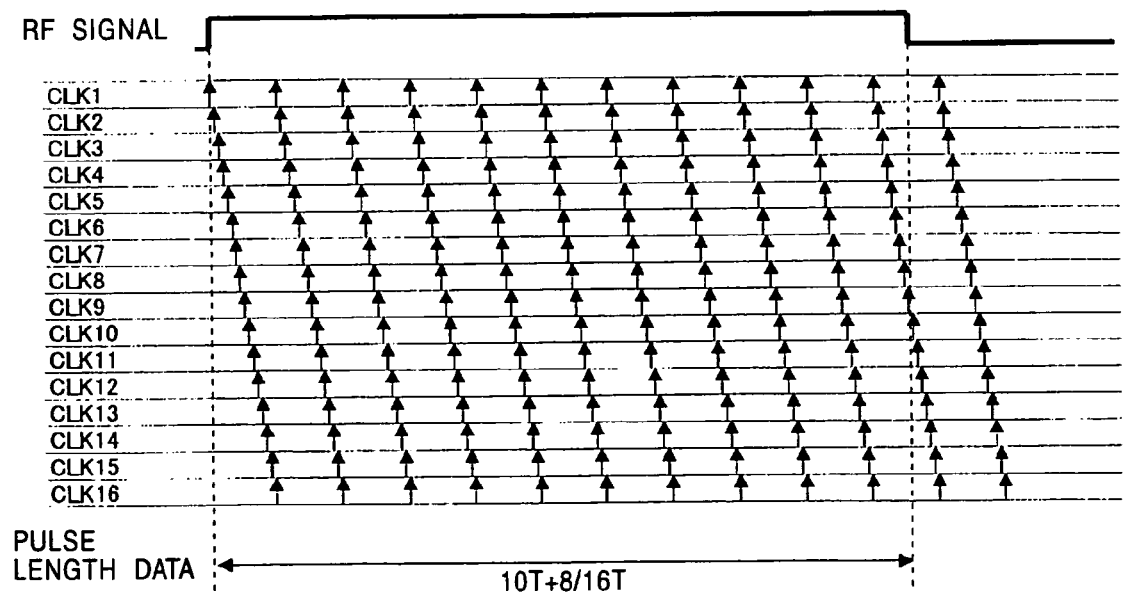

If the VCO frequency is calculated as 5% faster, an RF signal of 5T is measured as 5T+4T/16 as shown in FIG. 14A, and an RF signal of 10T is measured as 10T+8T/16 as shown in FIG. 14B.

However, pulse lengths that are actually measured are 5T+3T/16 and 5T+5T/16 due to noise such as jitter.

The frequency control circuit 3 is aimed at correcting only a frequency deviation component of input pulse-length data, so that it disregards effect of disturbance such as jitter. That is, the amount of correction is a value that can be calculated from the overall frequency deviation. For example, if it is detected that the VCO frequency is 5% faster with respect to the RF frequency, when the pulse length is 5T, the amount of correction is −4T/16, and when the pulse length is 10T, the amount of correction is −8T/16.

4. Digital Asymmetry Correcting Circuit 4-1. Asymmetry Deviation

Next, the digital asymmetry correcting circuit 4 will be described. As described earlier, the digital asymmetry correcting circuit 4 detects an asymmetry deviation from pulse-length data, and corrects the pulse-length data.

First, asymmetry deviation will be described.

FIG. 15 shows an example mechanism of occurrence of asymmetry deviation due to a defect of signals on an optical disk.

Figure 80:
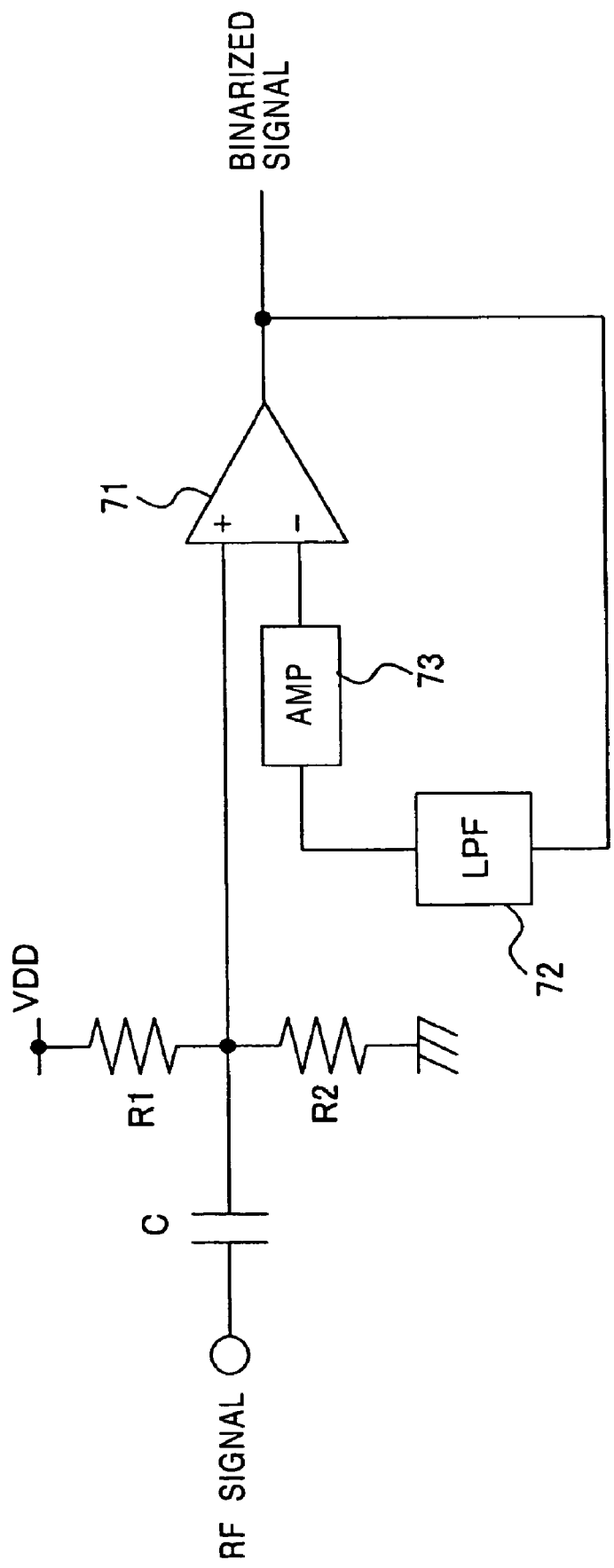
FIG. 80 is a diagram showing an analog circuit for correcting asymmetry.

As described in relation to the circuit shown in FIG. 80, the average of RF signals on an optical disc can be used as a slice level for the RF signals. This is because RF signals are generated with a balance between positive side and negative side of amplitude such that the DC component (average value) of the RF signals will be the center of the RF signals.

However, since RF signals are generated from reflection of light from a signal surface of the disc, if a defect or dirt exists on the surface of the disc, in some cases, RF signals are temporarily offset as shown in FIG. 15. However, the slice level has a sufficiently long time constant relative to the frequency of the RF signals so as not to vary due to a short-term imbalance between positive and negative sides of normal RF signals. Therefore, if the occurrence of offset due to a defect is sufficiently shorter than the time constant for generating a slice level, the slice level fails to follow the center level of the RF signals.

This is how asymmetry deviation occurs. In the period where asymmetry deviation has occurred, it is not possible to binarize RF signals accurately. This results in degradation of playability, and unstable PLL operation. The mechanism of this situation will be described with reference to FIG. 16.

Figure 16:
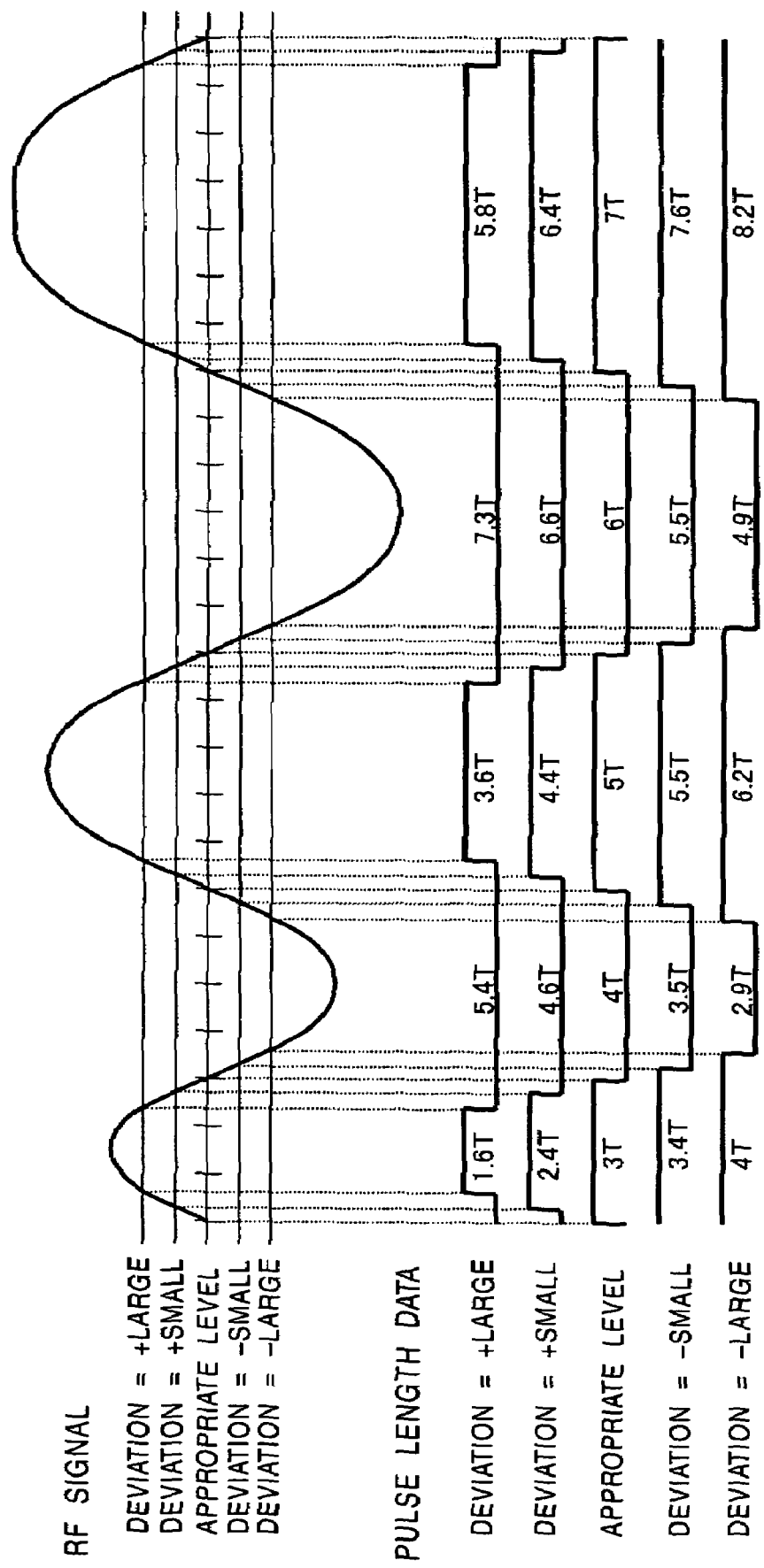
FIG. 16 is a diagram for explaining effect of an asymmetry deviation on binarization of an RF signal.

As shown in FIG. 16, RF signals of an optical disc are analog signals having some gradients, and the amplitude thereof varies depending on pulse-length data. Therefore, it is ideal that the RF signals are binarized while maintaining the slice level as close to the center level as possible.

However, when asymmetry deviation has occurred and the slice level has been deviated as described earlier, either the positive side or the negative side of pulse-length data becomes larger than the other.

For example, referring to FIG. 16, when the slice level has been deviated to the positive side, as indicated by "deviation=+small" or "deviation=+large", the pulse-length data has shorter positive signals and longer negative signals compared with actual pulse-length data.

On the other hand, when the slice level has been deviated to the negative side as indicated by "deviation=−small" or "deviation=−large", the pulse-length data has shorter negative signals and longer positive signals compared with actual pulse-length data.

To put this situation conversely, asymmetry deviation occurs when pulse-length data has alternate long and short error components.

4-2. Algorithm for Correcting Digital Asymmetry 4-2-1. Method of Detecting Asymmetry Deviation Now, a method of detecting the amount of asymmetry deviation, and the direction thereof, i.e., whether the slice level is deviated to the positive side or the negative side, will be described.

Figure 17:
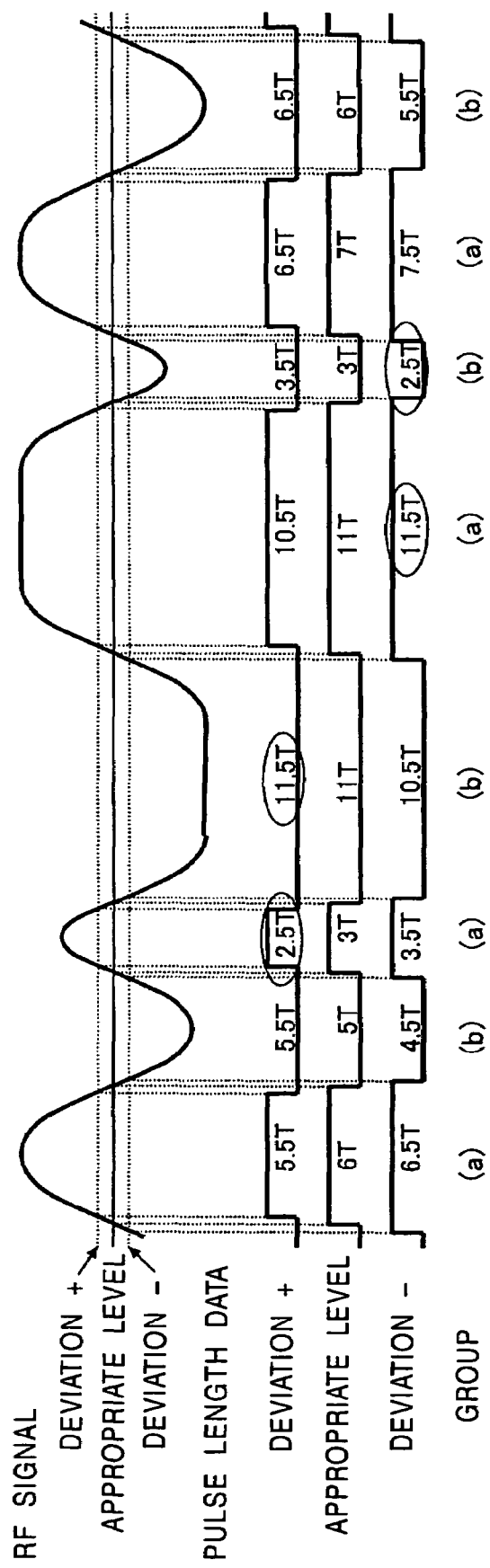
FIG. 17 is a diagram for explaining an algorithm for detecting an asymmetry deviation in the embodiment.

FIG. 17 shows an example of RF signals, slice level, and pulse-length data for describing a method of detecting an asymmetry deviation.

In an ideal RF signal, if the slice level is at an appropriate level, i.e., at the center level, pulse-length data is represented accurately by integer values.

However, if the slice level is deviated to the positive side or the negative side, pulse-length data has a fragment component, and the direction of increase or decrease of the fragment component with respect to actual pulse-length data is determined by the direction of deviation of slice level and the polarity of RF signals. That is, when the slice level is deviated to the positive side, the pulse-length data on the positive side becomes shorter and the pulse-length data on the negative side becomes longer. On the other hand, when the slice level is deviated to the negative side, the pulse-length data on the positive side becomes longer and the pulse-length data on the negative side becomes shorter.

Therefore, it is necessary to determine the polarity of asymmetry deviation in some way from input pulse-length data. The algorithm described below is based on the fact that the format of RF signals on CD or DVD are such that pulse-length data is represented only by integer values of 3T to 11T and 14T.

In the example shown in FIG. 17, in pulse-length data in which the slice level of asymmetry is deviated to the positive side, the fragment component is exactly 0.5T, i.e., the half of a unit pulse-length data. In this case, the first 5.5T and the second 5.5T can be simply estimated that one is 5T and the other is 6T with deviation amounts of 0.5T. However, it is not possible to determine which of the first and second is to be corrected to 5T and which to 6T.

However, since the third pulse-length data is 2.5T and a component of 2T is not supposed to exist in RF signals of a CD, it is possible to determine that the pulse-length is actually 3T but is measured to be shorter due to an asymmetry deviation. Similarly, the fourth pulse-length data is 11.5T, and since a component of 12T is not supposed to exist in RF signals of a CD, it is possible to determine that the pulse length is actually 11T but is measured to be longer.

Now, pulse-length data will be considered as alternately belonging to Group A and Group B as shown in FIG. 17. Then, each of the Group A and Group B can be considered as a set of pulse-length data of the positive or negative polarity.

Now, the pulse-length data in which asymmetry deviation has occurred as shown will be considered in this context.

When the deviation is positive, since the third pulse-length data is 2.5T, it is possible to determine that asymmetry deviation has occurred in a direction that data of Group A becomes smaller.

When the deviation is negative, it is not possible to determine the polarity of asymmetry deviation even in view of the third pulse-length data. However, since the fifth pulse-length data is 11.5T, it is possible to determine that asymmetry deviation has occurred in a direction that data of Group A becomes larger.

In this manner, pulse-length data not longer than 3T or not shorter than 11T is detected to find the direction of asymmetry deviation.

4-2-2. Conditions for Starting Asymmetry Correction

When an asymmetry deviation has been detected, asymmetry correction can be started at that point in time.

However, when handling RF signals, it is possible that an error similar to asymmetry deviation accidentally occurs due to jitter or sudden error even though asymmetry deviation has not occurred. That is, it is possible that positive and negative fragment components alternately occur by accident, and this is detected incorrectly as asymmetry deviation.

In order to avoid this situation, a lower limit is set for the number of repetitions of inversion of polarity of fragment components, and asymmetry deviation is detected when invention occurs a predetermined number of times or more.

If jitter is imposed constantly on RF signals, even if a large number is chosen as the lower limit, incorrect recognition occurs at a probability. By adding a condition that the fragment component is not smaller than a predetermined value, the probability of incorrect correction due to a jitter at a small level that often occurs can be reduced.

From what has been described above, it is understood that asymmetry deviation can be detected accurately using both the number of alternate occurrence of positive and negative fragments and a predetermined value of fragment component as conditions for starting asymmetry correction.

4-2-3. Detection of Amount of Asymmetry Deviation and Determination of Correcting Amount The digital asymmetry correcting circuit 4 determines the amount of correction based on asymmetry deviation that has been detected so that an appropriate amount of correction will be applied.

Figure 18:
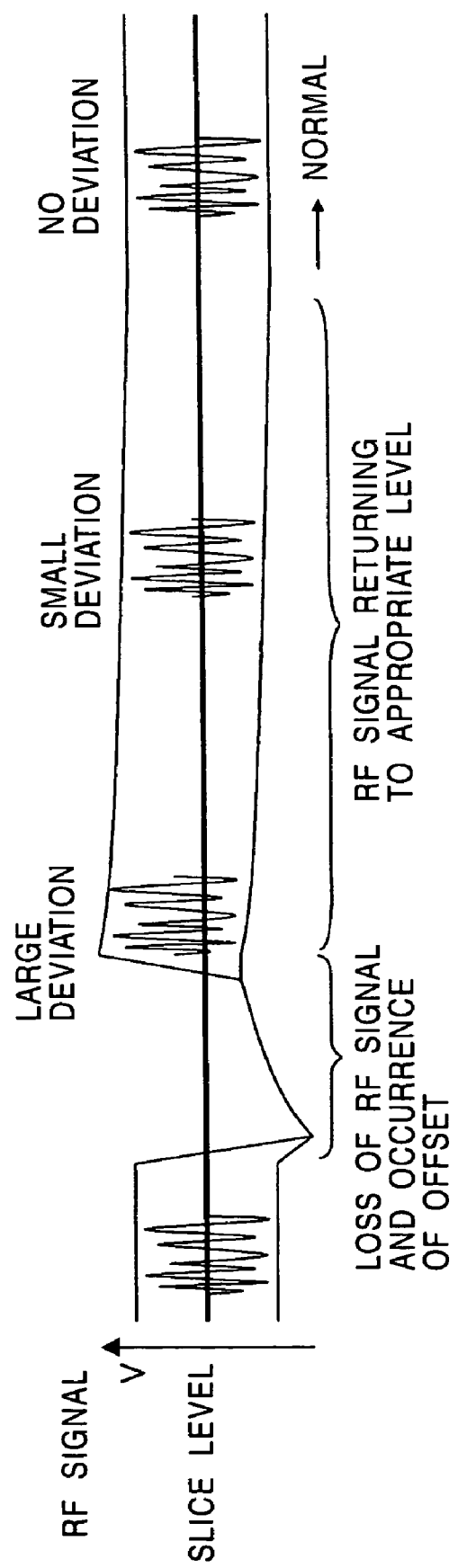
FIG. 18 is a diagram for explaining how an asymmetry deviation changes as time elapses.

FIG. 18 shows a specific example of process of occurrence of asymmetry deviation due to a defect. This shows change in RF signals in a case where a defect has occurred in RF signals due to dirt on an optical disk.

In this case, loss of RF signal and offset of RF signal occur due to a defect, and an RF signal occurs again at the end of the defect.

Then, the asymmetry deviation is largest immediately after the occurrence of RF signal, and the asymmetry deviation becomes smaller as time elapses. In order to correct the signal properly, the amount of correction must be change in accordance with the change in asymmetry deviation. That is, the amount of deviation detected is fed back to pulse-length data as needed, so that the amount of asymmetry deviation, which changes in time, is corrected properly.

The amount of correction is determined by a very simple algorithm.

As described with reference to FIG. 17, the tendency of the effect of asymmetry deviation on fragment component of pulse-length data is determined unambiguously by the polarity of RF signal and the polarity of asymmetry deviation. That is, the amount of asymmetry deviation can be calculated by accumulating the fragment components of pulse-length data while changing the polarity alternately.

When accumulating fragment components, if the number of accumulations is small, it is likely that sudden error irrelevant to asymmetry deviation, such as jitter, is added. If the number of accumulations is too large, however, tracking is not possible when asymmetry deviation changes rapidly, so that it is not possible to feed back appropriate amount of correction.

In an actual system, the number of accumulations is variable, and can be changed by firmware in accordance with the configuration of hardware system. Thus, a number of times of accumulation that is optimal for the system can be selected.

4-2-4. Conditions of Ending Asymmetry Correction

After asymmetry correction is started, execution of correction is stopped when one of several conditions is satisfied.

As a first condition, a lower limit is set for the amount of correction, and the correction is stopped when the amount of correction is smaller than the lower limit. This is because asymmetry correction is not needed when the amount of deviation is not larger than a certain amount. The lower limit can be chosen as desired.

As a second condition, correction is stopped when pulse-length data that is not in a specific range occurs. When an input signal has a value that is far from a predefined format, it is likely that the digital asymmetry correcting circuit 4 is not allowed to detect the amount of deviation accurately. By the second condition, the digital asymmetry correcting circuit 4 is prevented from detecting and correcting asymmetry deviation incorrectly.

5. Clock Phase Control and Run-Length Generating Circuit

5-1. Overview of Circuit

Now, the clock phase control and run-length generating (phase control and data extraction) circuit 5 will be described.

The phase control and data extraction circuit 5 generates a virtual channel clock, counts pulse-length data based on the virtual channel clock to determine a value of run-length data, and extracts a phase error.

First, a conventional channel clock will be described briefly.

An RF signal that is read from an optical disk irradiated with laser beams by an optical pickup has temporal variation.

Figure 19:
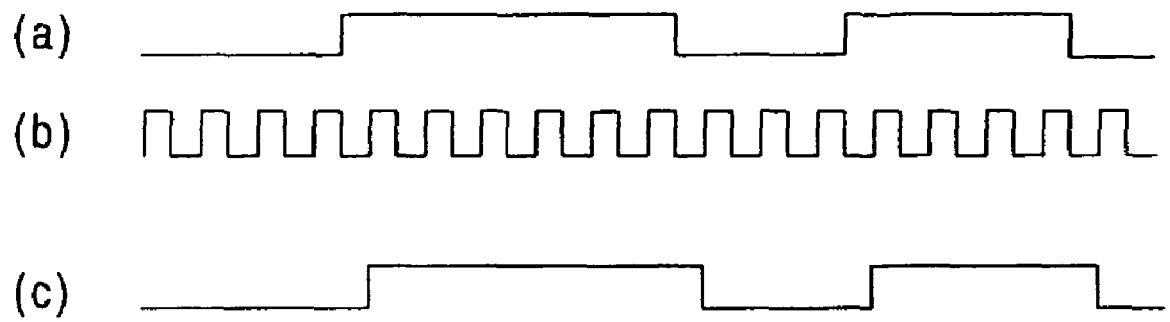
FIG. 19 is a diagram for explaining an RF signal and a conventional channel clock.

In order to accurately read the RF signal having variation, a channel clock synchronized with the RF signal as shown in part (b) in FIG. 19 is needed. The channel clock is generated using a digital PLL. In FIG. 19, part (c) shows the result of capturing binarized RF signals shown in part (a) based on the channel clock.

Figure 20:
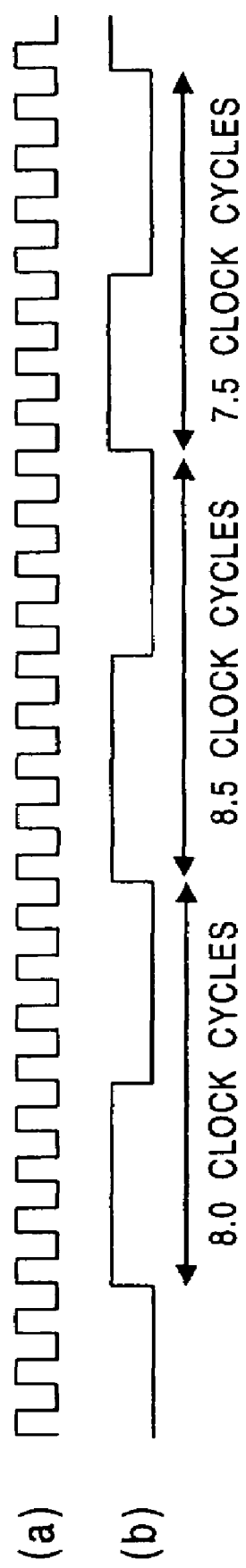
FIG. 20 is a diagram for explaining generation of a channel clock by a conventional PLL.

Conventionally, to generate a channel clock, a high-frequency clock (Hif) that is eight times faster than the channel clock is used, as shown in part (a) in FIG. 20. In order to match the phases and frequencies of the RF signal and the channel clock, the high-frequency clock (Hif) is divided by 7.5, 8.0, and 8.5 using reverse edges of the high-frequency clock, the phase of the channel clock is advanced or delayed as shown in part (b) in FIG. 20. The RF signal is sampled at rises of the channel clock generated as described above, as shown in part (c) in FIG. 19, thereby measuring the run length from the RF signal.

In contrast, according to this embodiment, instead of generating a clock using a digital PLL and sampling the RF signal based on the clock to generate run-length data, the phase relationship of the edge of the RF signal and the channel clock is represented by numeric values, and run-length data is generated from pulse-length data of the RF signal based on the numeric values. The algorithm used in this embodiment will be described below.

5-2. Scheme of Virtual Channel Clock and Generation of Run-Length Data

As described above, pulse-length data of land/pit measured by the pulse-length measuring circuit 2 is represented by an integer part of pulse length and a fragment part of pulse length. For example, when the pulse-length data is 3T+2T/16 (=3.125T), the integer part of the pulse length is 3T and the fragment part of the pulse length is 2T/16.

Figure 21:
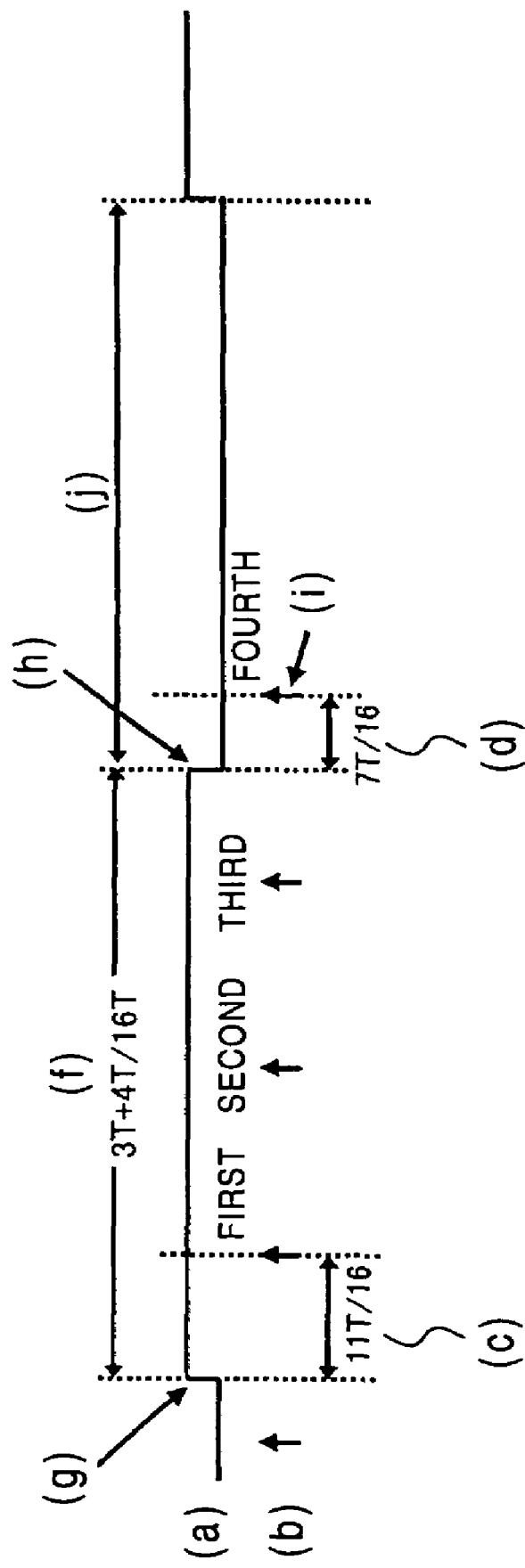
FIG. 21 is a diagram for explaining a virtual channel clock in the embodiment.

As will be described later in more detail, the phase difference between an edge of the RF signal and the virtual channel clock is calculated. The virtual channel clock is not an actual clock signal. Referring to FIG. 21, part (a) shows binarized RF signal, and part (b) shows the virtual channel clock. In part (c), the edge of the RF signal to the rise of the channel clock corresponds to the phase difference of the virtual channel clock represented by a value of 11T/16.

The run-length data is generated by calculating the number of rises of the virtual channel clock in the pulse-length data of lands, shown in part (f) in FIG. 21. In FIG. 21, three rises of the virtual channel clock is included in the pulse-length data of lands, so that the run length is determined as 3T.

5-3. Algorithm for Determining Run-Length Data

Now, a specific operation of the phase control and data extraction circuit 5 for generating run-length data from pulse-length data will be described.

A method of generating run-length data will be described in the context of a case where pulse-length data is 3T+4T/16 as shown in part (f) in FIG. 21.

The first rise of the virtual channel clock shown in part (b) in FIG. 21 is delayed by 11T/16 from an edge A shown in part (g) in FIG. 21. The second rise is delayed by 1T++11T/16, the third rise is delayed by 2T+11T/16, and the fourth rise is delayed by 3T+11T/16.

Since the pulse-length data shown in part (f) in FIG. 21 is 3T+4T/16, the pulse length is longer than 2T+11T/16, i.e., the third rise of the virtual channel clock, and is shorter than 3T+11T/16, i.e., the fourth rise of the virtual channel clock.

That is, three rises of the virtual channel clock are included between the edge of the RF signal and the next edge of the RF signal, so that the run length of the pulse-length data is determined as 3T.

Next, a method of generating run-length data in a case where the fragment part of pulse-length data and the virtual channel clock have the same phase difference will be described.

Figure 22:
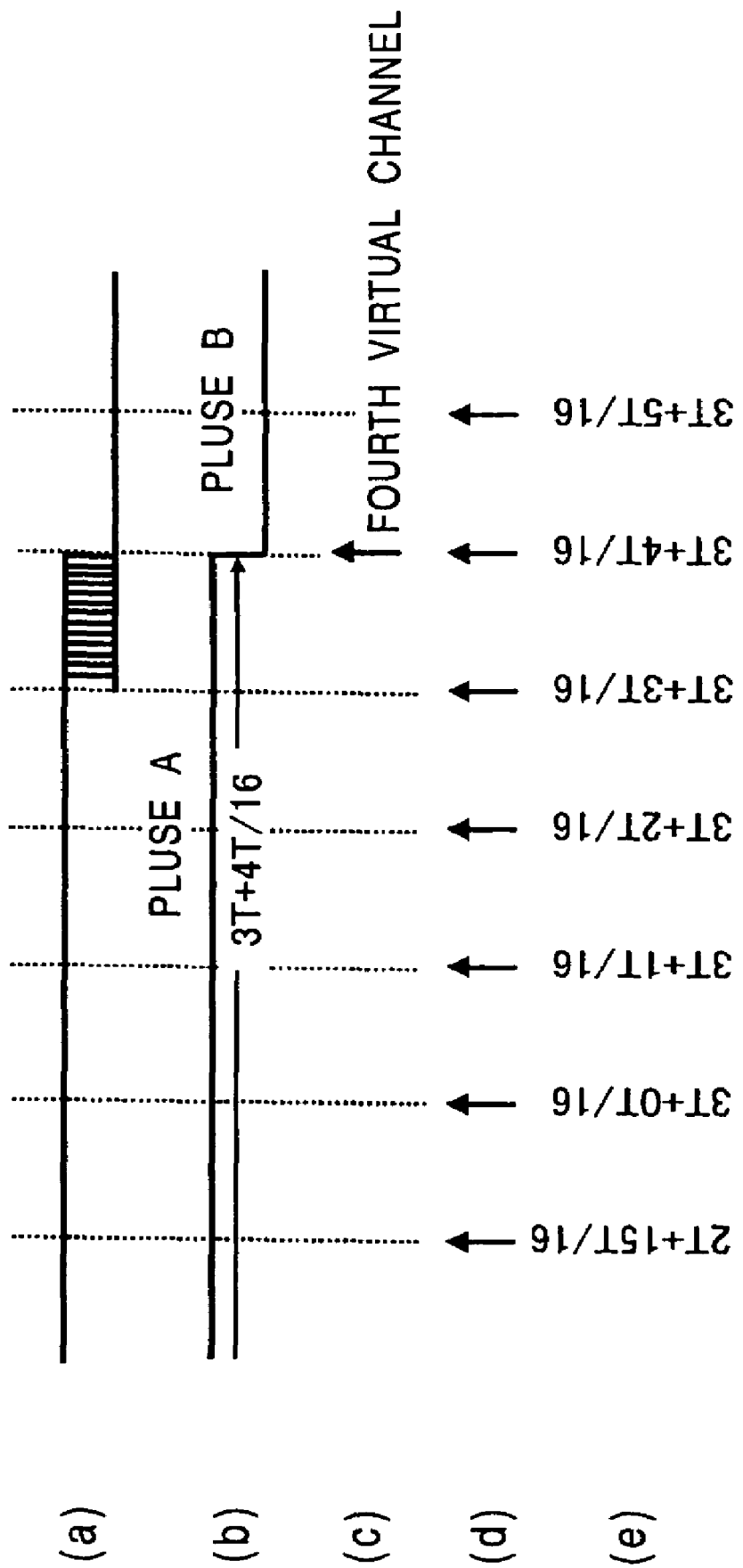
FIG. 22 is a diagram for explaining rising positions of the virtual channel clock in the embodiment.

FIG. 22 shows a case where pulse-length data is 3T+4T/16, and the virtual channel clock is 4T/16. Referring to FIG. 22, the edge of pulse-length data in part (b) corresponds to the fourth rise of the virtual channel clock, so that it is not possible to determine whether the length of the pulse A is 3T or 4T. This is because binarized RF signal is compared with the virtual channel clock, and the problem can be avoided by comparing the edge of binarized RF signal prior to sampling with the virtual channel clock.

Referring to FIG. 22, the signal prior to sampling of the pulse-length data shown in part (b), is a binarized RF signal having edges as shown in part (a), since the RF signal is not synchronized with the virtual channel clock. The edges of the binarized RF signals shown in part (a) are shorter than the rise of the virtual channel clock. Therefore, the length of pulse A is determined as shorter than the virtual channel clock corresponding to the edge of the pulse A.

5-4. Algorithm for Generating Virtual Channel Clock

An algorithm for generating a virtual channel clock will be described with reference to FIG. 21. Referring to FIG. 21, in order to obtain run-length data from next pulse-length data in part (j), the phase difference between the edge B shown in part (h) and the next virtual channel clock shown in part (d) must be obtained.

The virtual channel clock used for obtaining run-length data of the current pulse-length data in part (f) is delayed by 11T/16 with respect to the edge shown in part (g). Since the current pulse-length data is 3T+4T/16, the edge B is delayed by 4T/16 with respect to the current virtual channel clock. That is, the phase difference between the edge B and the next virtual channel clock in part (i) is 11T/16−4T/16=7T/16.

5-5. Algorithm for Controlling Phase of Virtual Channel Clock

Figure 23:
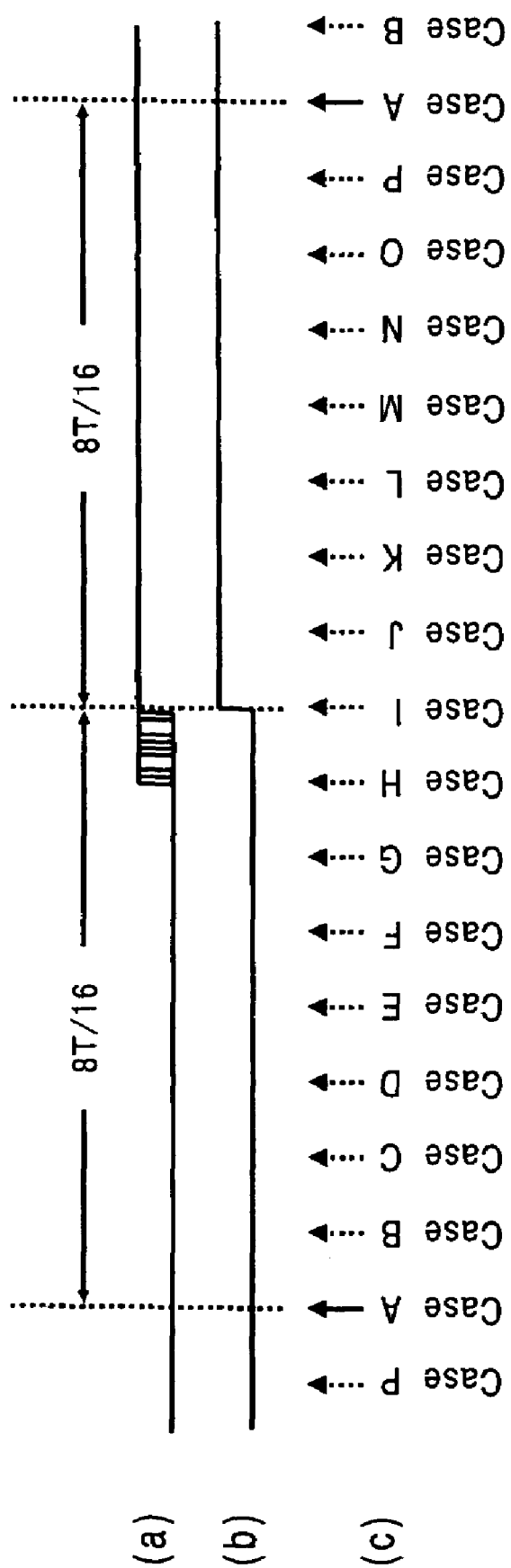
FIG. 23 is a diagram for explaining phase relationship between pulse-length data and the virtual channel clock in the embodiment.

An algorithm for controlling the phase of the virtual channel clock will be described with reference to FIG. 23. FIG. 23 shows cases A to P of phase difference of the virtual channel clock with respect to edges of RF signal.

In order that run-length data can be generated correctly even if variation in the direction of time axis or noise such as jitter exists in the RF signal, the phase of the virtual channel clock must be controlled. Therefore, the phase is controlled so that setup time and hold time of the virtual channel clock with respect to the RF signal will be maximum, i.e., cases P and A.

Figure 25:
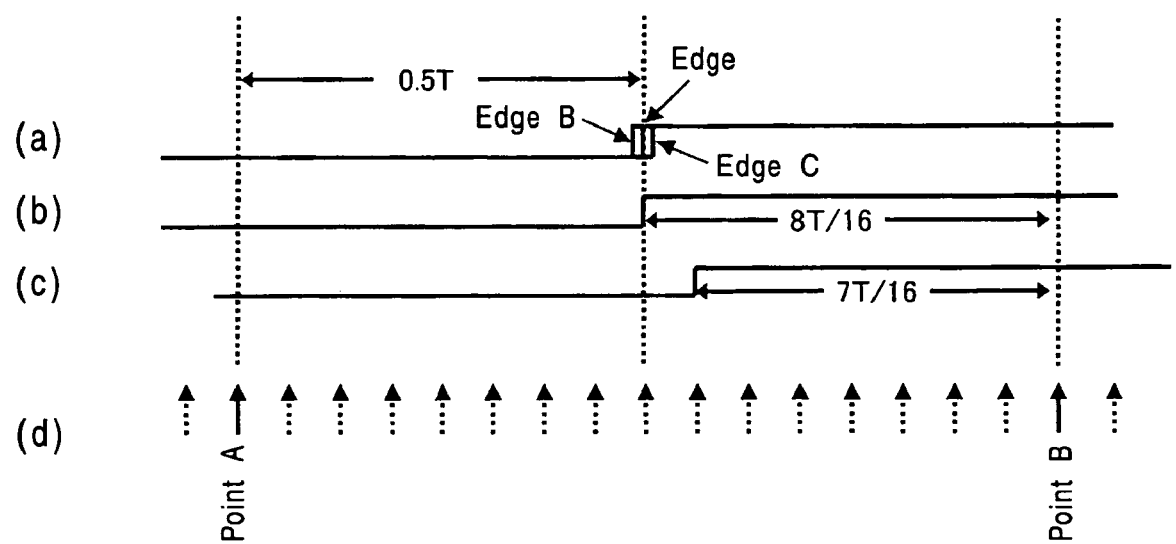
FIG. 25 is a diagram showing ideal phase relationship between pulse-length data and the virtual channel clock in the embodiment.

The reason why setup time and hold time become maximum in cases P and A will be described with reference to FIG. 25. In FIG. 25, points A and B are virtual channel clocks. The ideal edge of RF signal with which setup time and hold time become maximum is the edge A that is shifted by 0.5T from the point A.

Now, cases where the edge of the RF signal is the edge B and the edge C will be considered. The binarized RF signals of the edges B and C are sampled based on the 16-phase clocks by the 16-phase 2-terminal VCO 10, as shown in parts (b) and (c) in FIG. 25. That is, when the phase difference between the RF signal and the virtual channel clock is ideal, two cases are possible, i.e., the phase difference between the edges in parts (b) and (c) to the point B is either 7T/16 or 8T/16. Therefore, when the phase difference is 7T/16 or 8T/16, it is determined that the phase difference is ideal, and the phase difference is not corrected. (This is considered as insensitive region.) In FIG. 23, the insensitive region corresponds to cases P and A.

The phase error is determined as follows. If the rise of the virtual channel clock shown in FIG. 23 is cases B to H, the amount of deviation with respect to case A is considered as phase error. If the rise of the virtual channel clock is cases I to O, the amount of deviation with respect to case P is considered as phase error.

When the rise of the virtual channel clock shown in FIG. 23 is cases B to H, the phase control and data extraction circuit 5 determines that the virtual channel clock is delayed compared with ideal cases A or P. On the other hand, when the rise of the virtual channel clock is cases I to O, the phase control and data extraction circuit 5 determines that the virtual channel clock is advanced.

Regarding the range of determining advance or delay, depending on the nature of RF signal, in some cases, playability can be improved by considering cases B and O adjacent to cases A and P as insensitive regions. For this purpose, it is appropriate to allow setting the range of determining advance or delay as desired.

In cases H and I, in some cases, it is preferred not to determine delay or advance of phase, so that setting of insensitive regions is allowed.

If the virtual channel clock is determined as "advanced" or "delayed" with respect to the RF signal, the phase difference of the virtual channel clock is corrected as follows.

When the phase is advanced, correction is performed so that the phase will be delayed with respect to the phase difference of the next virtual channel clock. For example, if the virtual channel clock is case C, the phase is corrected by 1T/16 so that the virtual channel clock will be case B. When the phase is delayed, correction is performed so that the phase will be advanced with respect to the phase difference of the next virtual channel clock.

Figure 24:
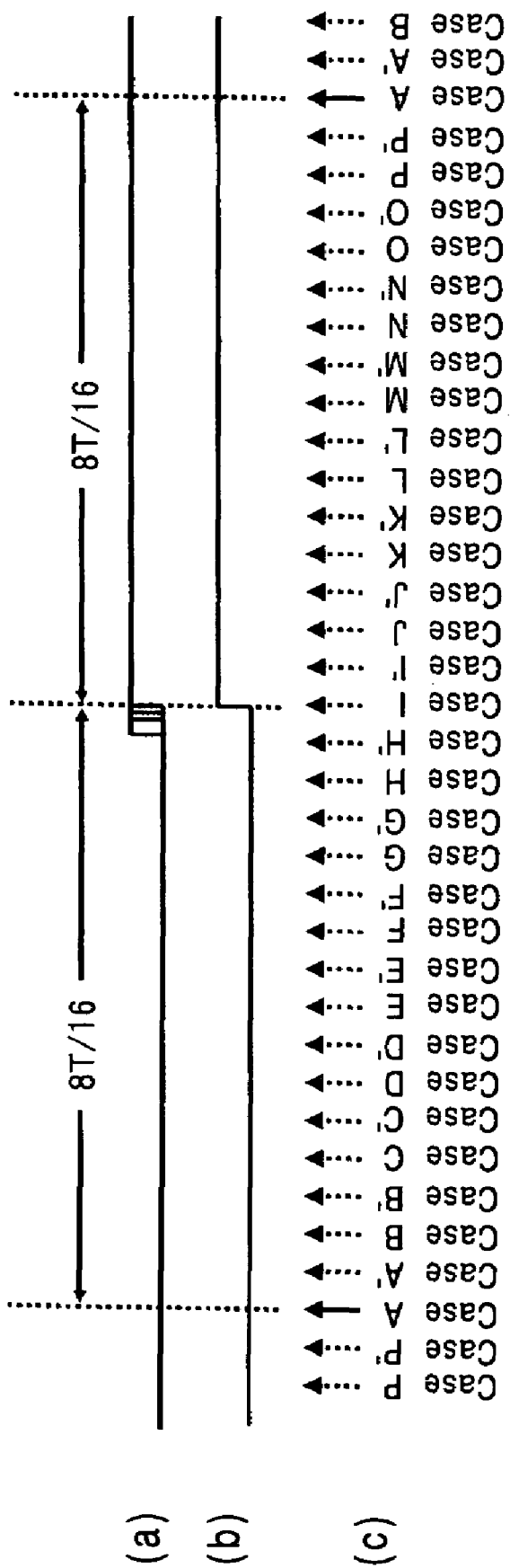
FIG. 24 is a diagram for explaining phase relationship between pulse-length data and the virtual channel clock in the embodiment.

In FIG. 23, the amount of correction of phase difference is 1T/16. Alternatively, the amount of correction may be chosen to be 1T/32, as shown in FIG. 24.

The 1T/32 control mode shown in part 24 improves resolution compared with the 1T/16 control mode. This serves to achieve a playback mode susceptible to high-frequency jitter component.

However, the gain of phase control is reduced, so that the ability of tracking change in the frequency of RF signal is reduced.

Thus, it is appropriate to provide a mode in which automatic switching between 1T/16 control and 1T/32 control is executed to achieve both the tracking ability of 1T/16 control and susceptibility to jitter of 1T/32 control.

In this mode, normal operation is 1T/32 control, if advance or delay of phase is detected three times in succession, the operation is automatically switched to 1T/16 control. When the phase returns to an ideal state, the operation automatically returns to 1T/32 control.

In phase control in this embodiment, a mode is provided in which phase correction is not performed when pulse-length data that does not conform to the format of EFM signal (in the case of CD) or EFM+ signal (in the case of DVD) arrives. This is because since edges of pulses that do not conform to the format are not reliable, and it is meaningless or even results in incorrect phase control if the phases of unreliable edges of RF signals are controlled.

By setting the mode, the range of insensitive regions, and the amount of correction, playability can be improved for any type of optical disk.

6. RLL circuit

6-1. PLL System and RLL Circuit

Now, the RLL circuit 6 will be described.

The RLL circuit 6 estimates original data by some rules and corrects data accordingly when data of RF signal is against the format due to some reason.

Figure 26:
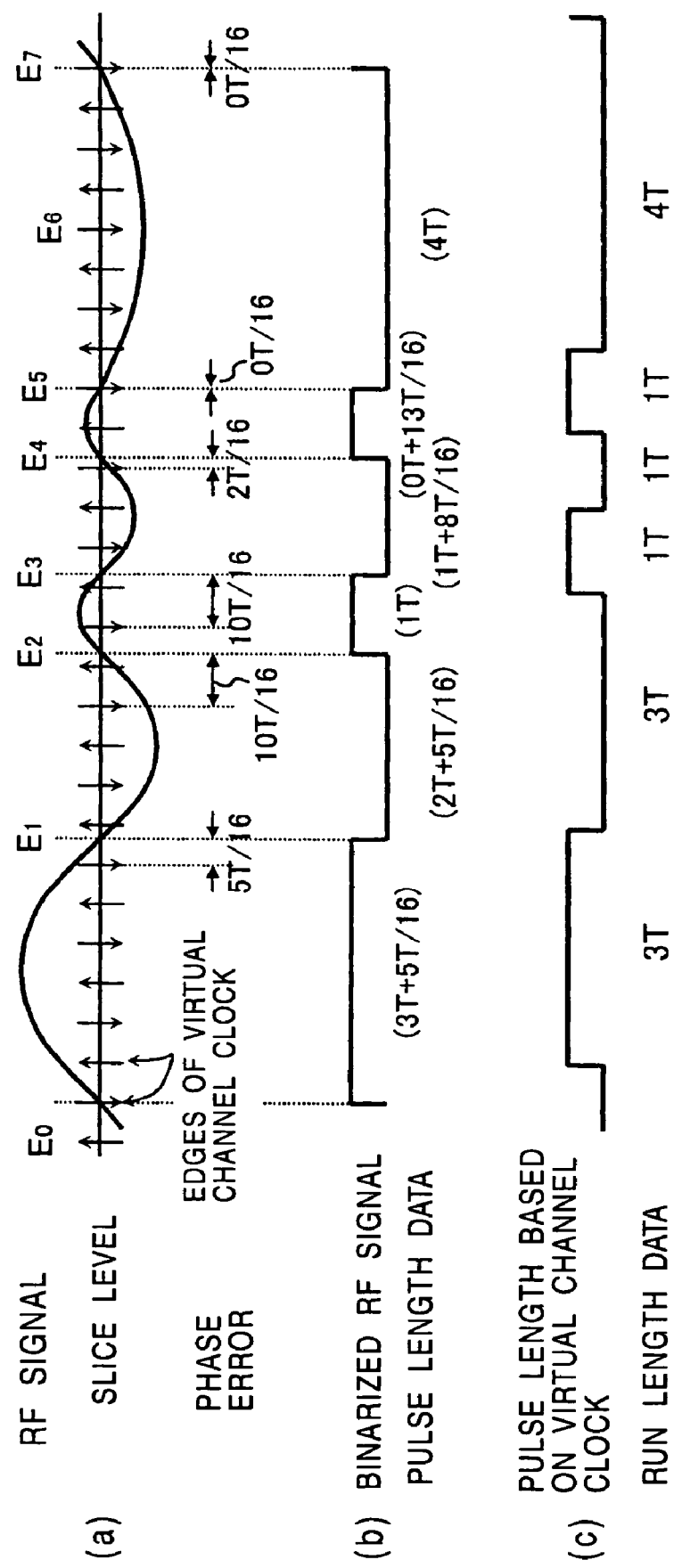
FIG. 26 is a diagram showing an RF signal, run-length data, and a phase error in the embodiment.

FIG. 26 shows a comparison of run-length data generated by the phase control and data extraction circuit 5 described above and original RF signal.

Referring to FIG. 26, part (a) shows RF signal binarized with respect to a slice level. An intersection of the RF signal and the slice level constitutes an edge of the binarized RF signal, and the length between adjacent edges is calculated as pulse-length data by the pulse-length measuring circuit 2, as shown in part (b).

Then, as described earlier, the phase control and data extraction circuit 5 calculates run-length data and phase error from the pulse-length data as shown in part (c).

When the PLL is normally locked, the phase error represents an error component due to noise in each pulse-length data. Therefore, the RLL circuit 6 performs correction using the phase error.

Figure 27:
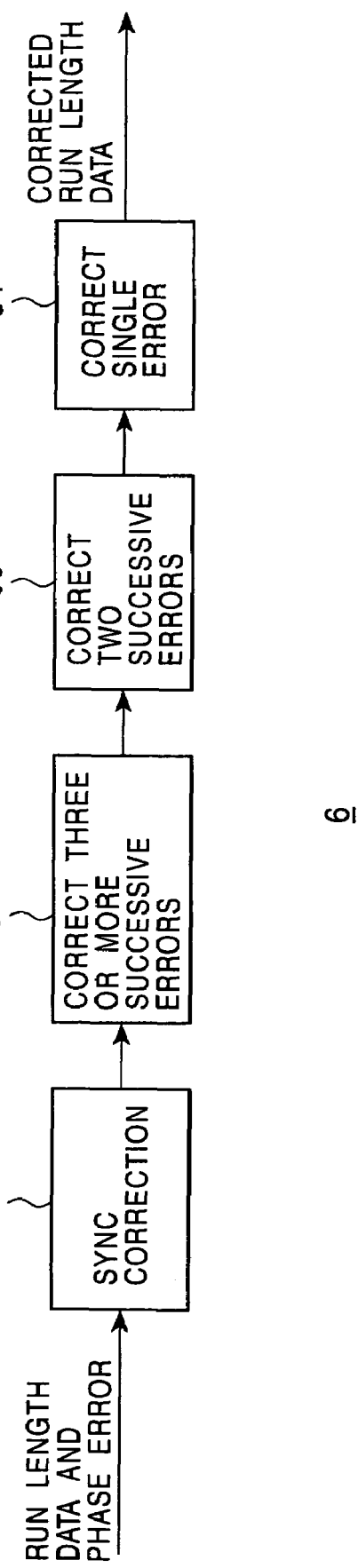
FIG. 27 is a block diagram showing a scheme of processing by an RLL circuit in the embodiment.

FIG. 27 shows the procedure of correction in the RLL circuit 6. In the following description, error refers to short run-length data that is against the format.

First, in processing 31, sync pattern and run-length data that is against the format are corrected.

Then, in processing 32, three or longer successive errors are corrected. In the processing 32, three or more successive errors are corrected according to some rules. Errors that cannot be corrected are considered as two successive or shorter errors, and is assigned to subsequent processing 33 for correcting two successive errors and processing 34 for correcting single error.

In the processing 33 for correcting two successive errors, two successive errors that exist at the time of input to the RLL circuit 6, and two successive errors generated by the previous processing 32 for correcting three or longer successive errors, are corrected. Errors that cannot be corrected are assigned to the processing 34 for correcting single error.

In the processing 34 for correcting single error, single error that exists at the time of input to the RLL circuit 6, and single error generated by the previous processing for correcting three or longer successive errors and two successive errors, are corrected.

By sequentially executing the processing for correction, run-lengths shorter than 3T can be corrected to run-length not shorter than 3T.

6-2. Error Pattern of Run-Length Data

FIGS. 28 to 33 show patterns of occurrence of run-length error.

Figure 28:
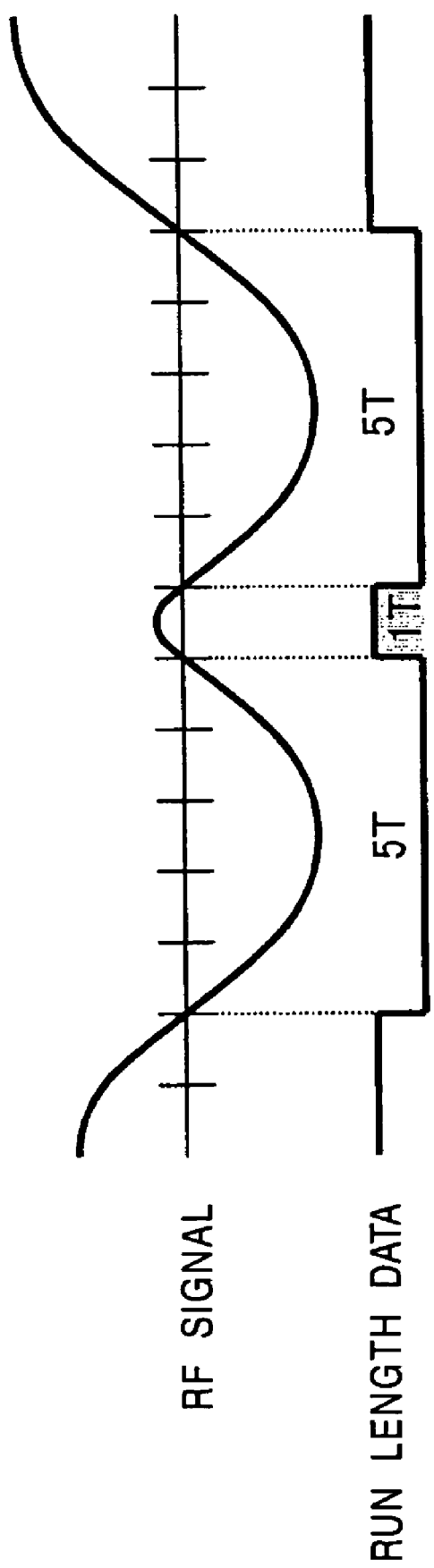
FIG. 28 is a diagram for explaining an example of single error of run-length data.

FIG. 28 shows a case where run-length data shorter than 3T occurs once, and data before and after the run-length data is not shorter than 3T.

In this case, presumably, small T such as 3T has become an error due to insufficiency of amplitude, deviation of slice level, or jitter, or noise is included in long T as a total of an error T and T before and after the error.

Figure 29:
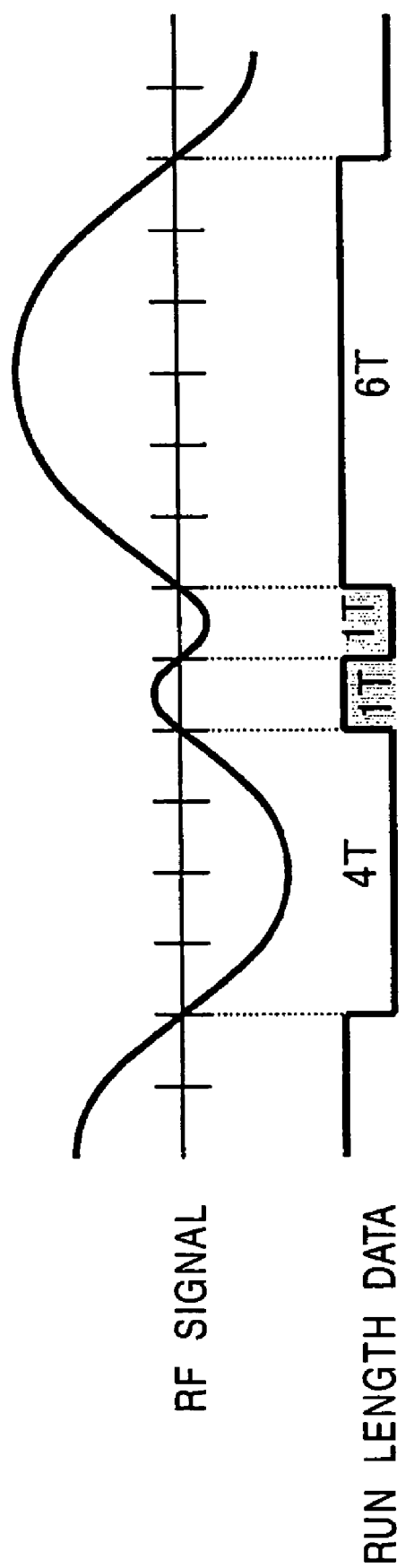
FIG. 29 is a diagram for explaining an example of two successive errors of run-length data.

FIG. 29 shows a case where run-length data shorter than 3T occurs twice, and data before and after the run-length data are not shorter than 3T. In this case, presumably, edges of run-length data before and after the run-length data caused chattering. Depending on the nature of the disk or the presence of large jitter, it is possible that two short T, such as successive run-length data of 3T+3T, both become shorter than 3T.

Figure 30:
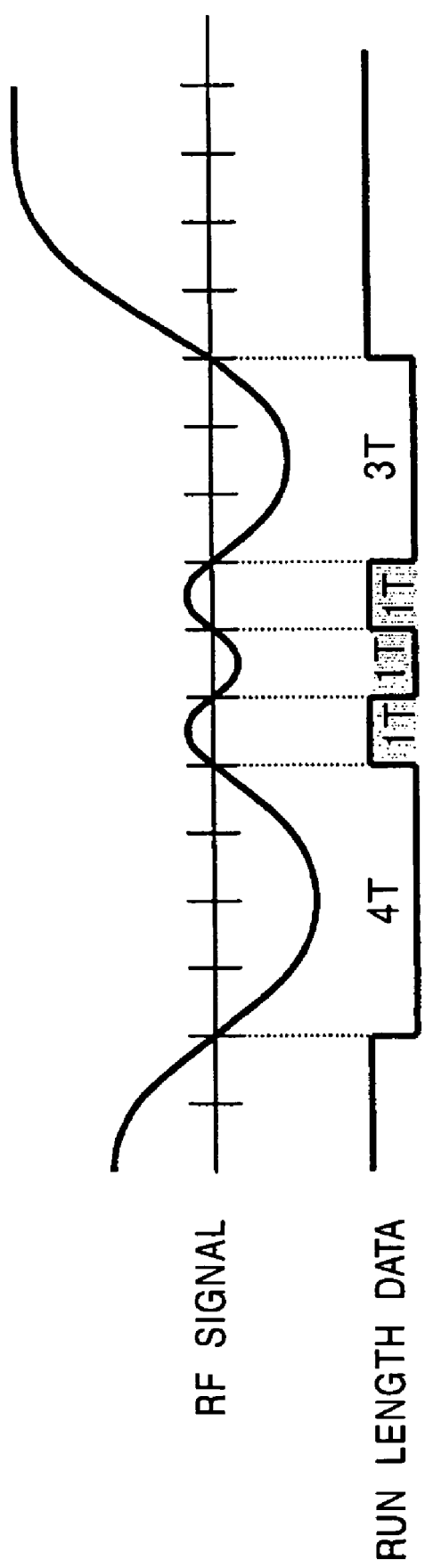
FIG. 30 is a diagram showing an example of three successive errors of run-length data.

FIG. 30 shows a case where run-length data shorter than 3T occurs three times, and run-length data before and after the run-length data are not shorter than 3T. In this case, presumably, due to insufficiency of amplitude or effect of noise, single run-length data was divided into three small run-length data.

Figure 31:
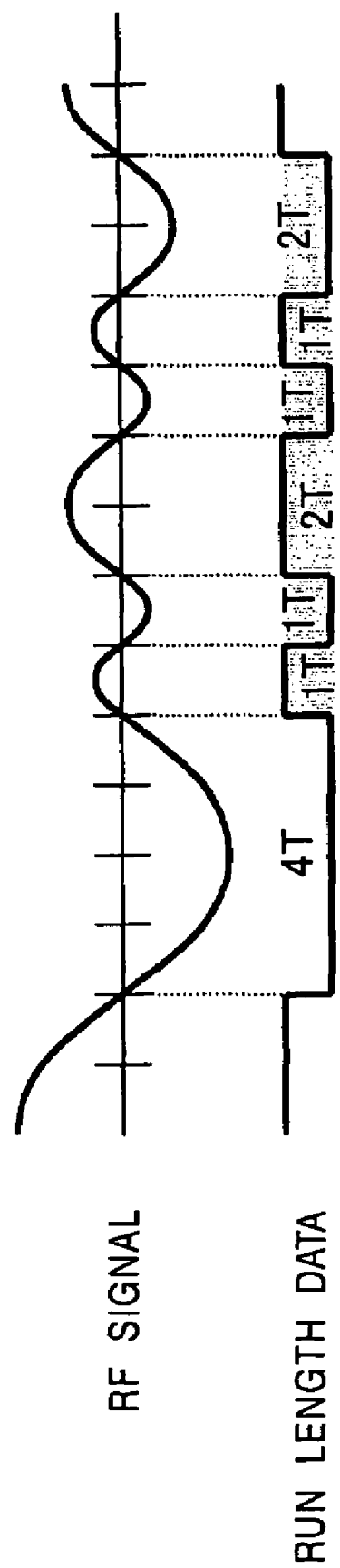
FIG. 31 is a diagram for explaining an example of four or more successive errors of run-length data.

FIG. 31 shows a case where run-length data shorter than 3T occurs four or more times continuously. If this situation occurs during normal playback, it is possible that RF signal became absent due to large dirt or defect, the amplitude of the RF signal became very small and becomes the same level as the slice level, whereby a meaningless pattern occurred.

Figure 32:
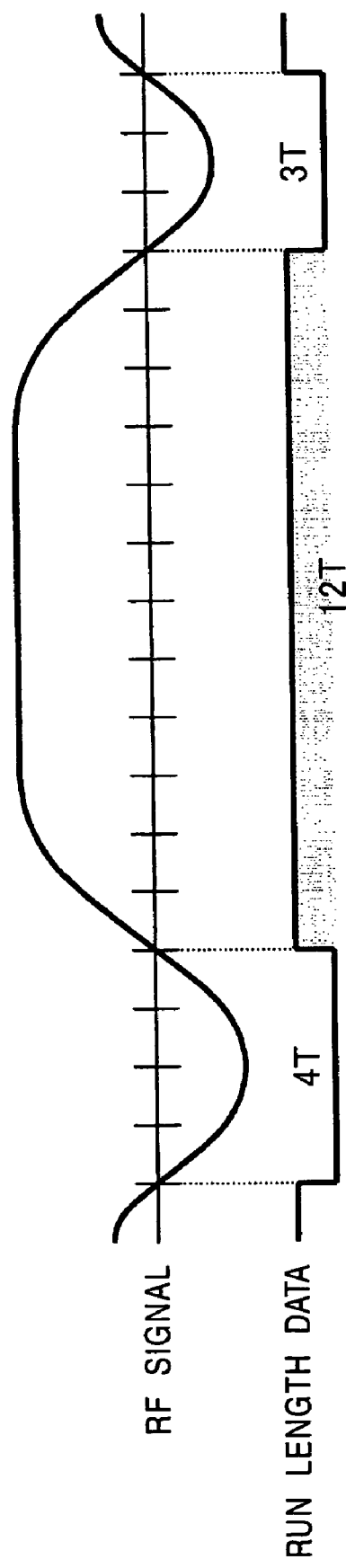
FIG. 32 is a diagram for explaining an example of 12T error of run-length data.

FIG. 32 is an example of occurrence of run-length data not shorter than 12T. In this case, presumably, due to noise, jitter, or effect of asymmetry deviation, run-length data of 11T or shorter became 12T, which is impossible according to the format.

Figure 33:
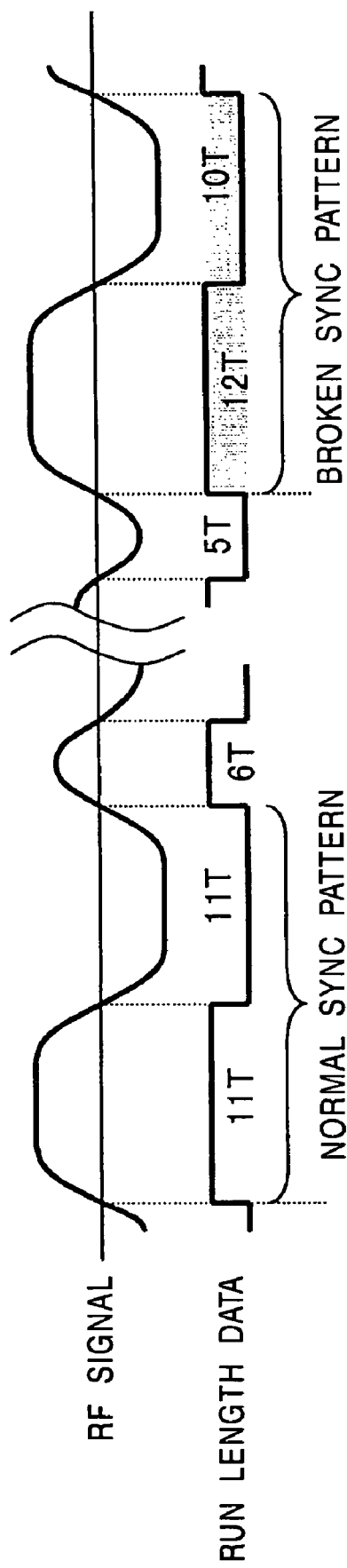
FIG. 33 is a diagram for explaining an example of sync error of run-length data.

FIG. 33 shows an example of a broken sync pattern. This occurs when, for example, due to noise, jitter, or the effect of asymmetry deviation, a sync pattern that must be 11T+ 11T cannot be maintained.

6-3. Scheme of the Method of Correcting Run-Length Error

Now, a method of correcting an error pattern will be described. In order to simplify the description, run-length data is represented by integer values. However, this data is meant as data having fractional parts unless otherwise described explicitly.

As described in relation to the phase control and data extraction circuit 5, in the digital PLL system according to this embodiment, run-length data is determined according to the number of edges included between edges corresponding to the virtual channel clock. Thus, for example, in run-length data represented as 0T, run-length data that does not cross a reference edge exists.

The direction of correction of T, i.e., whether the previous run-length data or the subsequent run-length data, is determined based on the length L of the previous and subsequent run-length data, and phase error $\phi$ of the edges of run-length data determined as error with respect to the virtual channel clock.

As for the conditions of the phase error $\phi$, if not restricted by conditions of the previous and subsequent L, in addition to relationship of magnitudes of the phase errors $\phi 1$ and $\phi 2$, it is sometimes considered whether $\phi=0$, i.e., whether the edges exist at ideal positions. When the phase error $\phi$ is not considered, an error pattern is determined only by the run-length data L and is corrected to a specific pattern. It is possible to select the conditions by the system. Now, a method of correcting an error pattern of run-length data will be described.

6-3-1. Method of Correcting 0T Single Error

Figure 34:
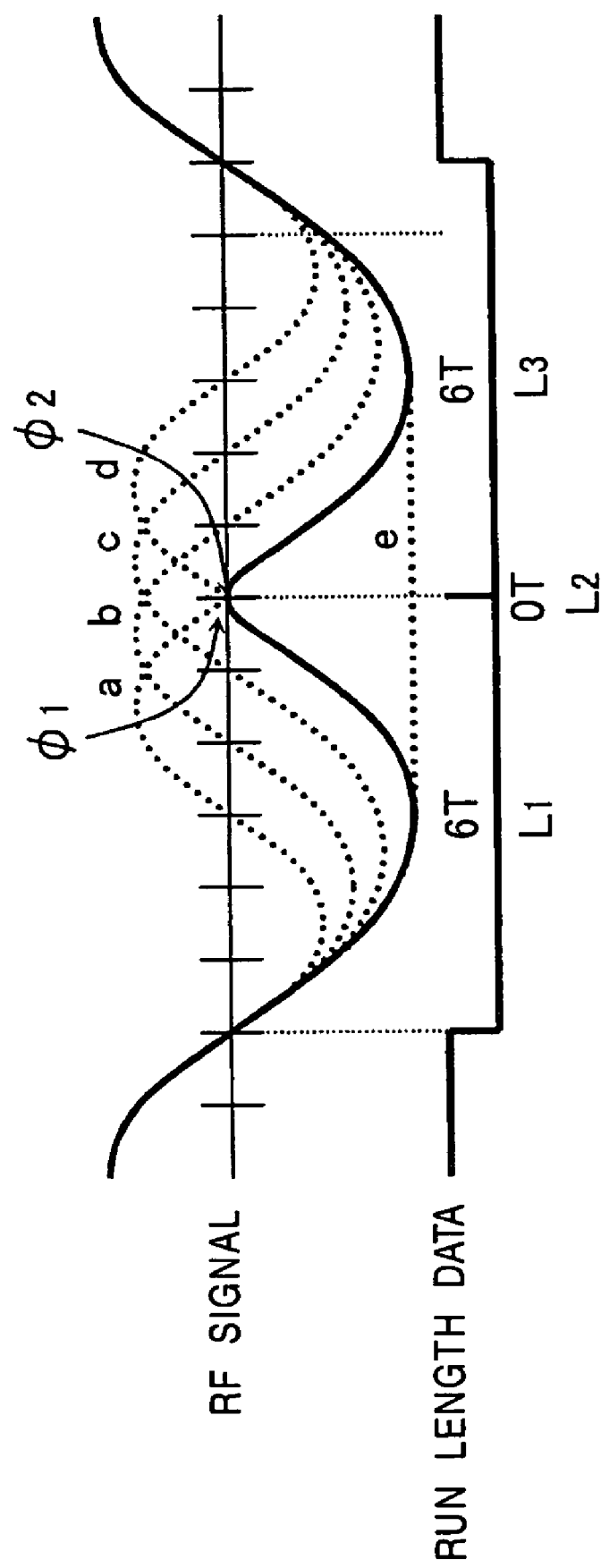
FIG. 34 is a diagram for explaining correction of a 0T single error in the embodiment.

FIG. 34 shows a method of correcting 0T (shorter than 1T) run-length error. Five types of correction, indicated as patterns a to e in FIG. 34, are possible.

Let three pieces of run-length data be denoted as L1, L2, and L3. When L2 is 0T, correction by four patterns a to d is possible to extend L2 to 3T. In this case, the extended 3T is removed from the previous and subsequent run-length data L1 and L2 by the correcting pattern used.

When 0T is to be removed, the three pieces of run-length data are added to form a single piece of run-length data, as indicated by pattern e. That is, single run-length data having a length of L1+L2+L3 (substantially L1+L3 since L2 is 0) is formed.

FIG. 35 shows an example of method of correction based on the phase error $\phi 1$ and $\phi 2$ of the edges of run-length data in which error has occurred and the previous and subsequent run-length data L1 and L3.

In this method, the value of L2 in which error has occurred is restored as 3T whenever possible.

FIG. 35 shows conditions (1) to (11) for correction.

For example, when the condition is L1+L3≦8, as in (1), the pattern e is used to remove 0T, whereby the run length after the correction becomes L1 to L3.

As for conditions (2) to (11), according to the respective conditions of L1 and L3 and conditions of $\phi 1$ and $\phi 3$, the value of L2 in which error has occurred is restored as 3T using one of the patterns a to d.

A correcting method shown in FIG. 36 is also possible. According to this method, when the total of L1+L2+L3 is not larger than 11T, L2 is removed with a priority.

More specifically, under the condition (1), the pattern e is used, whereby the run length after the correction becomes L1+L3.

When the conditions (2) to (5) are satisfied, the value of L2 in which error has occurred is restored as 3T using one of the patterns a to d as shown.

Furthermore, a correcting method that does not use conditions of phase error $\phi$ is also possible, which is shown in FIG. 37. This unambiguous correcting method is provided since many cases where L2 and L3 are 3T such as nT+3T+ 3T (n≧3) were observed in analysis of actual random error.

In this case, the value of L2 in which error has occurred is restored to 3T using one of the patterns a to d according to the conditions (1) to (4) as shown.

6-3-2. Method of Correcting 1T Single Error

Figure 38:
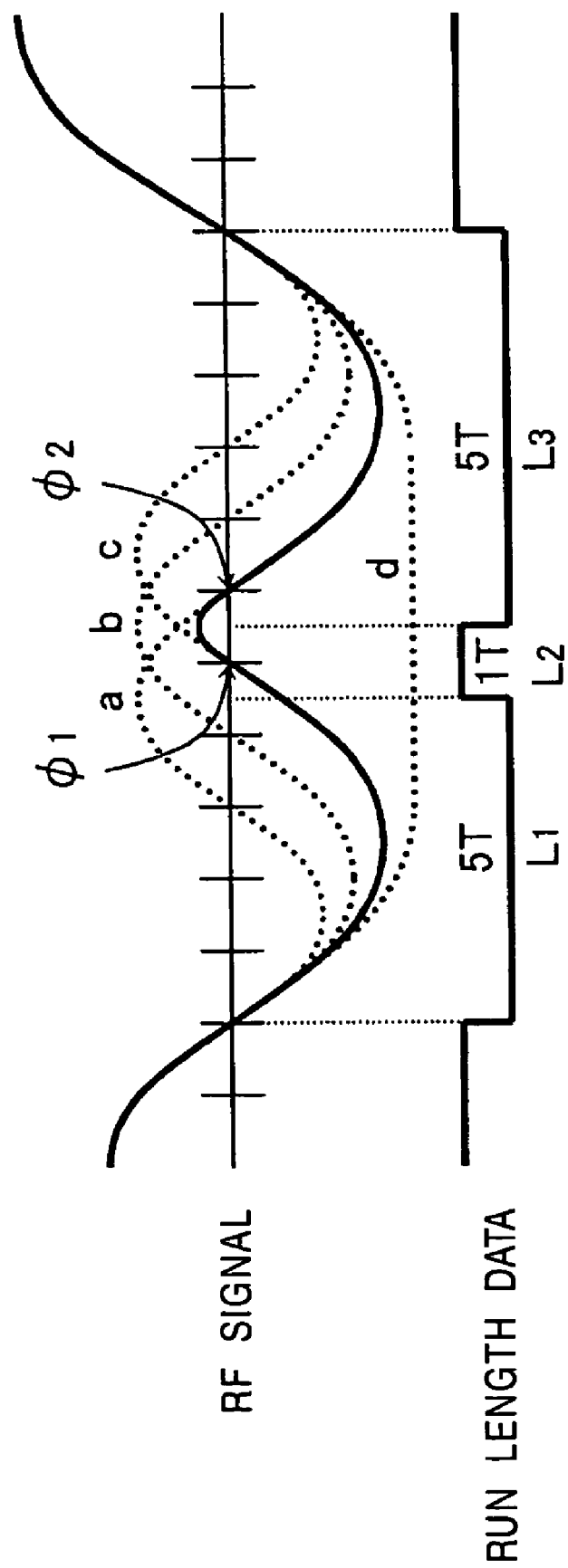
FIG. 38 is a diagram for explaining correction of a 1T single error in the embodiment.

Next, FIG. 38 shows a method of correcting run-length error not shorter than 1T and is shorter than 2T (hereinafter 1T).

Four types of correcting method, i.e., patterns a to d in FIG. 38, are possible.

Let three pieces of run-length data be denoted as L1, L2, and L3. When L2 is 1T, correction by three patterns a to c are possible to extend L2 to 3T. In this case, the extended 3T is removed from the previous and subsequent run-length data using the correcting patterns.

When removing 1T, the three pieces of run-length data are added to form a single piece of run-length data, as in pattern d. That is, single run-length data having a length of L1+L2+L3 is formed.

FIG. 39 shows an example of correcting method based on phase errors φ1 and φ2 of both edges of run-length data in which error has occurred and the previous and subsequent run-length data L1 and L3. According to this method, the value of L2 determined as an error is restored as 3T whenever possible.

For example, when the condition is L1+L2+L3≦8, as in (1), the pattern d is used to remove 0T, whereby the run length after the correction becomes L1+L2+L3.

As for conditions (2) to (6), the value of L2 in which error has occurred is restored as 3T using one of the patterns a to c in accordance with the conditions of L1 and L2 and the conditions of φ1 and φ3.

Also, a correcting method shown in FIG. 40 is possible. According to this method, when the total of L1+L2+L3 is not larger than 11T, L2 is removed with a priority.

More specifically, under the condition (1), the pattern d is used for correction to obtain run length data of L1+L2+L3. Under the conditions (2) to (4), the value of L2 in which error has occurred is restored as 3T using one of the patterns a to c.

Furthermore, a correcting method that does not use conditions of phase error φ, shown in FIG. 41, is possible. This method is used for the same reason as the correcting method shown in FIG. 37, which does not use conditions of phase error φ.

In this case, the value of L2 in which error has occurred is restored as 3T using one of the patterns a to c in accordance with the conditions (1) to (3) as shown.

6-3-3. Method of Correcting 2T Single Error

Figure 42:
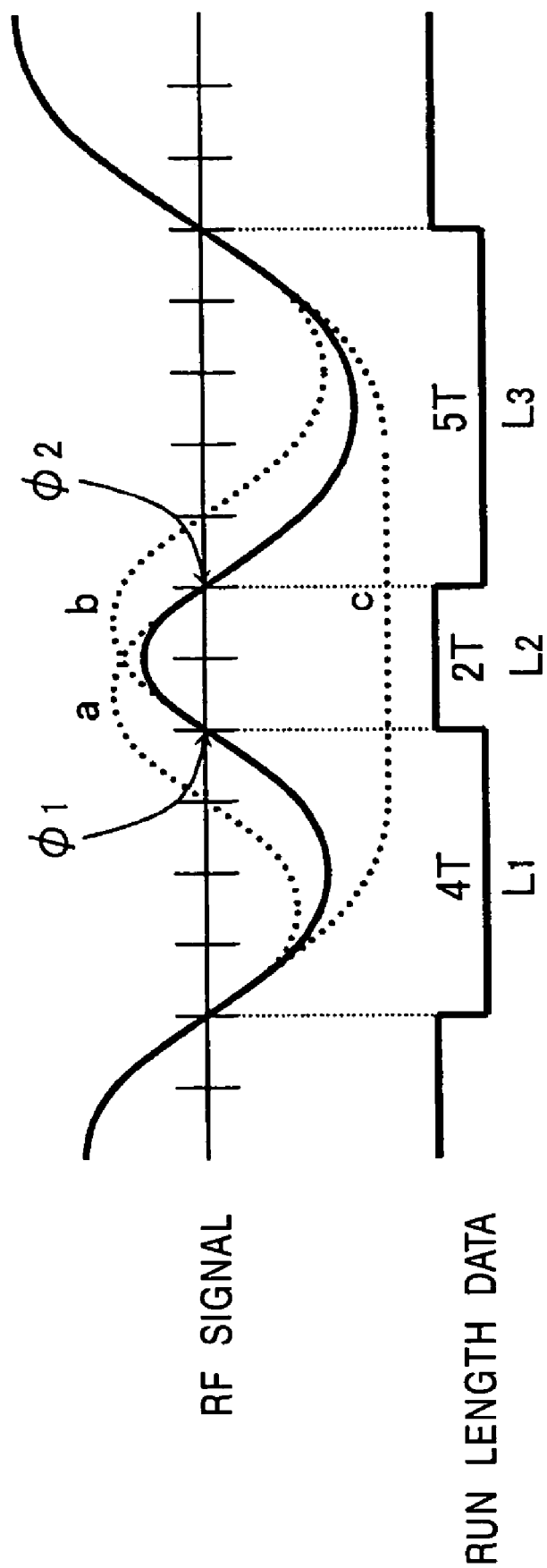
FIG. 42 is a diagram for explaining correction of a 2T single error in the embodiment.

FIG. 42 shows a method of correcting a run-length error that is not shorter than 2T and is shorter than 3T (hereinafter 2T).

Three correcting patterns a to c shown in FIG. 42 are possible.

Let three pieces of run-length data be denoted as L1, L2, and L3. When L2 is 2T, the two correcting patterns a and b can be used to extend L2 to 3T. The extended 3T is removed from previous and subsequent run-length data L1 and L3 by the correcting pattern used.

When 2T is to be removed, the three pieces of run-length data are combined to form a single piece of run-length data, as indicated by the pattern c. That is, a single piece of run-length data having a length of L1+L2+L3 is formed.

FIG. 43 shows a correcting method based on phase errors φ1 and φ2 of both edges of run-length data in which error has occurred, and on values of previous and subsequent run-length data L1 and L3.

According to this method, a case where the one or both of the previous and subsequent values L1 and L3 is 3T is handled as a special case, and otherwise 2T is played back as 3T according to conditions of φ1 and φ2.

In case (1), that is, when both L1 and L3 are 3T, the pattern c is used to form run-length data of L1+L2+L3 (=8T).

In case (2) or (3), where one of L1 and L3 is 3T, the pattern a or b is used to remove 1T from the one that is not 3T and add it to L2 so that L2 becomes 3T.

6-3-4. Method of Correcting Two Successive Errors

Figure 44:
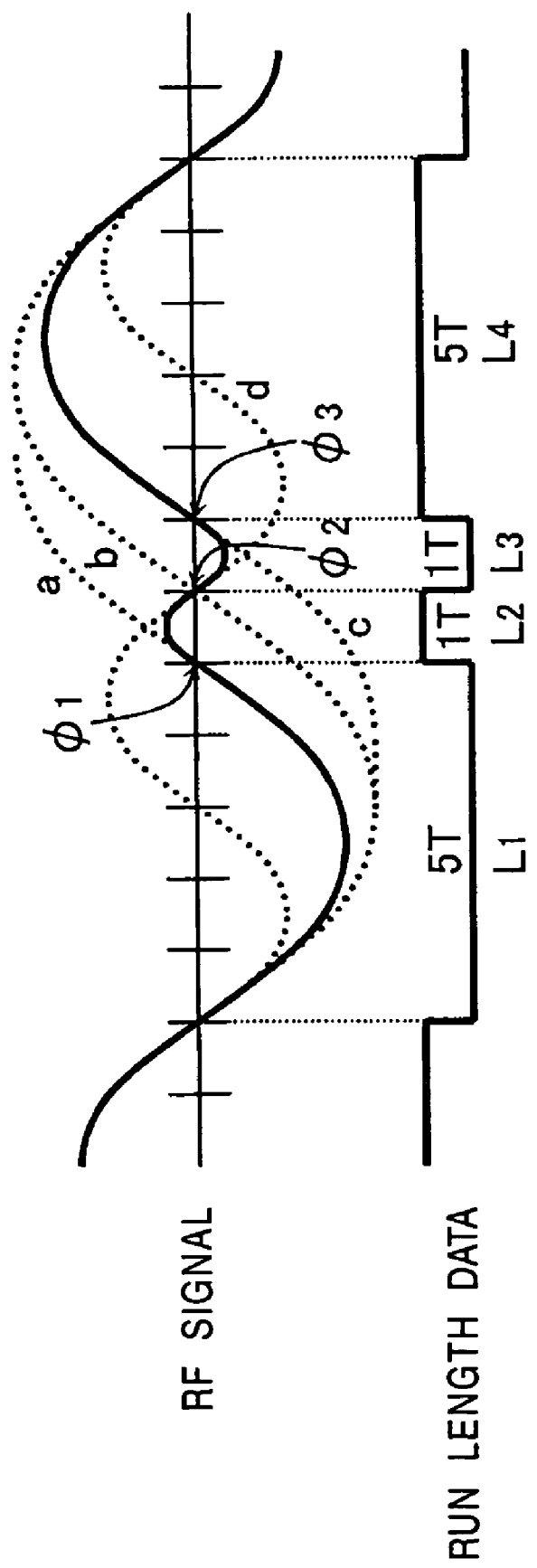
FIG. 44 is a diagram for explaining correction of two successive errors in the embodiment.

FIG. 44 shows a case where run-length error that is shorter than 3T has occurred twice successively, and patterns for correcting the error.

The correcting method can be classified into two types. Referring to FIG. 44, patterns a to c considers the error as chattering between previous and subsequent run-length data L1 and L4, and assigns run-length data of L2 and L3 to L1 and L4. On the other hand, a pattern d considers the successive errors L2 and L3 as two successive 3Ts.

The correcting patterns a to d are selected based on the respective lengths of L1, L2, L3, and L4, and phase errors φ1, φ2, and φ3 of the edges of L2 and L3 in which error has occurred.

FIGS. 45 and 46 show correcting methods in which priority is given to conditions of phase errors at edges of run-length data in which error has occurred.

In the correcting method shown in FIG. 45, when the phase error φ2 is 0, priority is given to making two run-length errors into 3T+3T.

On the other hand, in the correcting method shown in FIG. 46, when the phase error φ1 or φ3 is 0, priority is given to separating run lengths L1 to L4 into two run-length patterns while maintaining edges.

FIG. 47 shows a correcting method that determines a correcting pattern based on a combination of the lengths of run-length errors L2 and L3 and a combination of lengths of run-length data L1 and L4 on both sides.

According to the method, L2+L3 is added to L1 or L4 without causing L1 or L4 to exceed 11T. If this causes L1 or L4 to exceed 11T, L2+L3 is combined as a single piece of run-length data.

In this case, as will be understood from FIG. 47, L2+L3 could be shorter than 3T. At this time, however, the piece shorter than 3T is accepted as it is, and is corrected by the single-error correcting circuit in the processing 34 subsequent to the processing 33 as described with reference to FIG. 27.

Figure 48:
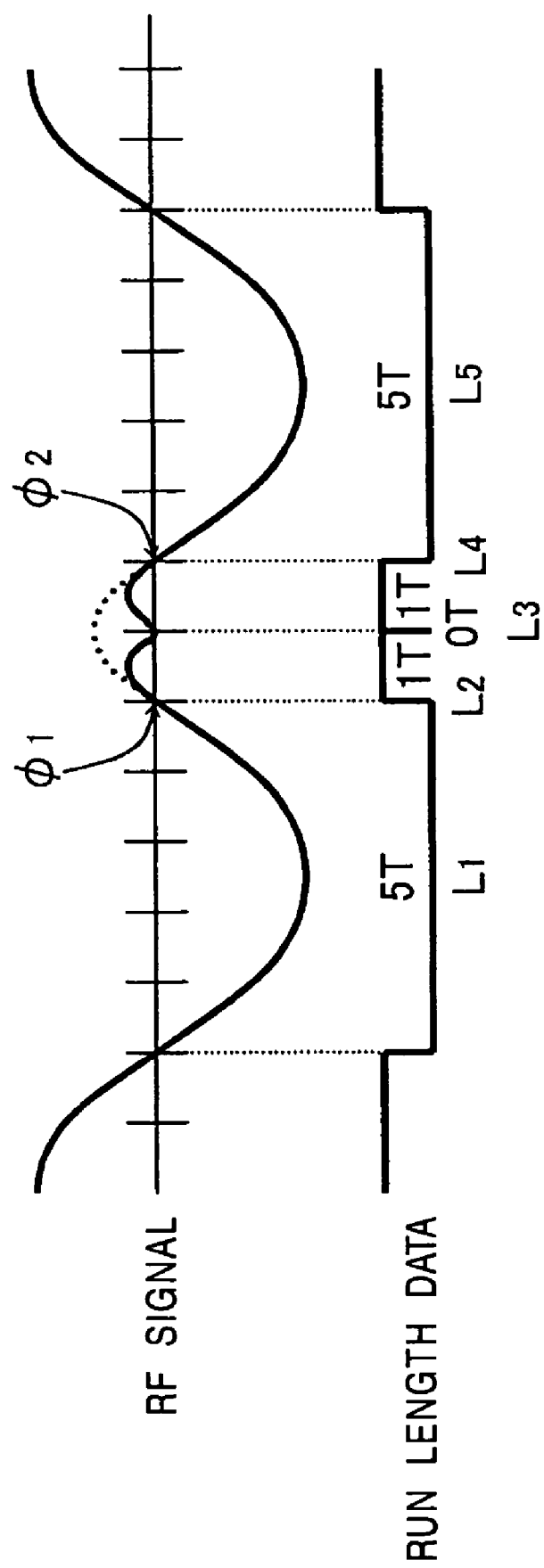
FIG. 48 is a diagram for explaining correction of three successive errors in the embodiment.

6-3-5. Method of Correcting Three Successive Errors Having Total Error Shorter than 3T FIG. 48 shows a case where run-length error that is shorter than 3T has occurred three times successively, and the total of the run-length data is shorter than 3T.

In this case, irrespective of the values of run length data or values of phase errors, three pieces of run-length data are combined to form a single piece of run-length data. According to this method, L2+L3+L4 form a single piece of run-length data irrespective of conditions of L1 and L5 or φ1 and φ2, as shown in FIG. 49.

At this time, the value of L2+L3+L4 is shorter than 3T, but the value is accepted as it is, and is processed by single-error correction in the subsequent processing 34 described with reference to FIG. 27.

6-3-6. Method of Correcting Three Successive Errors Having Total Error of 3T

Figure 50:
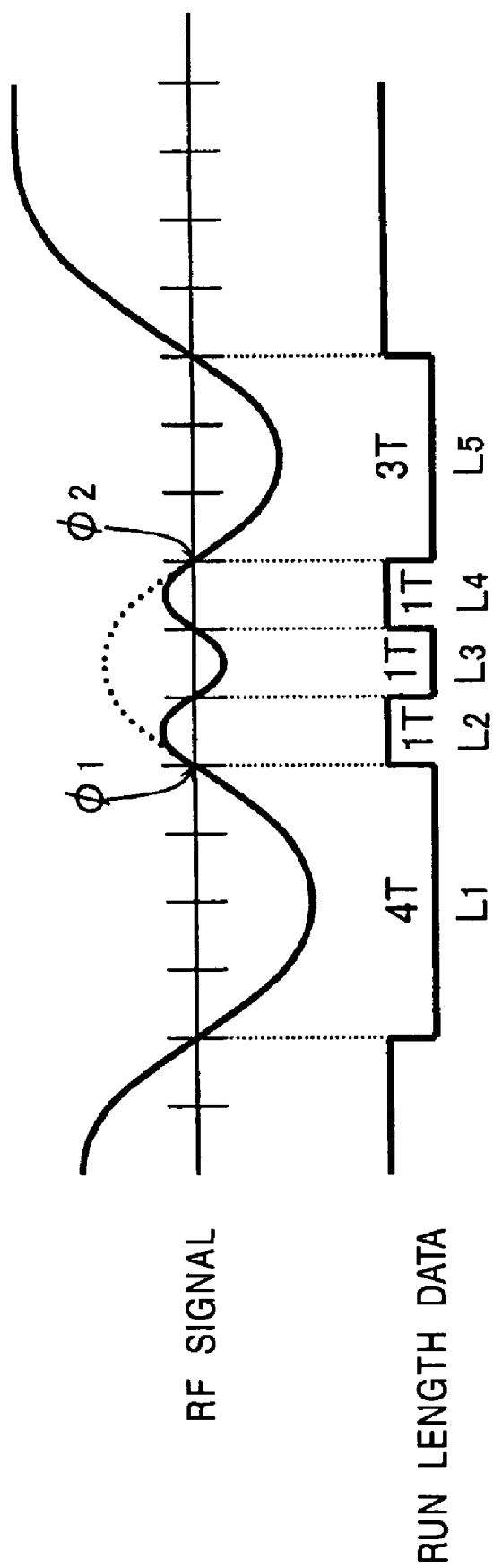
FIG. 50 is a diagram for explaining correction of three successive errors in the embodiment.

FIG. 50 shows a case where run-length error that is shorter than 3T has occurred three times successively, and the total of the run-length data is 3T.

Also in this case, irrespective of the values of run-length data or the values of phase errors, three pieces of run-length data are combined to form a single piece of run-length data. According to this method, L2+L3+L4 form a single piece of run-length data irrespective of conditions of L1 and L5 or φ1 and φ2, as shown in FIG. 51. In this case, the total value of the three errors L2+L3+L4 is 3T.

6-3-7. Method of Correcting Three Successive Errors Having Error Total Not Shorter than 4T FIG. 52 shows a case where run-length error that is shorter than 3T has occurred three times successively, and the total of the run-length data is not shorter than 4T.

Correction is performed based on one of the following two methods.

Figure 52:
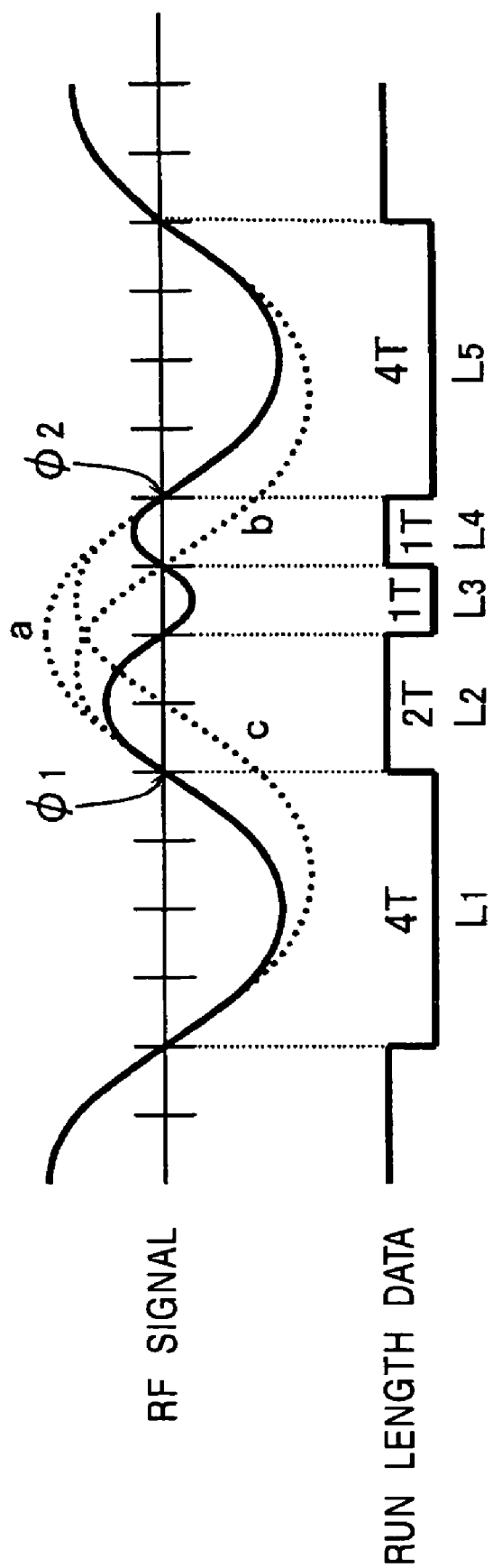
FIG. 52 is a diagram for explaining correction of three successive errors in the embodiment.

In a correcting method shown in FIG. 53, the pattern a shown in FIG. 52 is always used. That is, similarly to the correcting methods shown in FIGS. 49 and 51, L2+L3+L4 form a single piece of run-length data irrespective of the conditions of L1 and L5 or φ1 and φ2. In this case, the total value of the three errors L2+L3+L4 is not shorter than 4T.

In the other correcting method shown in FIG. 54, the patterns a to c shown in FIG. 52 are used selectively.

According to this method, the magnitudes of the phase errors of both edges of the three successive run-length errors is compared, and the three pieces of run-length data is replaced by a single piece of 1T according to the result. At this time, the value obtained by subtracting 3 from the total of the three errors is added to L1 or L5 depending on the conditions. In FIG. 54, (1) and (2) are cases where the patterns c and b are used depending on the conditions.

6-3-8. Method of Correcting Four or More Successive Errors

Figure 55:
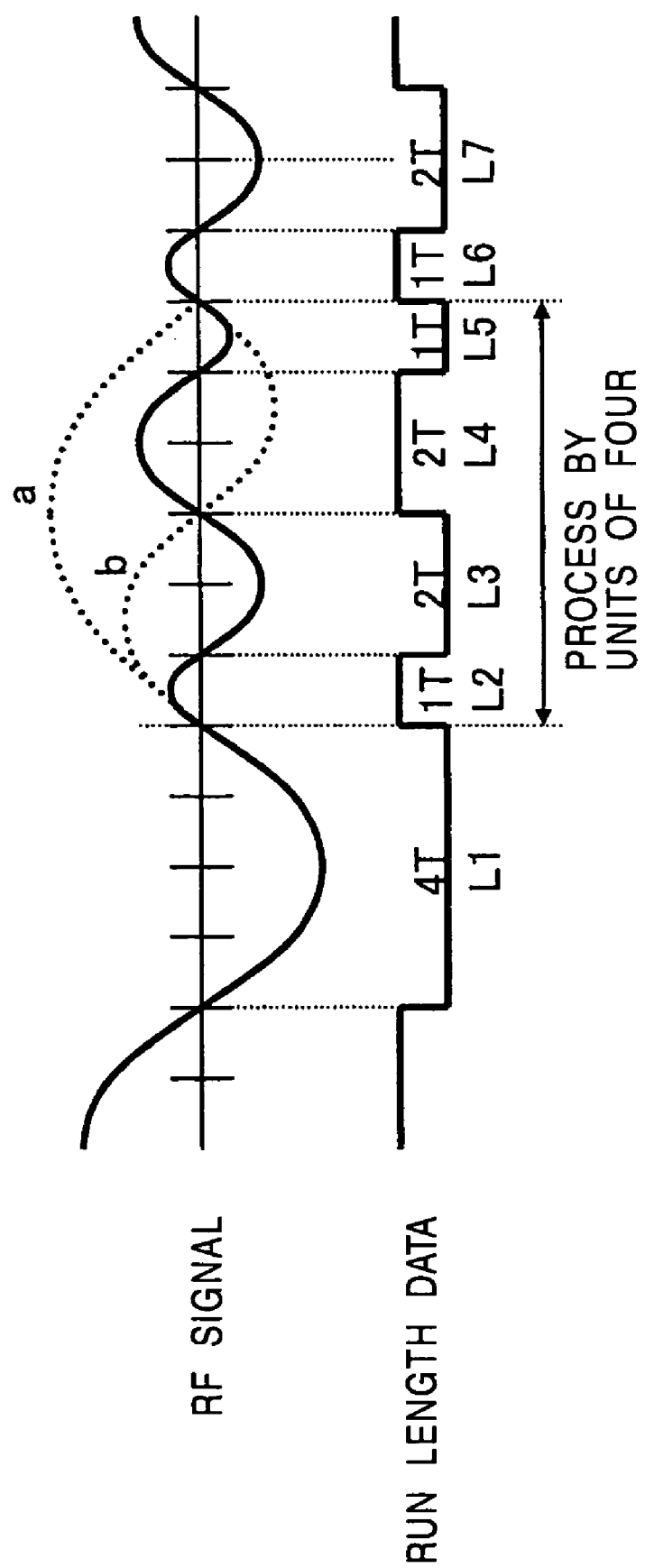
FIG. 55 is a diagram for explaining correction of four or more successive errors in the embodiment.

FIG. 55 shows a case where run-length error that is shorter than 3T has occurred four or more times successively.

In this case, it is substantially impossible to estimate original run-length data. Thus, the successive run-length data is converted into one or two pieces of run-length data by patterns shown in FIG. 56. The correcting pattern used in either the pattern a or the pattern b shown in FIG. 55.

At this time, even when the total value becomes shorter than 3T, special processing is not executed, and processing is assigned to the subsequent processing 33 for correcting two successive errors and processing 34 for correcting a single error, as described with reference to FIG. 27.

6-3-9. Method of Correcting 12T

Figure 57:
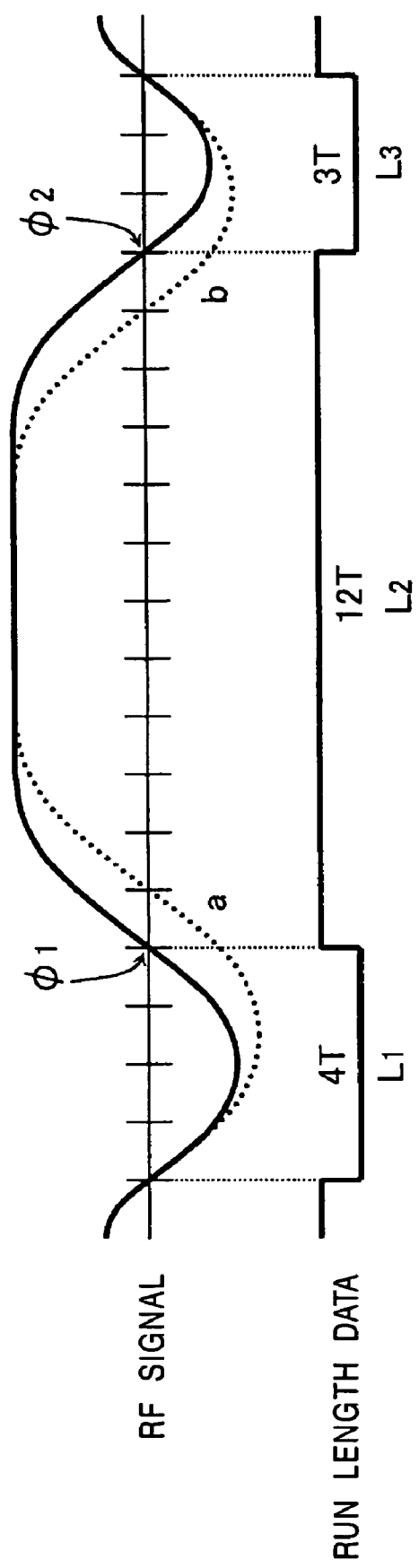
FIG. 57 is a diagram for explaining correction of a 12T error in the embodiment.

FIG. 57 shows a case where a piece of 12T has occurred.

The piece of 12T can be considered as a variant of a piece of 11T. Thus, the correcting pattern used in the pattern a or pattern b shown in FIG. 57, and the run-length data is corrected according to the conditions shown in FIG. 58.

Note, however, that if the run-length data L1 and L3 do not match the conditions, as in case (3) in FIG. 58, correction is not performed. This avoids generating a sync pattern of 11+11T at an inappropriate position.

6-3-10. Method of Correcting Sync Pattern Error

Figure 59:
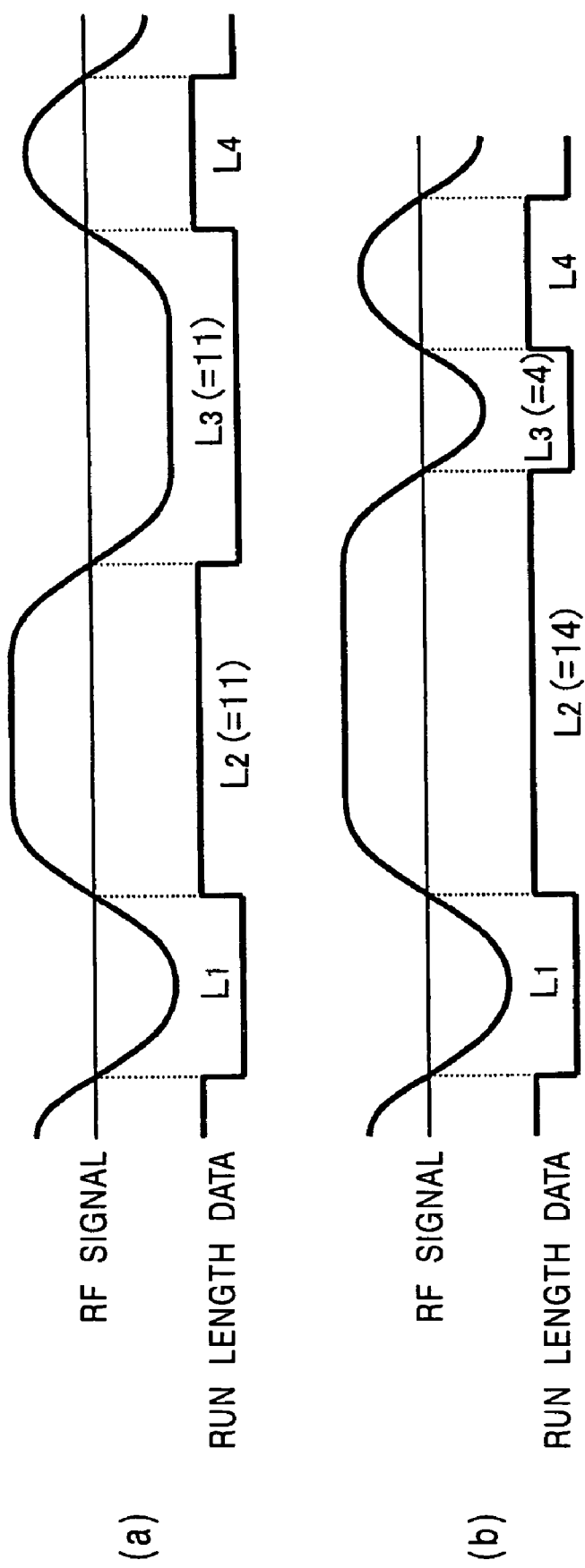
FIG. 59 is a diagram for explaining a sync pattern.

In FIG. 59, parts (a) and (b) show examples of sync patterns for a CD and a DVD, respectively.

On a CD or a DVD, a predetermined sync pattern, 11T+11T in the case of a CD and 14T+4T in the case of a DVD, is recorded at a regular interval as a predefined format. The correcting method to be used can be considered based on to what extent a pattern is deviated from the correct interval and sync pattern.

The correcting method used can be selected from five methods shown in FIGS. 60, 62, 64, 66, and 68 in the case of a CD, and from five methods shown in FIGS. 61, 63, 65, 67, and 69 in the case of a DVD.

Sixteen different ways of pattern deviation are possible in the case of a CD, and fourteen different ways of pattern deviation are possible in the case of a DVD, as denoted by (1) to (16) and (1) to (14) in the figures mentioned above. In the waveforms shown in the figures, patterns before correction are shown by solid lines, and patterns after correction are shown by dotted lines.

The correction is not performed for deviation patterns other than those mentioned above.

Figure 60:
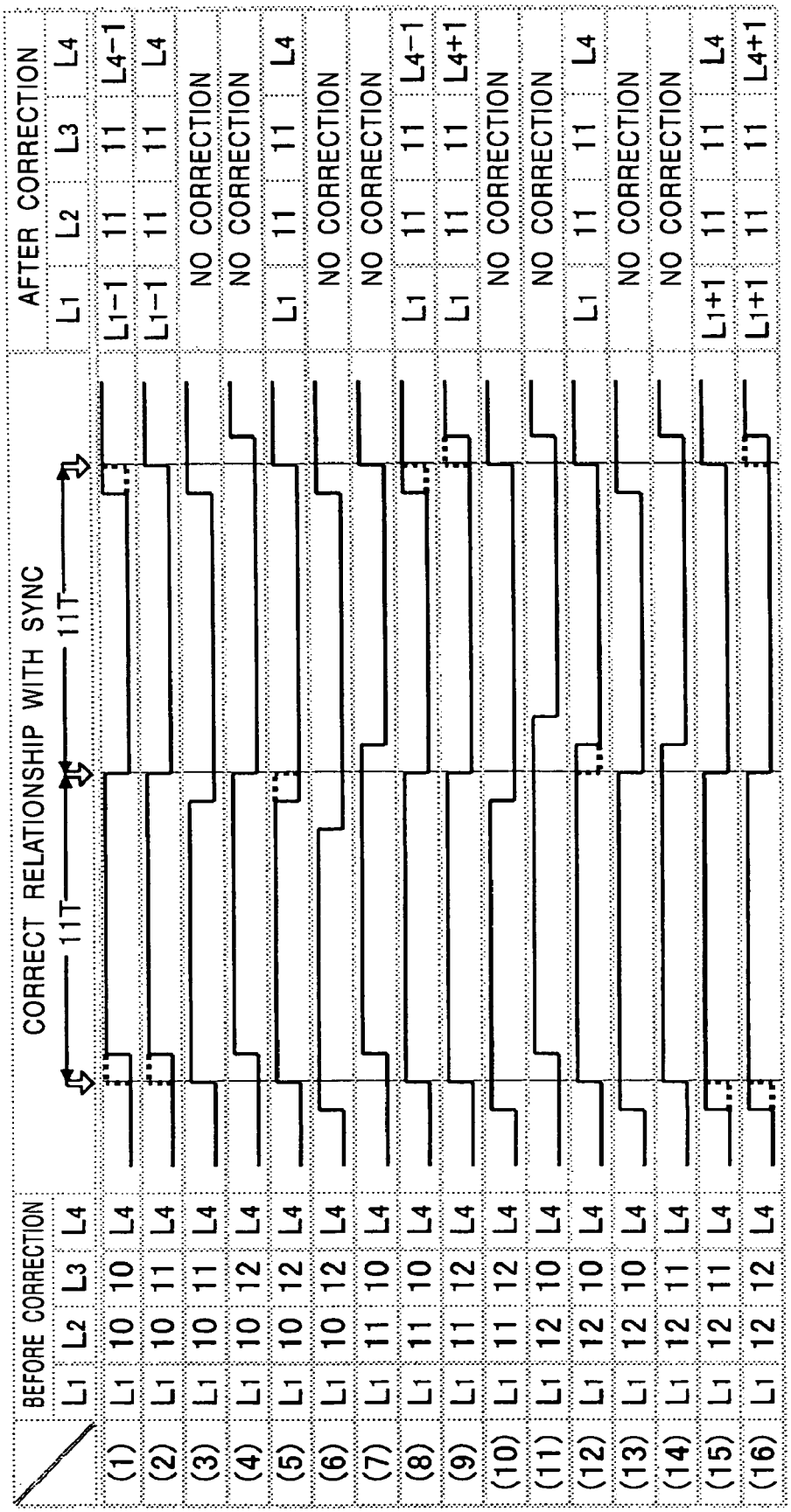
FIG. 60 is a diagram for explaining an example correction of a sync error.
Figure 61:
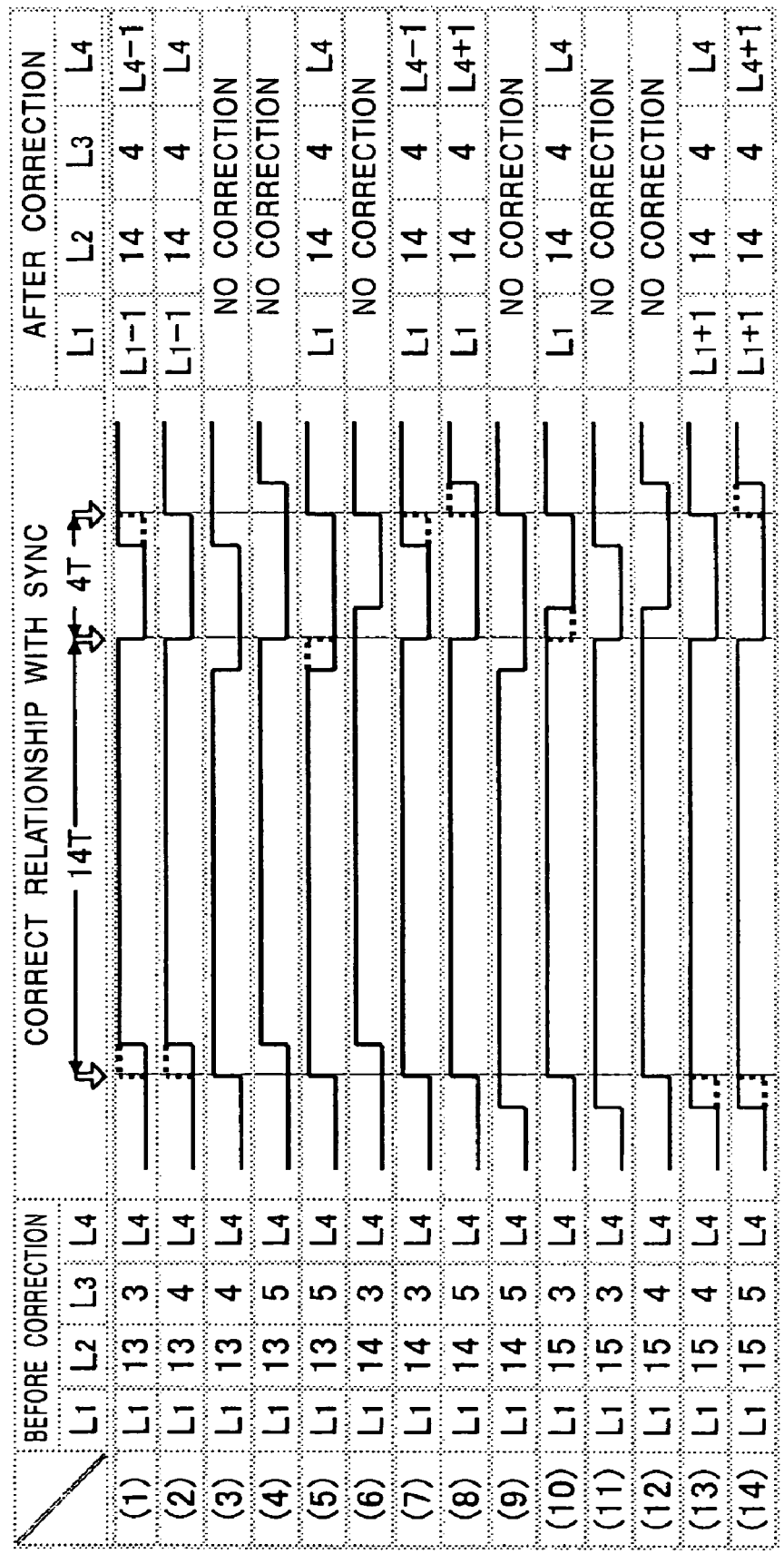
FIG. 61 is a diagram for explaining an example correction of a sync error.

FIGS. 60 and 61 show correcting methods in which correction is not performed unless a sync pattern can be restored by minimum correction.

More specifically, according to this method, correction is performed in cases where only one edge has deviated with respect to the expected positions of the three edges of the pattern, except for (1) and (1&) in FIG. 60 in the case of a CD and (1) and (14) in FIG. 61 in the case of a DVD.

Figure 62:
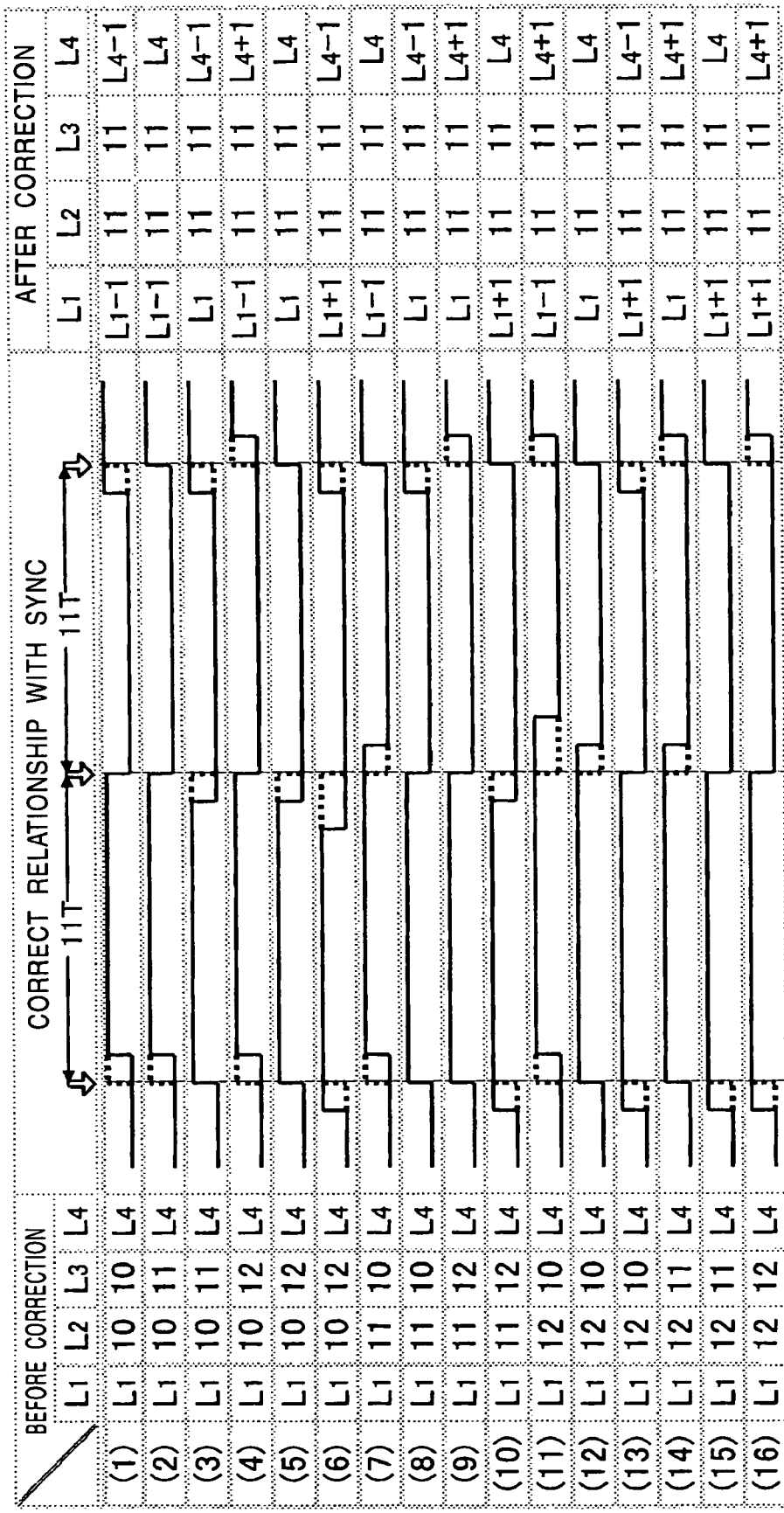
FIG. 62 is a diagram for explaining an example correction of a sync error.
Figure 63:
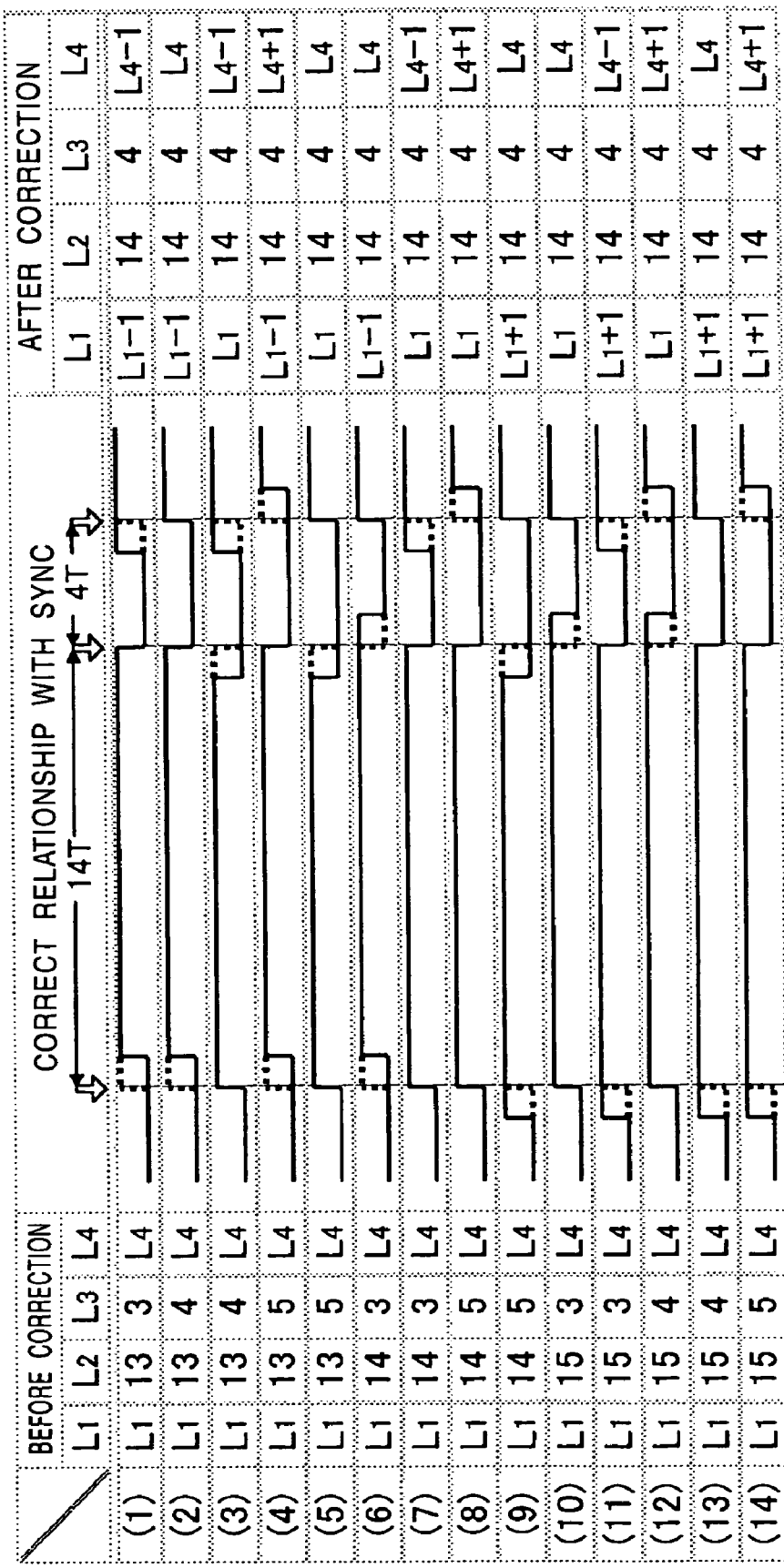
FIG. 63 is a diagram for explaining an example correction of a sync error.

FIGS. 62 and 63 show correcting methods in which priority is given to the expectation that a sync pattern is detected after 588T in the case of a CD or after 1488T in the case of a DVD from a previous sync pattern.

More specifically, in the case of a CD shown in FIG. 62, it is determined whether the position of the edge between 11T (L2) and 11T (L3) corresponds to a position of 588T. Priority is given to matching between these positions, and the previous and subsequent pulse lengths L1 and L4 are increased or decreased accordingly.

In the case of a DVD shown in FIG. 63, it is determined whether the position of the edge between 14T (L2) and 4T (L3) corresponds to a position of 1488T. Priority is given to matching between these positions, and the previous and subsequent pulse lengths L1 and L4 are increased or decreased accordingly.

Figure 64:
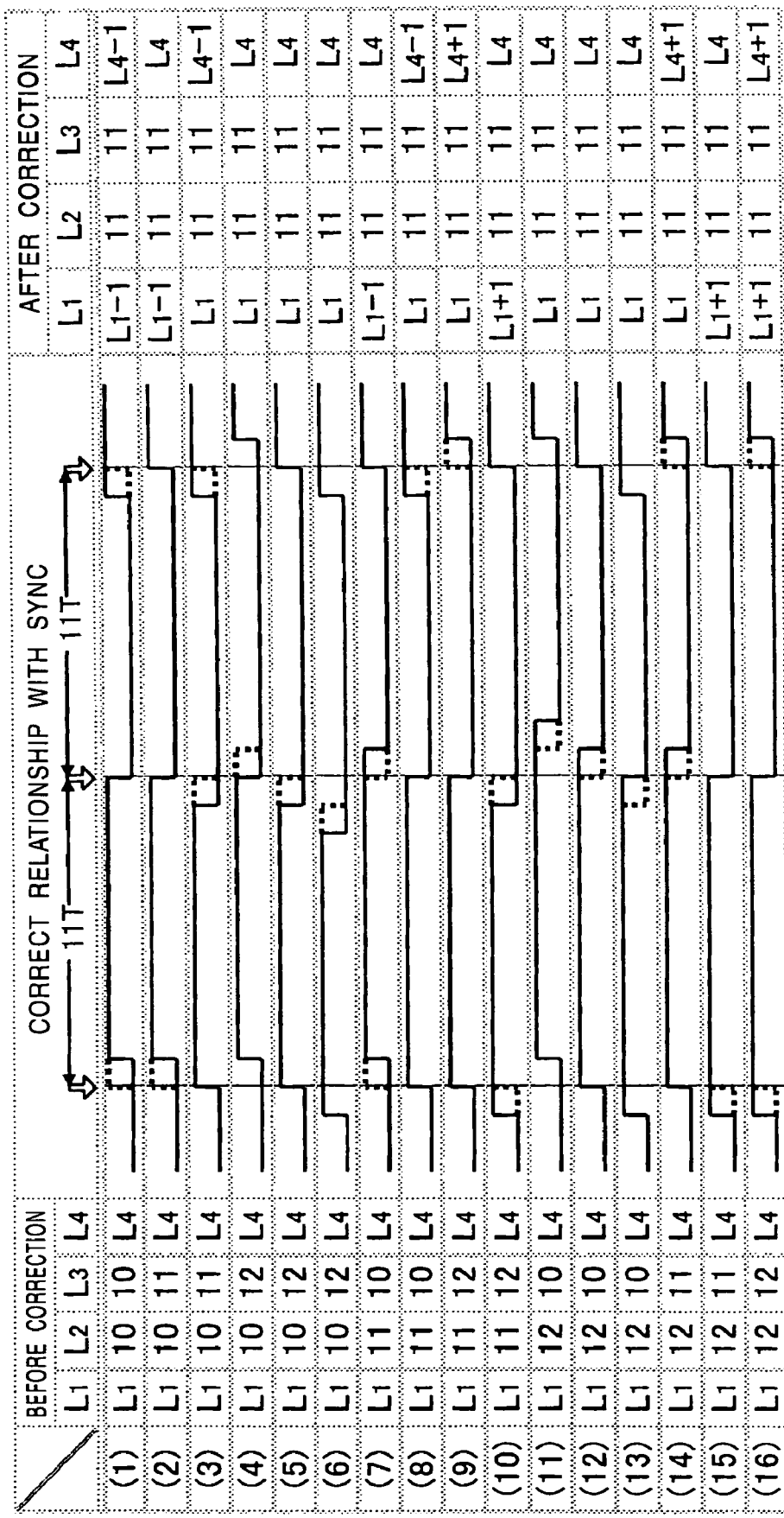
FIG. 64 is a diagram for explaining an example correction of a sync error.
Figure 65:
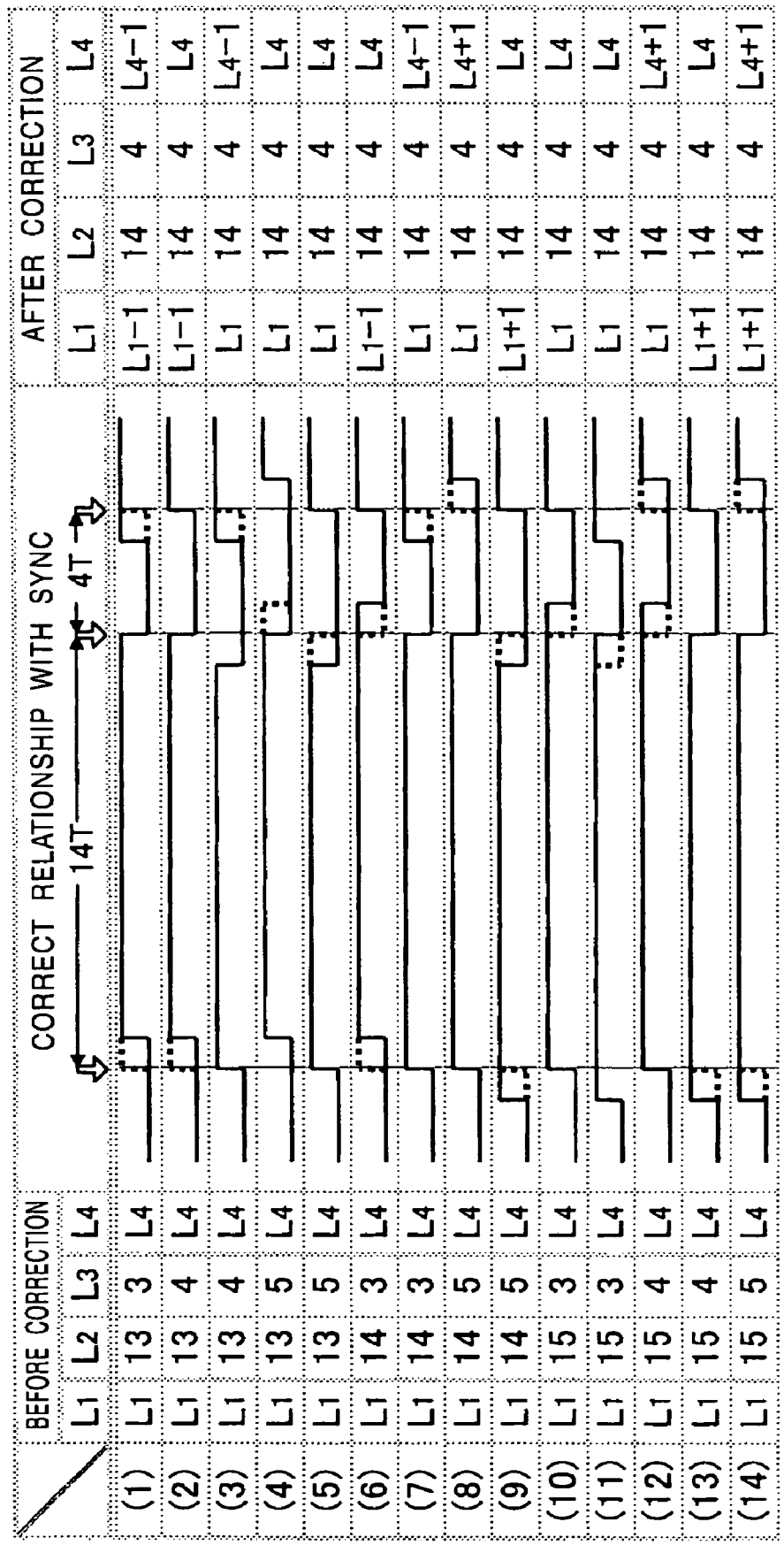
FIG. 65 is a diagram for explaining an example correction of a sync error.

In correcting methods shown in FIGS. 64 and 65, basically, priority is given to the expected cycle of sync pattern, similarly to the correcting methods shown in FIGS. 62 and 63. However, the amount to be corrected is large, correction is performed without regard to the cycle of sync pattern. For example, in cases (4), (6), and (11) in FIG. 64, correction is performed without regard to the cycle of 588T. In cases (3) and (4) in FIG. 65, correction is performed without regard to the cycle of 1488T.

Figure 66:
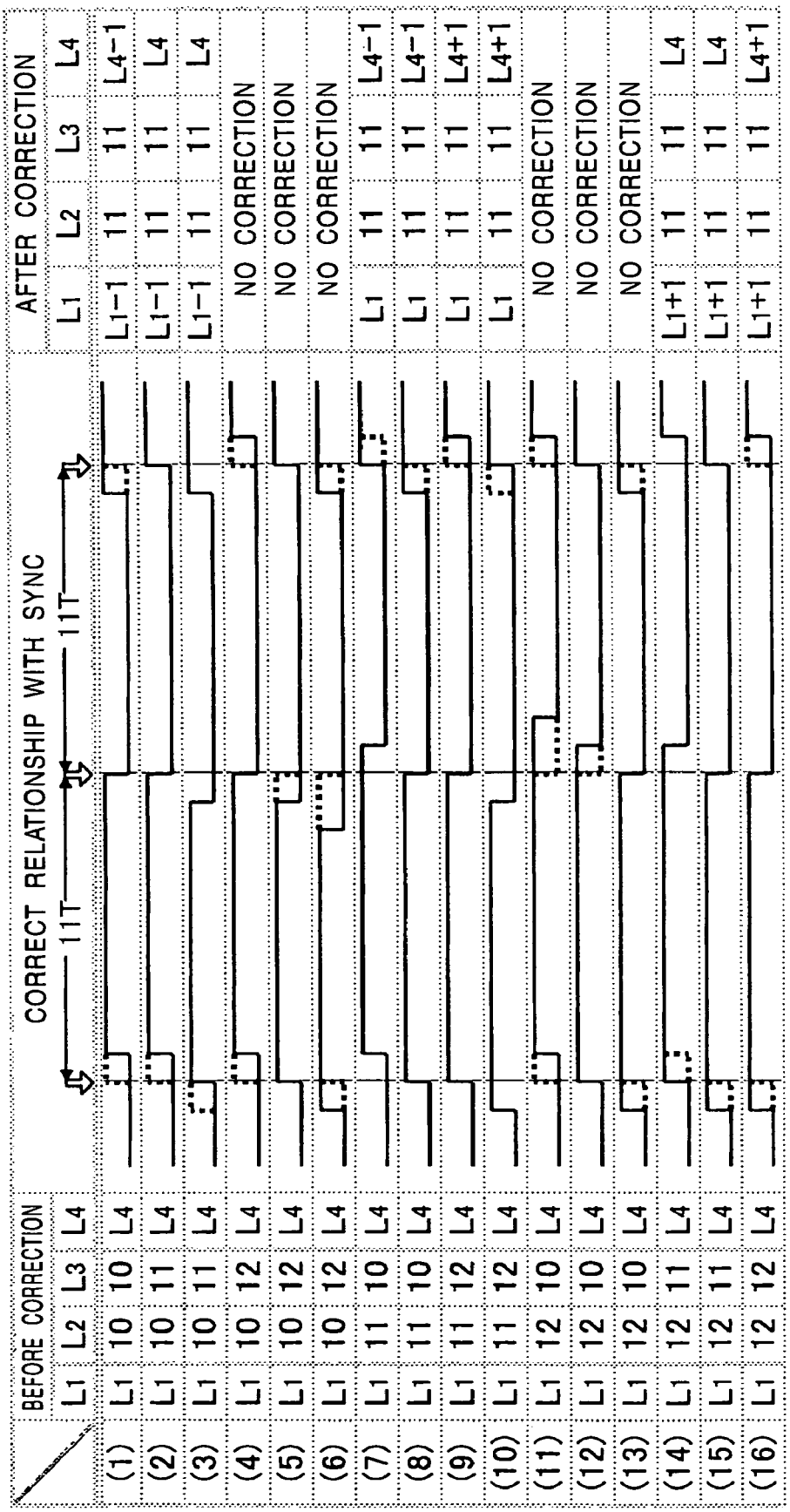
FIG. 66 is a diagram for explaining an example correction of a sync error.
Figure 67:
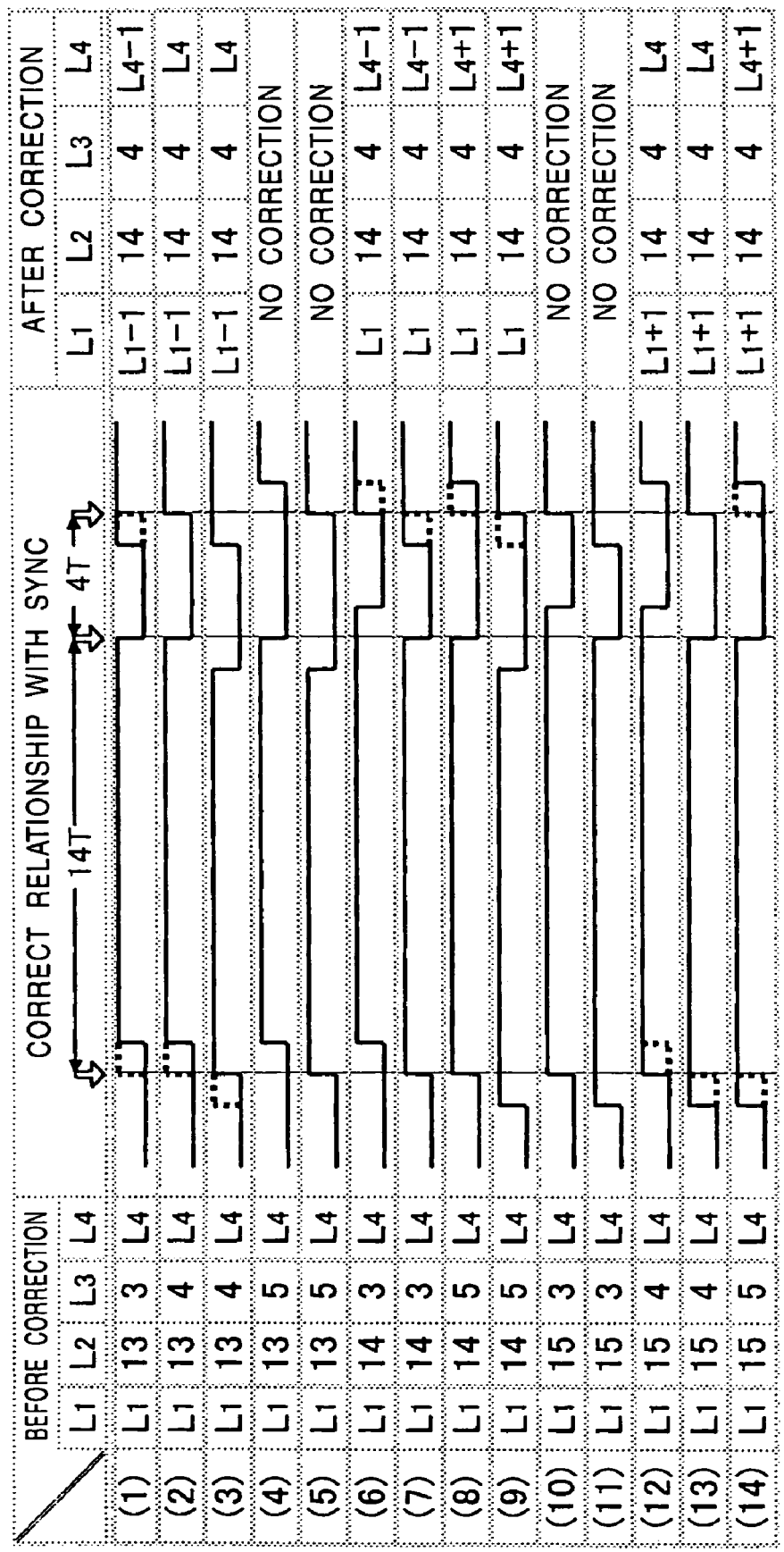
FIG. 67 is a diagram for explaining an example correction of a sync error.

In correcting methods shown in FIGS. 66 and 67, priority is given to the existence of run-length data that coincides with a sync pattern in a sync period. That is, if a piece of 11T in the case of a CD or a piece of 14T or 4T in the case of a DVD exists, the piece is considered as correct, and the other piece of run-length data is corrected accordingly.

Figure 68:
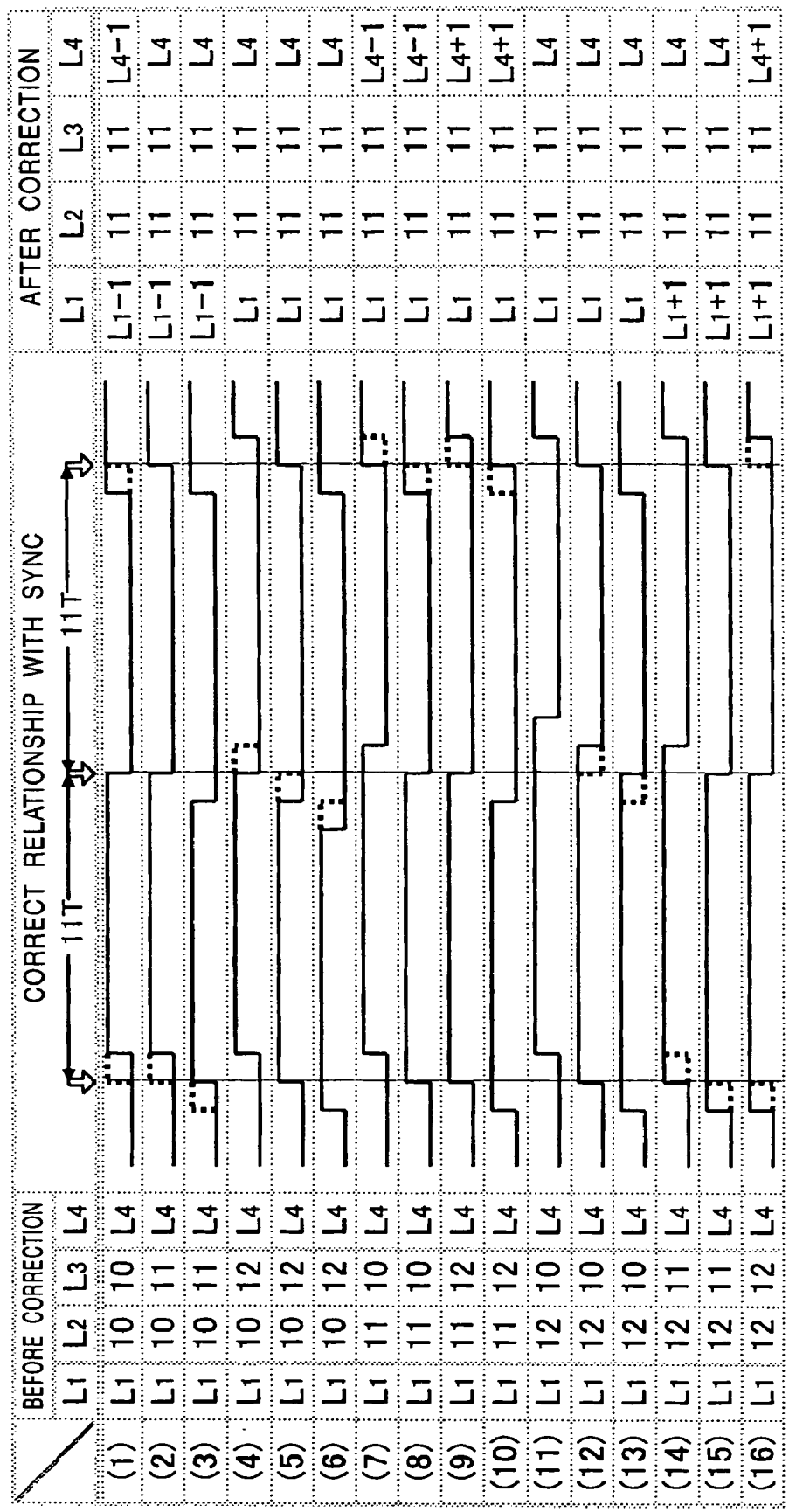
FIG. 68 is a diagram for explaining an example correction of a sync error.
Figure 69:
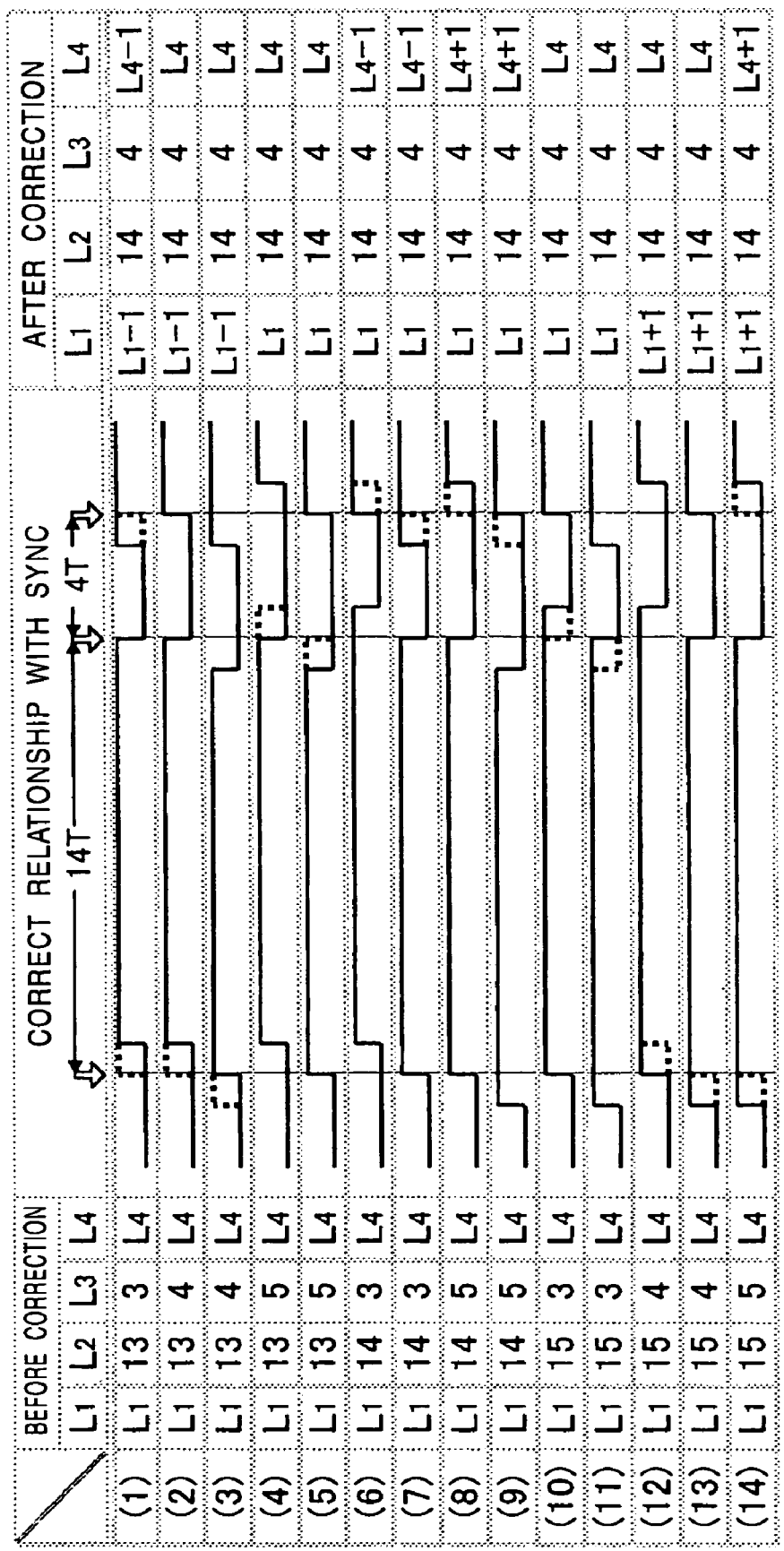
FIG. 69 is a diagram for explaining an example correction of a sync error.

Correcting methods shown in FIGS. 68 and 69 are basically the same as the correcting methods shown in FIGS. 66 and 67. However, when the amount to be corrected is large, correction is performed without regard to the positions of patterns of run-length data.

That is, in the correcting methods shown in FIGS. 68 and 69, patterns that are indicated as "No correction" in FIGS. 66 and 67 are also corrected.

6-3-11. Monitoring Signal

It is preferred to allow external monitoring as to which of the correcting methods described above has been used on run-length data. For this purpose, the RLL circuit 6 outputs a monitoring signal as to which of the correcting methods has been used. Accordingly, the characteristics of a bad disc can be grasped from the methods and frequency of correction.

7. 2-Terminal VCO

As described earlier, the 16-phase 2-terminal VCO 10 controls the oscillating frequency using a rough-side control terminal and a fine-side control terminal.

Figure 70:
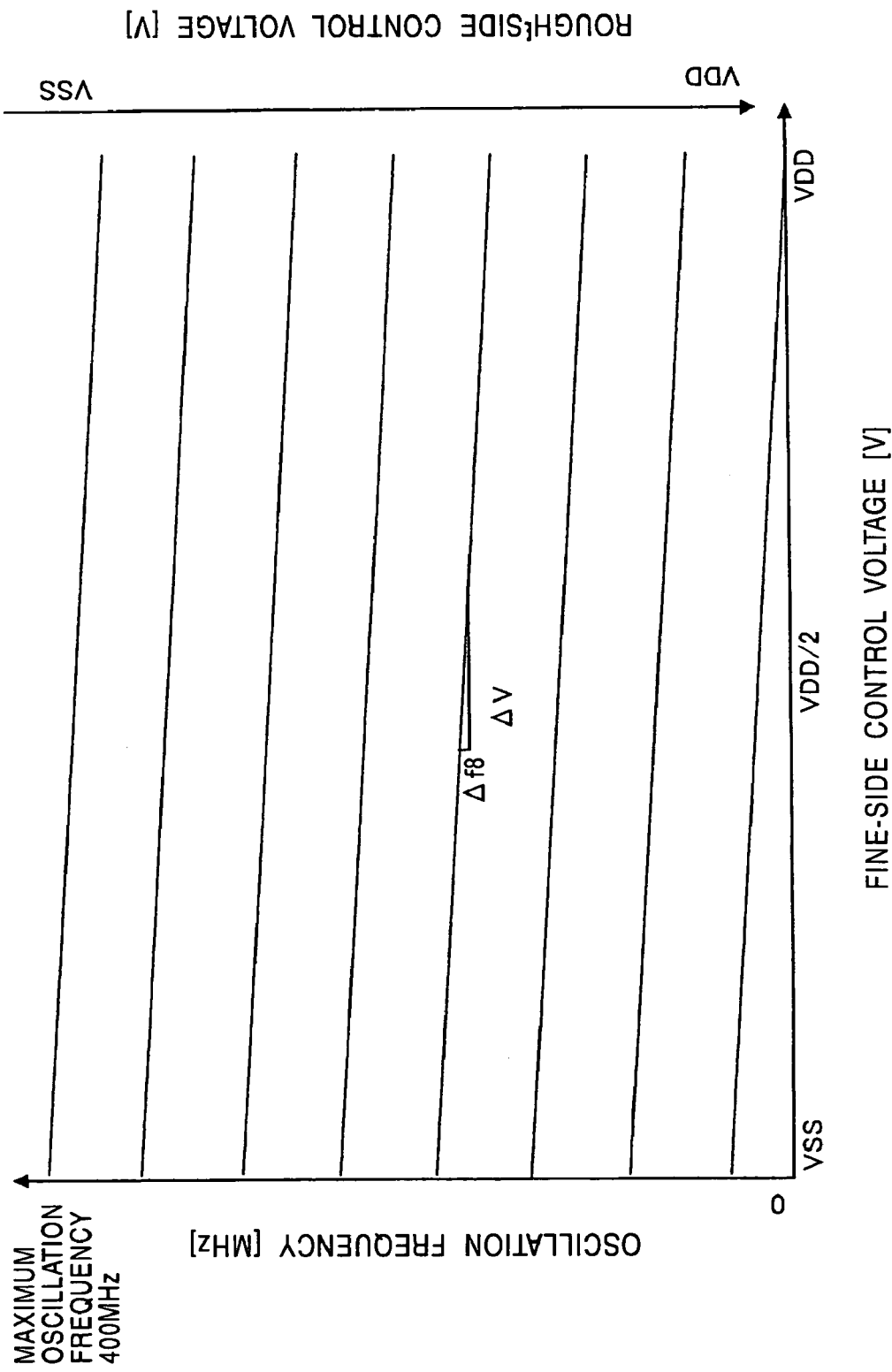
FIG. 70 is a diagram for explaining characteristics of a 16-phase 2-terminal VCO in the embodiment.

FIG. 70 shows the oscillation frequency of the 16-phase 2-terminal VCO 10 in relation to control voltage. In FIG. 70, the horizontal axis represents the fine-side control voltage (VCF), the left vertical axis represents the oscillation frequency, and the right vertical axis represents the rough-side control voltage (VCR). The oscillation frequency becomes maximum when the control voltages are at VSS, and becomes minimum when the control voltages are at VDD. The oscillation frequency changes greatly in relation to change in VCR, and changes slightly in relation to change in VCF.

The change in oscillation frequency in relation to change in VCF is denoted as Δf8/ΔV.

The 16-phase 2-terminal VCO 10 in this embodiment roughly adjusts the frequency on the rough side, and finely adjusts the frequency on the fine side.

Figure 81:
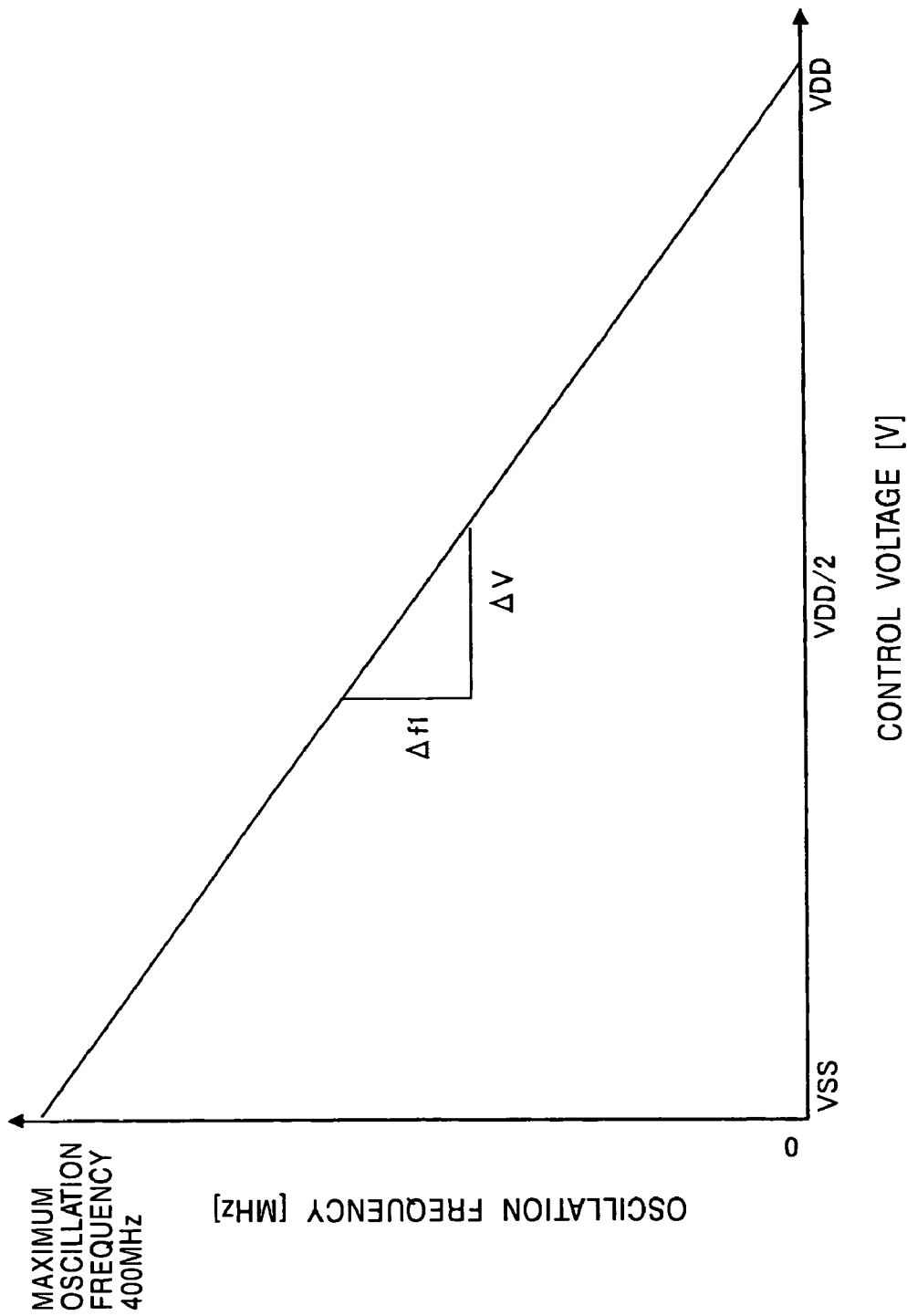
FIG. 81 is a diagram for explaining frequency characteristics of a 1-terminal VCO.

In the case of a conventional 1-terminal VCO, the change in frequency is large as denoted by Δf1/ΔV in FIG. 81. On the other hand, in the case of the 16-phase 2-terminal VCO according to the embodiment, the change in frequency is small as denoted by Δf8/ΔV in FIG. 70.

Since the change in frequency is small even when noise is applied on VCF, playability is not affected significantly. Therefore, the time constant of the low-pass filter on the VCF side can be reduced. This serves to improve tracking characteristics against fluctuation due to eccentricity or the rotation of a spindle motor.

On the other hand, when noise is applied to VCR, the change in frequency is large and playability is affected. However, this problem can be overcome by increasing the time constant of the low-pass filter on the VCR side. Since a slight change in frequency is tracked on the VCF side, tracking ability in normal playback is not degraded even if the time constant of the low-pass filter on the VCR side is increased.

Figure 82:
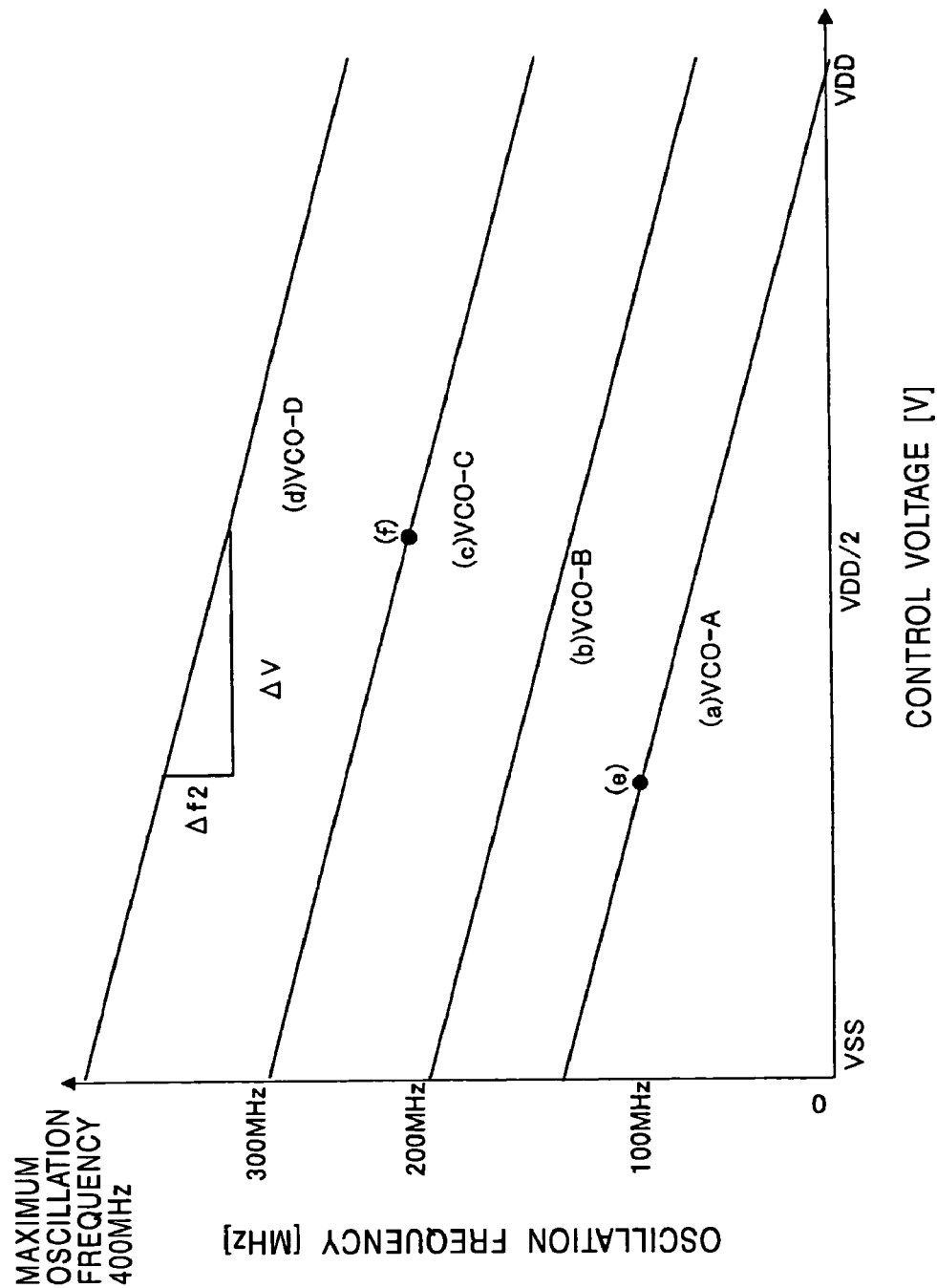
FIG. 82 is a diagram for explaining a case where four 1-terminal VCOs are used.
Figure 83:
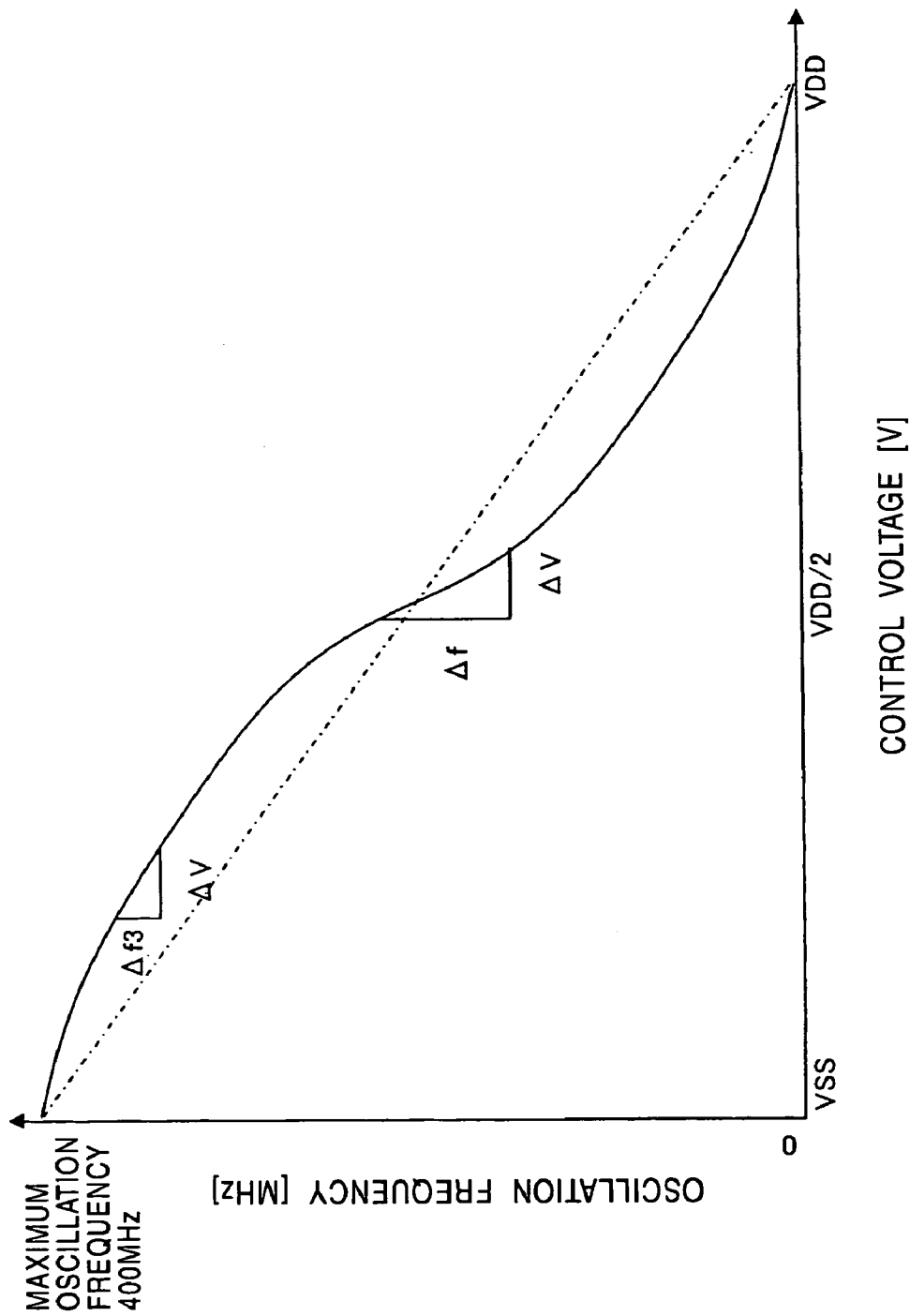
FIG. 83 is a diagram showing frequency characteristics of an actual VCO.
Figure 85:
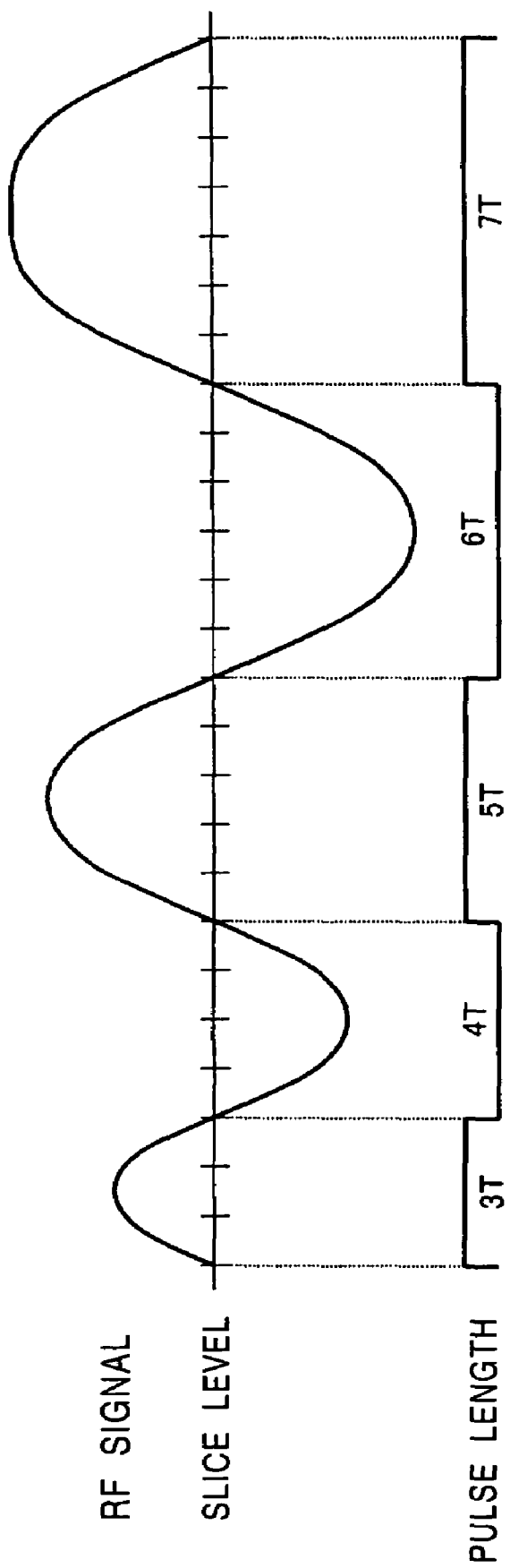
FIG. 85 is a diagram for explaining effect of an asymmetry deviation on binarization of an RF signal.

Furthermore, in contrast to the arrangement shown in FIG. 82 in which a plurality of VCOs is used by switching, both the VCR and VCF control terminals can be controlled linearly, allowing seamless control of the oscillation frequency. Accordingly, seamless oscillation over a wide band from ×0.5 to ×48 in the case of a CD or ×0.5 to ×16 in the case of a DVD is allowed.

Next, how the 16-phase 2-terminal VCO 10 is controlled will be described.

Figure 71:
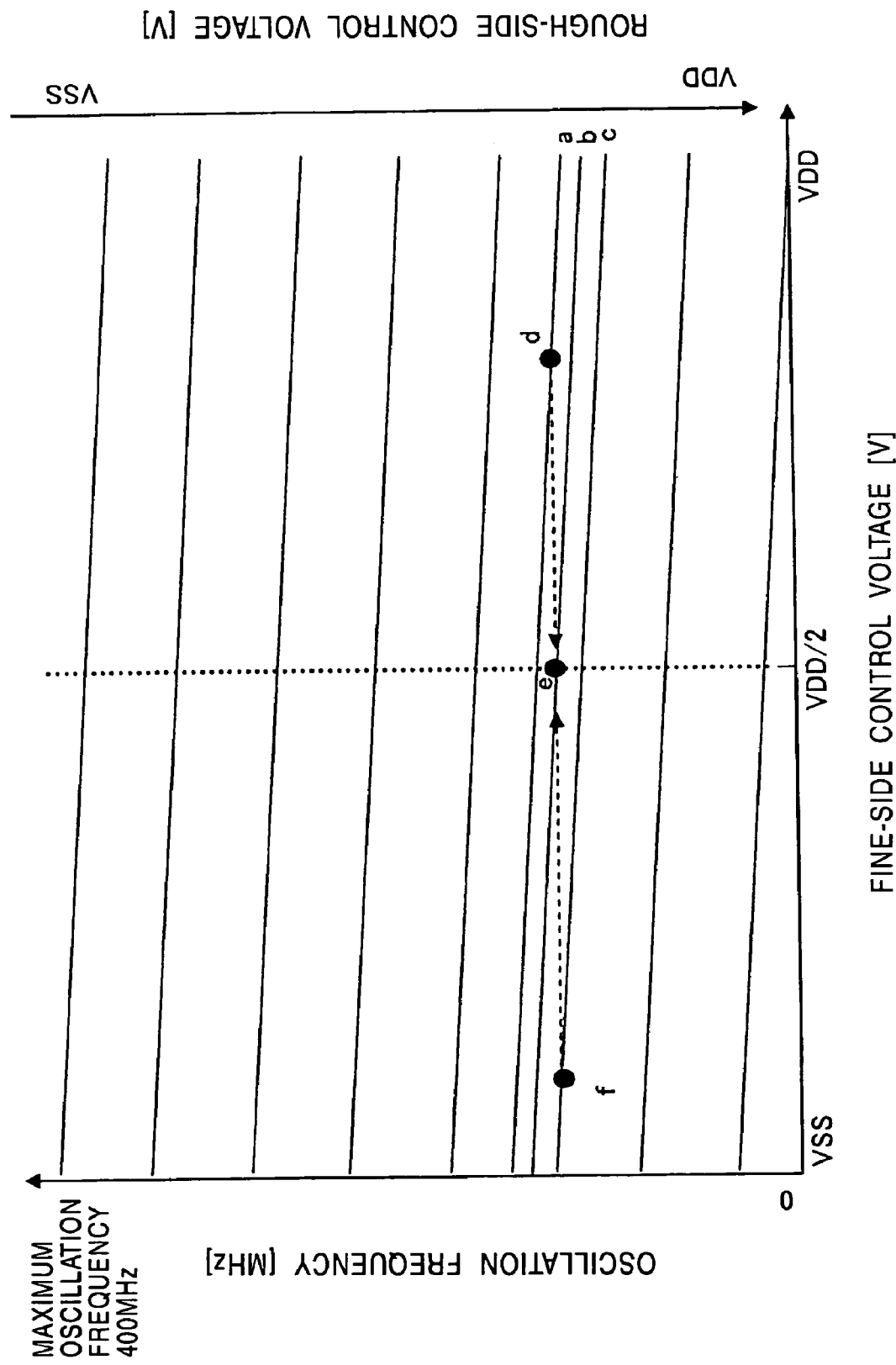
FIG. 71 is a diagram for explaining a method of controlling the 16-phase 2-terminal VCO in the embodiment.

VCR is controlled so that VCF will be constantly at VDD/2. Referring to FIG. 71, when oscillation is taking place with VCR at a and VCF at d, VCR changes from a to b and VCF changes from d to e so that the VCF will be at VDD/2 with the same oscillation frequency.

Similarly, when the VCR has been at c and VCF at f, VCR changes from c to b and VCF changes from f to e.

Thus, when VCF is not at VDD/2, VCF is controlled to become VDD/2. This allows seamless tracking.

Figure 72:
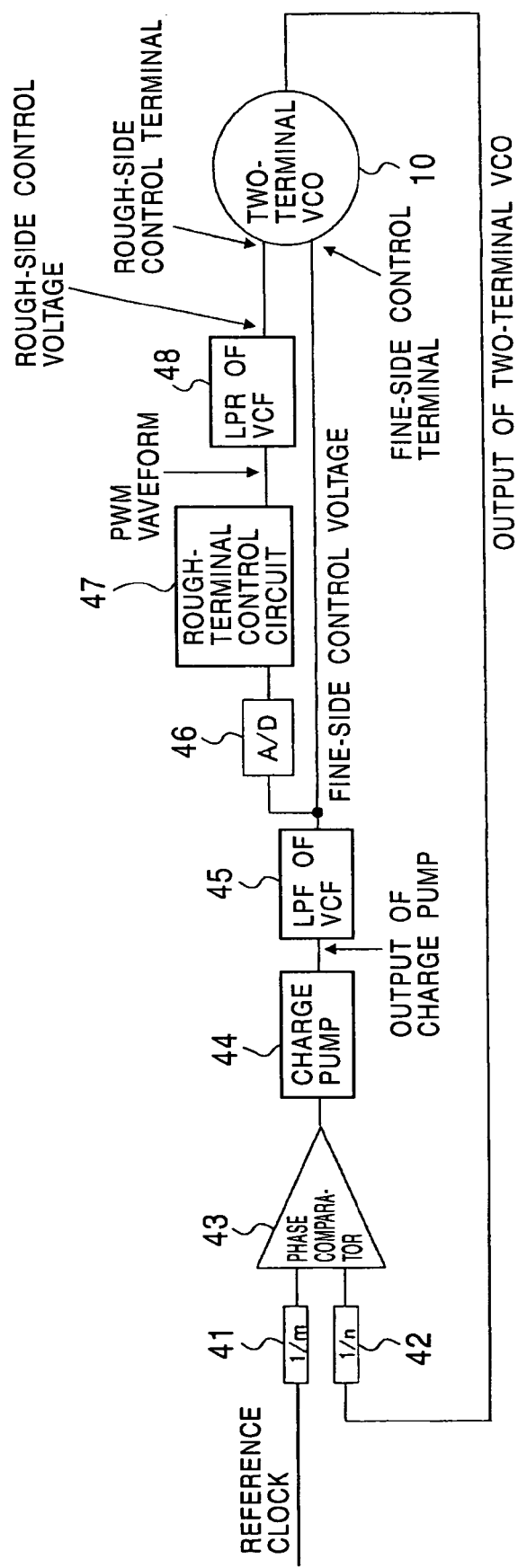
FIG. 72 is a block diagram of a 2-terminal-VCO controlling circuit in the embodiment.

FIG. 72 shows the PLL configuration of a 2-terminal VCO, corresponding to the 2-terminal-VCO control circuit 9 for the 16-phase 2-terminal VCO 10.

The 2-terminal VCO control circuit 9 includes a 1/m frequency divider 41, a 1/n frequency divider 42, a phase comparator 43, a charge pump 44, a VCF-side low-pass filter 45, an A/D converter 46, a rough-terminal control circuit 47, and a VCR-side low-pass filter 48.

The 1/m frequency divider 41 receives a reference clock from the master PLL control circuit 8.

The output of the VCF-side low-pass filter 45 is input to the fine-side control terminal of the 16-phase 2-terminal VCO 10.

The output of the VCR-side low-pass filter is input to the rough-side control terminal of the 16-phase 2-terminal VCO 10.

The 1/n frequency divider 42 receives the oscillation frequency of the 16-phase 2-terminal VCO 10.

Figure 73:
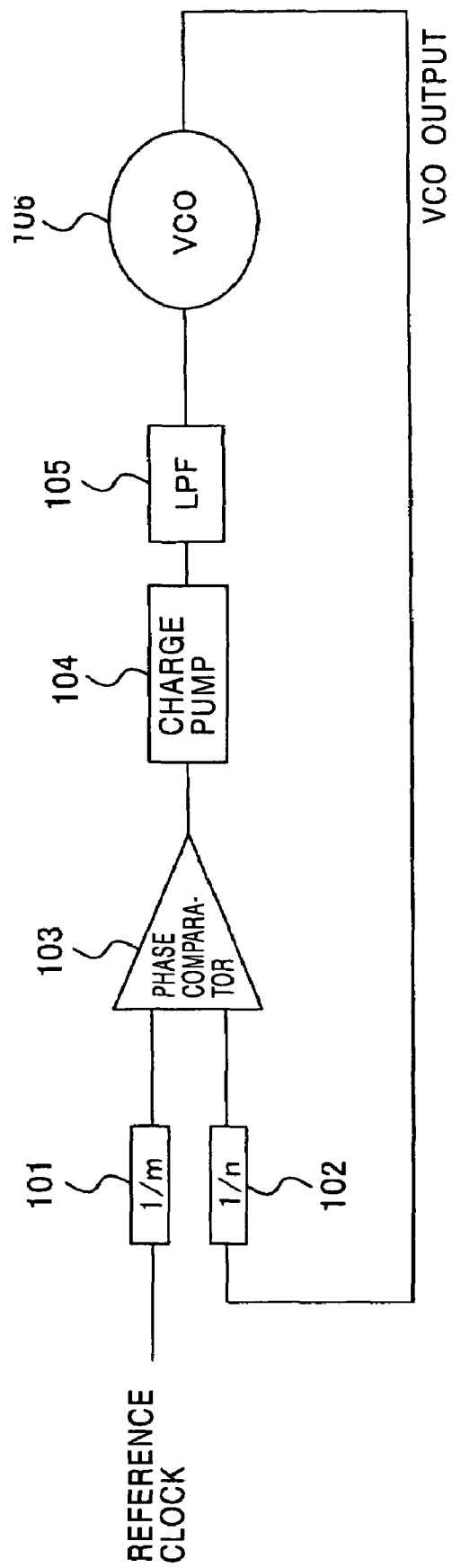
FIG. 73 is a block diagram of a typical PLL circuit.

In the configuration described above, the 1/m frequency divider 41, the 1/n frequency divider 42, the phase comparator 43, the charge pump 44, the VCF-side low-pass filter 45, and the 16-phase 2-terminal VCO 10 form a control loop of the fine side, which is the case in a typical PLL. FIG. 73 shows the configuration of a typical PLL circuit. The components described above correspond to a 1/m frequency divider 101, a 1/n frequency divider 102, a phase comparator 103, a charge pump 104, a low-pass filter 105, and a VCO 106.

The reference clock from the master PLL control circuit 65 is divided by the 1/m frequency divider 41, and the output of the 16-phase 2-terminal VCO 10 is divided by the 1/n frequency divider 42, and the results are input to the phase comparator 43. The phase comparator 43 inputs a result of comparison of phase difference to the charge pump 44. The charge pump 44 outputs a signal representing the phase difference in the form of a three-valued PWM signal.

Figure 74:
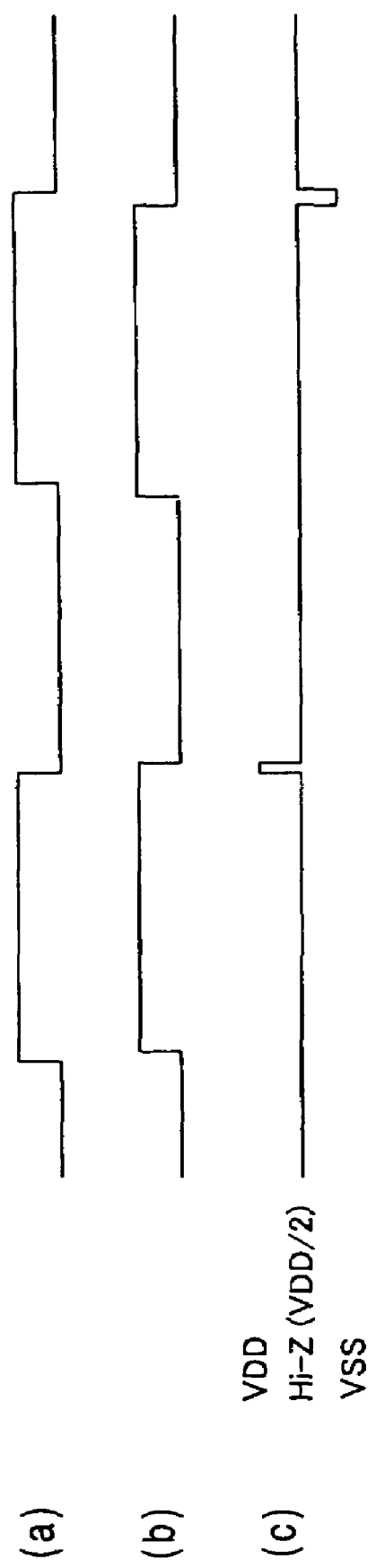
FIG. 74 is a waveform chart of a phase comparison input and charge pump output in the embodiment.

FIG. 74 shows input of the phase comparator 43 and output of the charge pump 44. Referring to FIG. 74, the difference between the two signals input to the phase comparator 43, that is, the difference between falling edges of 1/m of the reference clock and 1/n of the output of the 16-phase 2-terminal VCO 10, shown in parts (a) and (b), are converted by the charge pump 44 into a three-valued PWM waveform as shown in part (c).

The time constant of the VCF-side low-pass filter is chosen to be small in order to improve tracking characteristics. VCF is determined via the VCF-side low-pass filter, and is input to the fine-side control terminal of the 16-phase 2-terminal VCO 10.

A rough-side control loop is formed by the 1/m frequency divider 41, the 1/n frequency divider 42, the phase comparator 43, the charge pump 44, the VCF-side low-pass filter 45, the A/D converter 46, the rough-terminal control circuit 47, the VCR-side low-pass filter, and the 16-phase 2-terminal VCO 10.

In the rough-side control loop, VCF from the VCF-side low-pass filter is A/D converted by the A/D converter 46. At this time, VCF is converted with VDD as a maximum value and VSS as minimum value.

The rough-terminal control circuit 47 processes the VCF value obtained by A/D conversion such that VDD side is "+" and VSS side is "−" with respect to VDD/2 as a center, and outputs a three-valued PWM waveform of "H", "L", and Hi-Z".

Figure 75:
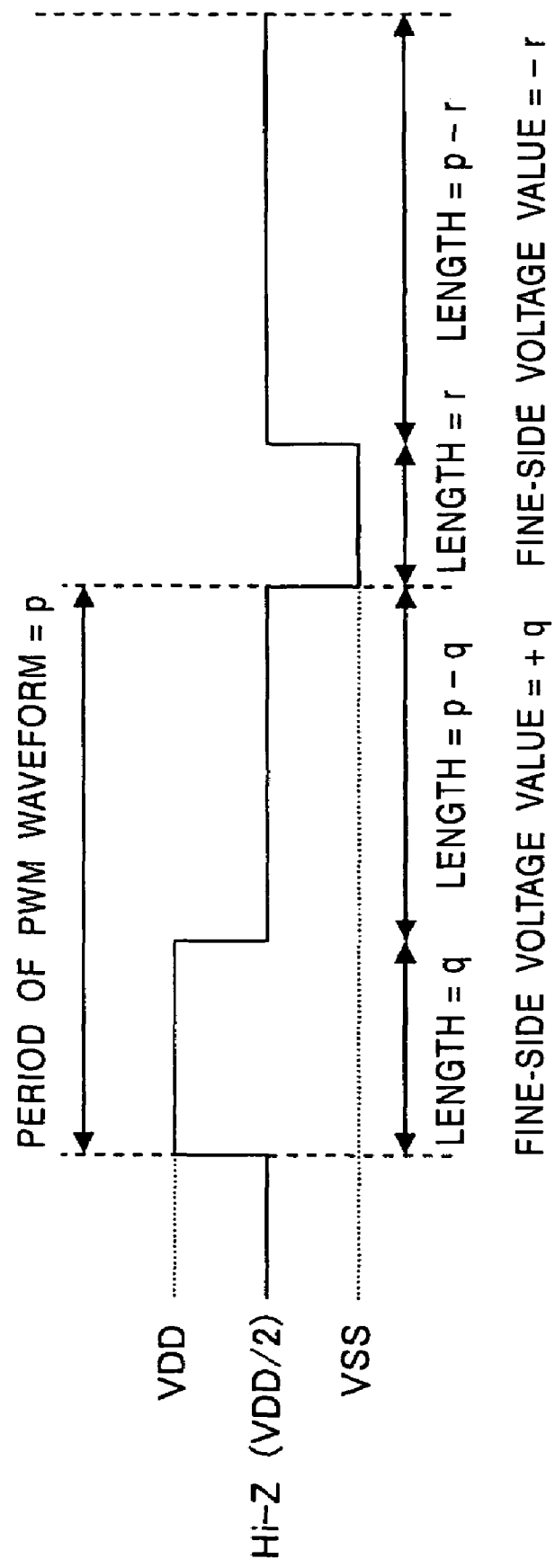
FIG. 75 is a waveform chart of an output of a rough-terminal controlling circuit in the embodiment.

FIG. 75 shows a PWM waveform output from the rough-terminal control circuit 47. The length of a period of the PWM waveform will be denoted as p. As described earlier, VCR will be increased when VCF>VDD/2, and VCR is decreased when VCF<VDD/2, so that VCF will be VDD/2.

For this purpose, referring to FIG. 75, when the VCF value is +q, "H" is output correspondingly to the length, and "Hi-Z" is output during the remaining period of p-q.

When the VCF value is −r, "L" is output correspondingly to the length, and "Hi-Z" is output during the remaining period of p-r.

As described above, "H" and "L" corresponding to the amounts of deviations q and r of VCF with respect to VDD/2 are output to form the PWM waveform. Thus, the lengths of "H" and "R" become longer or shorter as the values of q and r become larger or smaller.

The PWM waveform becomes VCR through the VCR-side low-pass filter 48, and VCR is input to the rough-side control terminal of the 16-phase 2-terminal VCO 10.

The change in frequency in relation to change in the control voltage at the rough-side control terminal is large. Thus, the time constant of the VCR-side low-pass filter 48 must be sufficiently large so that the change in the control voltage will be gradual.

With the configuration described above, the 2-terminal VCO having a fine terminal and a rough terminal is controlled in relation to the reference clock. Thus, a PLL that is seamless and that exhibits a favorable carrier to noise ratio (CNR) over a wide band is achieved.

8. Jitter Meter

The jitter meter generates an accumulated error amount from phase errors between an edge of an RF signal and a virtual channel clock, integrates the error over a predetermined period, and outputs the resulting value as a jitter value. The period of accumulation is eight frames of the RF signal.

A phase error generated by the phase control and data extraction circuit 5 is shown in FIG. 76 in relation to FIGS. 23 and 24.

When The precision of the amount of phase error is 1T/16 when phase control is in 1T/16 mode described with reference to FIG. 23, and 1T/32 when phase control is in 1T/32 mode described with reference to FIG. 24.

The accumulated error amount becomes larger as the edge becomes further with case A and case P or case P' as 0, where the cases A, P, and P' are ideal points of the virtual channel clock.

Figure 77:
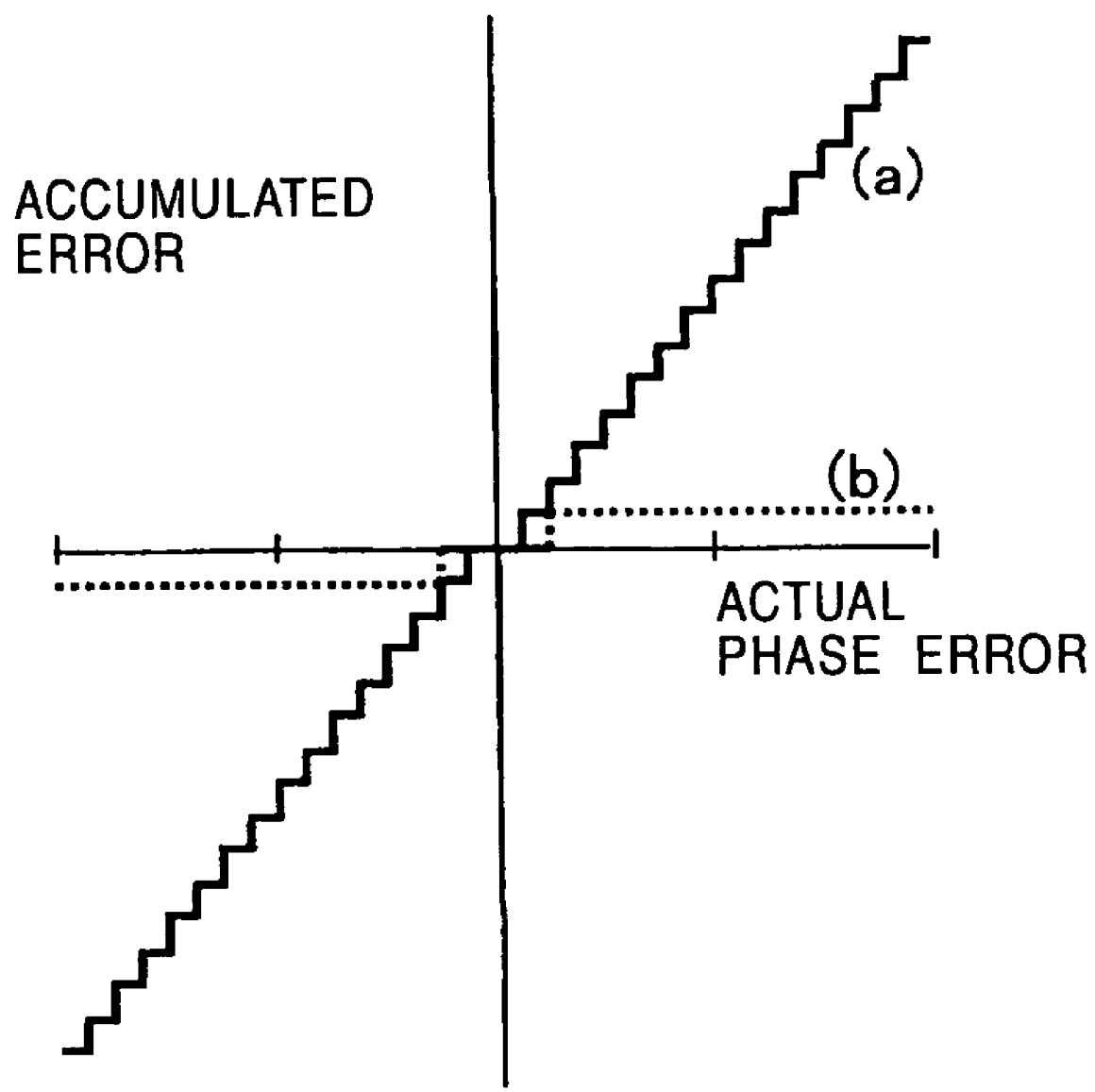
FIG. 77 is a diagram for explaining linearity of phase error of the jitter meter according to the embodiment and the jitter meter according to the related art.

Now, the jitter meter according to the embodiment will be compared with a conventional jitter meter. FIG. 76 shows a phase-error conversion table of the jitter meter according to this embodiment and a conventional jitter meter. FIG. 77 shows the linearity of phase error in the jitter meter according to this embodiment and the conventional jitter meter.

The conventional jitter meter detects a phase error at a precision of 1T/8, so that the precision of a phase error is lower compared with that of the digital PLL according to this embodiment, as will be understood from FIGS. 76 and 77. Furthermore, in the case of the conventional jitter meter, correlation between phase errors and an accumulated error amount is weak. This is because the frequency of the high-frequency clock is high, as described earlier. In contrast, according to this embodiment, precision is improved, and accumulated error amount becomes larger as phase errors become larger, that is, correlation is strong.

Figure 78:
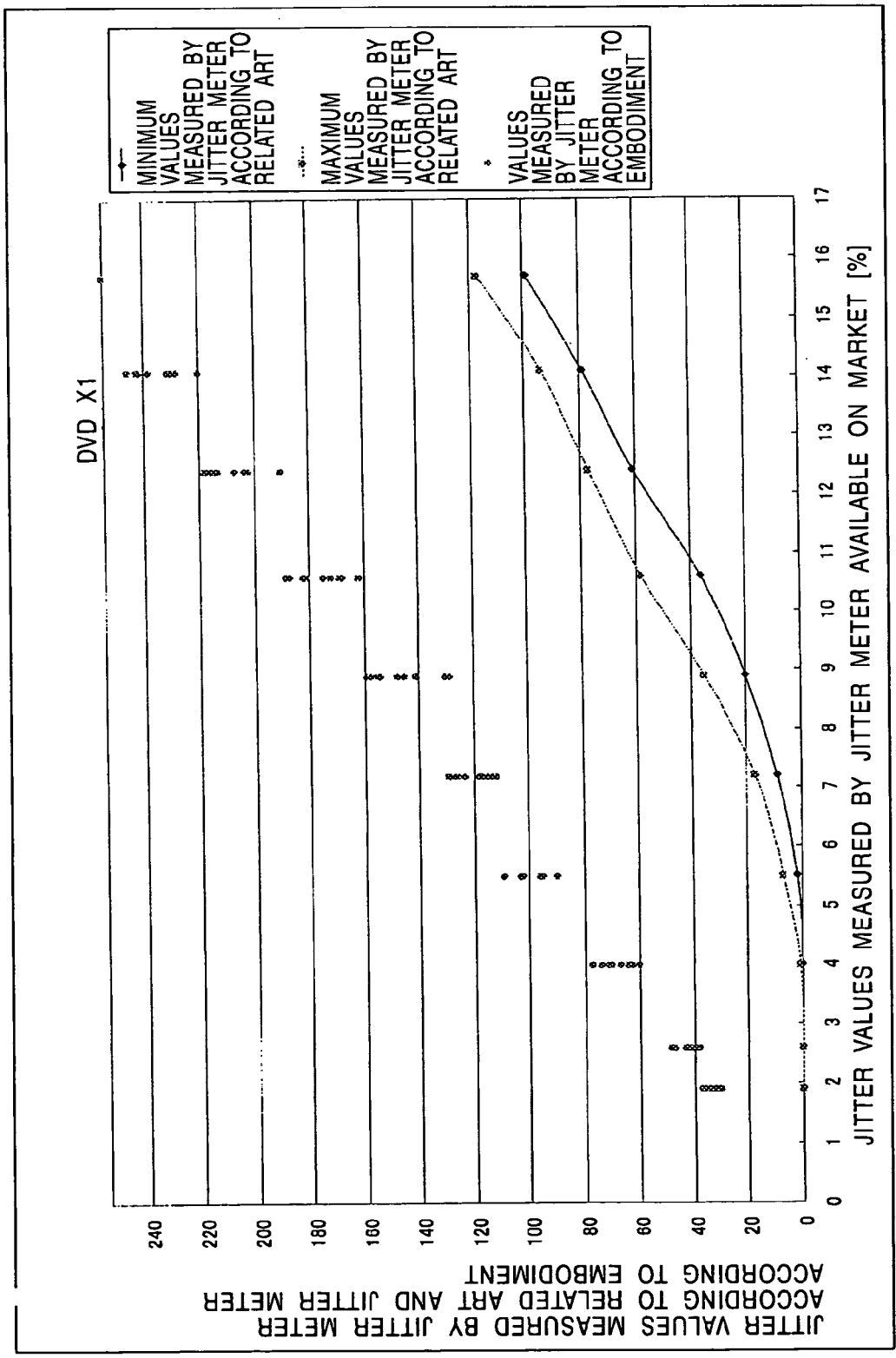
FIG. 78 is a diagram for explaining values measured by the jitter meter according to the embodiment and the jitter meter according to the related art.
Figure 79:
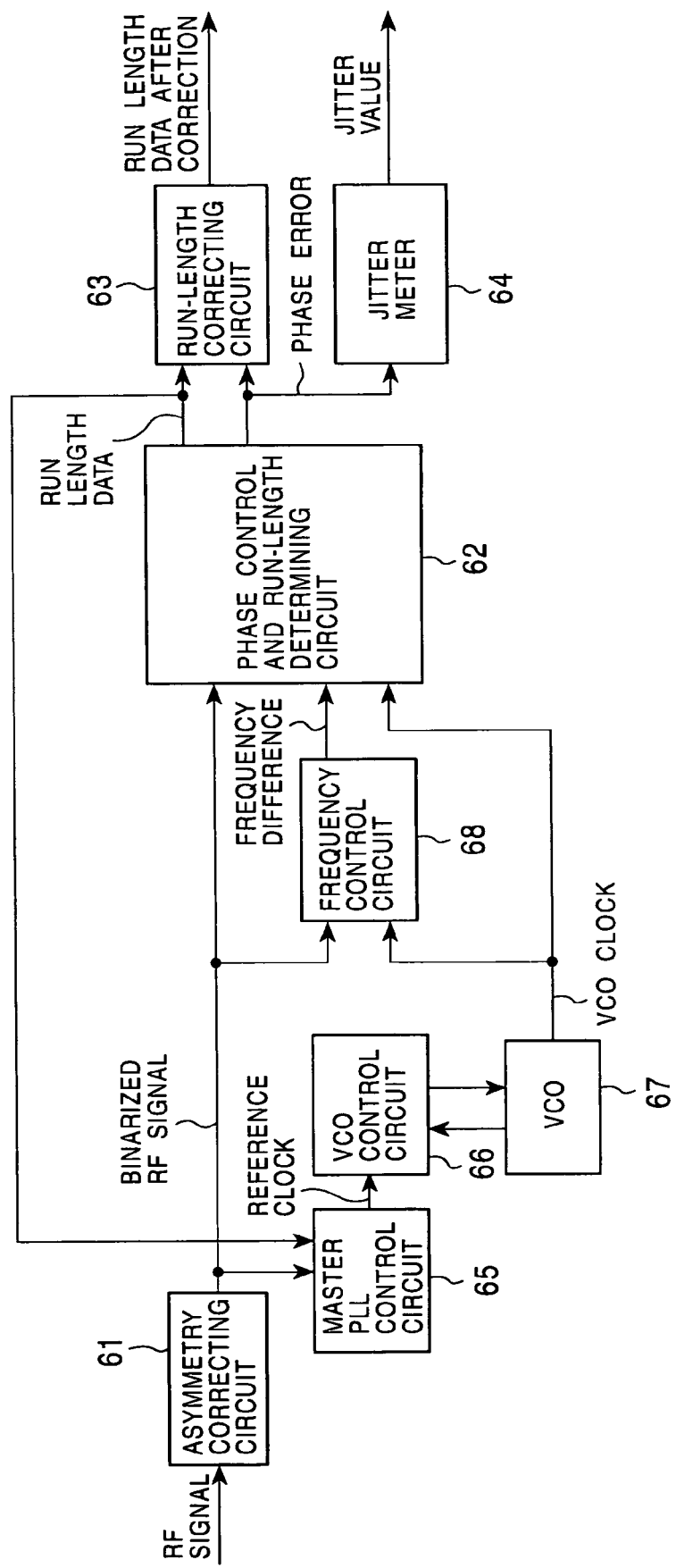
FIG. 79 is a block diagram of a conventional digital PLL system.

These differences are reflected on the characteristics of the jitter meters. In FIG. 78, the horizontal axis represents values measured by a jitter meter available on the market, and the vertical axis represents values measured by the conventional jitter meter and the jitter meter according to this embodiment. The conventional jitter meter is not cable of measuring under 5%. On the other hand, the jitter meter according to this embodiment obtains clear correlation over the entire range.

As described above, by using a precise amount of phase error generated by the phase control and data extraction circuit 5, a precise jitter meter can be implemented within an LSI.

9. Advantages of the Embodiment

As will be understood from the above description, in the digital PLL system according to the embodiment, the 16-phase 2-terminal VCO 10 is used. Thus, even though the system is a digital PLL, a low operating frequency equivalent to that of an analog PLL is achieved, allowing high-speed playback, for example, up to ×16 in the case of a DVD. Furthermore, an RF signal can be recognized more precisely than before.

Furthermore, the operating frequency is lowered, so that the lifetime of LSIs is increased and yield is improved.

Furthermore, by using a digital PLL, a system that is more susceptible to temperature change and is more independent of power-supply voltage can be implemented.

Furthermore, a wide capture range and lock range are achieved, so that access time is reduced.

Furthermore, since asymmetry deviation can be corrected as digital data, the ability of playing back a bad disc with asymmetry deviation that is on the market is improved.

Furthermore, run-length data that is against a predefined format is corrected into correct run-length data, so that the ability of playing back a bad disc is improved. Furthermore, monitoring of all contents of correction is allowed, so that the tendency of errors on a bad disc can be readily analyzed.

Furthermore, sync pattern errors are corrected, so that sync protection is enhanced.

Furthermore, by using a loop gain of phase control, and a function of activating/deactivating phase control of run-length data that is in an insensitive region or that is against a predefined format, playback of a bad disc that has not been possible is allowed.

Furthermore, by using two VCO control terminals, i.e., a fine side and a rough side, effect of noise superposed on control voltage is suppressed, and seamless tracking is allowed against temporal fluctuation of an RF signal.

Furthermore, by using nTap Mode, playback in a region of a favorable CNR is allowed, and effect of a phase difference among the clocks of the 16-phase 2-terminal VCO 10 is suppressed.

Furthermore, by accumulating phase errors values generated for respective edges of an RF signal, jitter values are measured at a high precision.

Furthermore, jitter values can be measured accurately at any playback speed, so that the waveform of an RF signal can be shaped in accordance with the playback speed.

Furthermore, by implementing a jitter meter in an LSI, jitter in an RF signal can be measured without using a jitter meter available on the market. This can be used, for example, to check product in the final stage of manufacturing.

What is claimed is:

1. A digital phase-locked-loop device comprising:
   clock generating means for generating a reference clock based on a playback signal that is binarized to provide a binarized playback signal and a frequency of run-length data, and for generating N-phase clocks using the reference clock, the N-phase clocks coinciding with one period of the playback signal or an integer multiple thereof; pulse-length measuring means for measuring a pulse length of the binarized playback signal using the N-phase clocks to output pulse-length data; and run-length-data extracting means for generating a virtual channel clock for the purpose of counting the pulse-length data based on the virtual channel clock to extract run-length data.

2. A digital phase-locked-loop device according to claim 1, wherein the clock generating means comprises: a voltagecontrolled-oscillator controlling circuit for generating a rough-side control voltage and a fine-side control voltage based on the reference clock; and a two-terminal voltage-controlled oscillator for generating the N-phase clocks based on the rough-side control voltage and the fine-side control voltage.

3. A digital phase-locked-loop device according to claim 1, wherein the pulse-length measuring means samples the binarized playback signal based on the N-phase clocks, and generates the pulse-length data based on an accumulated value of sampled data.

4. A digital phase-locked-loop device according to claim 1, further comprising frequency correcting means for determining a frequency deviation between the playback signal and the N-phase clocks, and for correcting the pulse-length data output from the pulse-length measuring means with respect to a frequency direction based on the frequency deviation determined.

5. A digital phase-locked-loop device according to claim 1, further comprising asymmetry correcting means for determining an asymmetry deviation caused by binarization, based on relationship between the pulse-length data output from the pulse-length measuring means and a pulse-length range defined by a data format, and for correcting the pulse-length data in such a direction that the asymmetry deviation is reduced.

6. A digital phase-locked-loop device according to claim 1, wherein the mn-length-data extracting means is capable of correcting a phase difference of the virtual channel clock with respect to an edge of the binarized playback signal, and is also capable of outputting a phase error representing the phase difference.

7. A digital phase-locked-loop device according to claim 1, further comprising mn-length-data correcting means for determining a run-length error based on relationship between the run-length data output from the mn-length-data extracting means and a run length defined by a data format, and for correcting the run-length data so as to reduce the mn-length error.

8. A digital phase-locked-loop device according to claim 6, further comprising jitter measuring means for measuring jitter in an input signal based on the phase error output from the mn-length-data extracting means.

* * * * *

UNITED STATES PATENT AND TRADEMARK OFFICE
CERTIFICATE OF CORRECTION

PATENT NO. : 7,342,986 B2  
APPLICATION NO. : 10/868923  
DATED : March 11, 2008  
INVENTOR(S) : Shinobu Nakamura et al.

It is certified that error appears in the above-identified patent and that said Letters Patent is hereby corrected as shown below:

Column 36, Line 5
"mn-length data" should read --run-length data--

Column 36, Line 11
"mn-length data" should read --run-length data--

Column 36, Line 13
"mn-length data" should read --run-length data--

Column 36, Line 16
"mn-length data" should read --run-length data--

Column 36, Line 20
"mn-length data" should read --run-length data--

Signed and Sealed this

Twenty-fourth Day of June, 2008

JON W. DUDAS  
*Director of the United States Patent and Trademark Office*